US012755928B2

(12) United States Patent
Wang et al.

(10) Patent No.: US 12,755,928 B2
(45) Date of Patent: Oct. 6, 2026

(54) OPERATION METHODS OF 2D PIXELATED DETECTOR FOR AN APPARATUS WITH PLURAL CHARGED-PARTICLE BEAMS AND MAPPING SURFACE POTENTIALS

(71) Applicant: ASML Netherlands B.V., Veldhoven (NL)

(72) Inventors: Yongxin Wang, San Ramon, CA (US); Oleg Krupin, Mountain View, CA (US); Weiming Ren, San Jose, CA (US); Xuerang Hu, San Jose, CA (US); Xuedong Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 461 days.

(21) Appl. No.: 18/269,532

(22) PCT Filed: Dec. 8, 2021

(86) PCT No.: PCT/EP2021/084694
§ 371 (c)(1),
(2) Date: Jun. 23, 2023

(87) PCT Pub. No.: WO2022/135920
PCT Pub. Date: Jun. 30, 2022

(65) Prior Publication Data

US 2024/0079204 A1 Mar. 7, 2024

Related U.S. Application Data

(60) Provisional application No. 63/193,575, filed on May 26, 2021, provisional application No. 63/130,576, filed on Dec. 24, 2020.

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01)

(58) Field of Classification Search
CPC .......... H01J 37/00; H01J 37/02; H01J 37/244; H01J 37/26; H01J 37/28; H01J 2237/004; H01J 2237/2446
(Continued)

(56) References Cited

U.S. PATENT DOCUMENTS

2006/0219906 A1* 10/2006 Langer .............. G01N 23/2251 250/307
2009/0206257 A1 8/2009 Gunji et al.
(Continued)

FOREIGN PATENT DOCUMENTS

JP H01-186743 A 7/1989
WO WO 2018/145983 A1 8/2018
(Continued)

OTHER PUBLICATIONS

International Search Report issued in related Foreign Application No. PCT/EP2021/084694; mailed Mar. 18, 2022 (2 pgs.).

*Primary Examiner* — Jason L McCormack
(74) *Attorney, Agent, or Firm* — Finnegan, Henderson, Farabow, Garrett & Dunner LLP

(57) ABSTRACT

A method of detecting charged particles may include detecting beam intensity as a primary charged particle beam moves along a first direction; acquiring a secondary beam spot projection pattern as the primary charged particle beam moves along a second direction; and determining a parameter of a secondary beam spot based on the acquired secondary beam spot projection pattern. A method of compensating for beam spot changes on a detector may include acquiring a beam spot projection pattern on the detector, determining a change of the beam spot projection pattern, and adjusting a parameter of a detector cell of the detector
(Continued)

based on the change. Another method may be provided for forming virtual apertures with respect to detector cells of a detector.

17 Claims, 30 Drawing Sheets

(58) Field of Classification Search
USPC ................................ 250/306, 307, 310, 311
See application file for complete search history.

(56) References Cited

U.S. PATENT DOCUMENTS

| | | | | |
|---|---|---|---|---|
| 2013/0245989 | A1 * | 9/2013 | Kadowaki ............... | H01J 37/28 702/150 |
| 2015/0069234 | A1 * | 3/2015 | Gerling ................... | H01J 37/28 250/310 |
| 2018/0024082 | A1 | 1/2018 | Ando | |
| 2019/0214221 | A1 * | 7/2019 | Ishii ................... | G01N 23/2251 |

FOREIGN PATENT DOCUMENTS

| | | | |
|---|---|---|---|
| WO | WO 2019/053173 | A1 | 3/2019 |
| WO | WO 2019/053174 | A1 | 3/2019 |
| WO | WO 2019/166331 | A2 | 9/2019 |

* cited by examiner

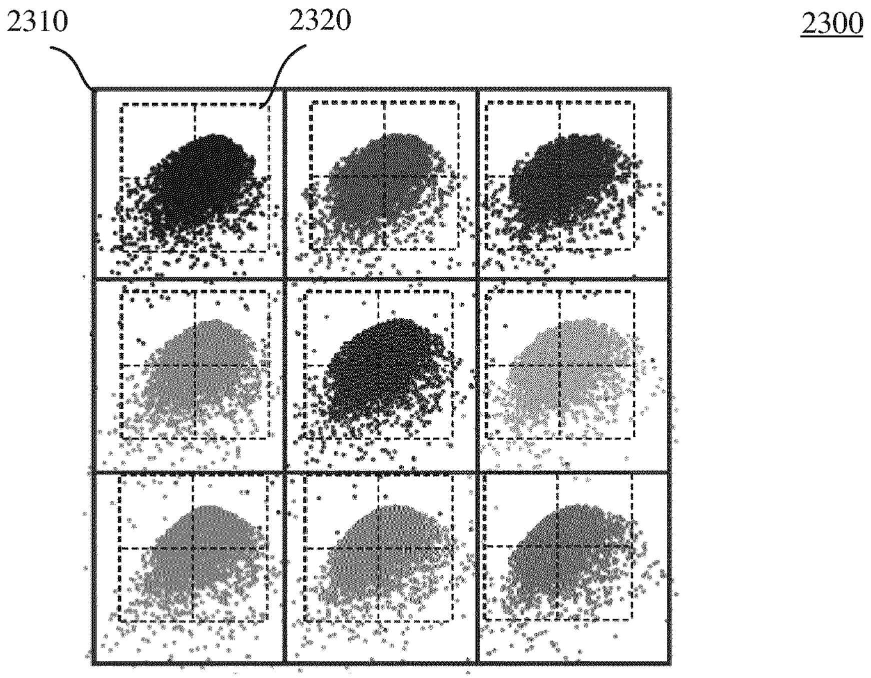
FIG. 23A
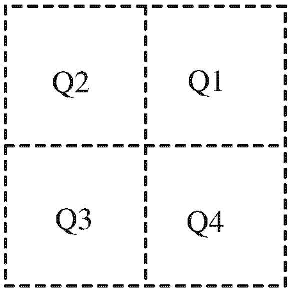
FIG. 23B
$$\Delta X = \frac{(Q2 + Q3) - (Q1 + Q4)}{(Q1 + Q2 + Q3 + Q4)}$$
$$\Delta Y = \frac{(Q1 + Q2) - (Q3 + Q4)}{(Q1 + Q2 + Q3 + Q4)}$$
FIG. 23C

OPERATION METHODS OF 2D PIXELATED DETECTOR FOR AN APPARATUS WITH PLURAL CHARGED-PARTICLE BEAMS AND MAPPING SURFACE POTENTIALS

CROSS-REFERENCE TO RELATED APPLICATIONS

This application claims priority to International Application No. PCT/EP2021/084694, filed Dec. 8, 2021, which claims priority of U.S. application 63/130,576, filed on Dec. 24, 2020, and of U.S. application 63/193,575, filed on May 26, 2021. The contents of these applications are incorporated herein by reference in their entireties.

FIELD

The description herein relates to detectors that may be useful in the field of charged particle beam systems, and more particularly, to systems and methods that may be applicable to tracking of secondary electron beam spot projection patterns on a detector.

BACKGROUND

Detectors may be used for sensing physically observable phenomena. For example, charged particle beam tools, such as electron microscopes, may comprise detectors that receive charged particles projected from a sample and that output detection signals. Detection signals may be used to reconstruct images of sample structures under inspection and may be used, for example, to reveal defects in the sample. Detection of defects in a sample is increasingly important in the manufacturing of semiconductor devices, which may include large numbers of densely packed, miniaturized integrated circuit (IC) components. Inspection systems may be provided for this purpose. A scanning electron microscope (SEM) is one type of inspection system.

In a SEM system, a primary beam may be controlled to perform a raster scan on a sample surface. To acquire one line of a SEM image, a primary beam that scans on the sample surface may undergo a line scan action on the sample surface in a first direction at a first speed. During the line scan, the intensity of a corresponding secondary electron beam may be detected by a detector. After the line scan in the first direction is finished, the primary beam may undergo a return action (e.g., retrace) in a second direction at a second speed in preparation to start another line scan. The second direction may be opposite to the first direction. The return action may move the primary beam back to a location near where the first line scan started. During a retrace, the intensity of the corresponding secondary electron beam is normally not detected. In some SEM systems, during the retrace period of each line, the primary beam may be diverted to a place other than the sample surface to reduce charge accumulation on the surface of the sample under investigation (e.g., by blanking). Retrace periods may be treated as part of system overhead. No detection may be occurring during this period and this time may not be effectively used. The more retrace time in the overall scanning operation of the system, the lower the throughput of the system.

Additionally, as the primary beam scans over the sample (e.g., through repeated line scans), charge may accumulate on the sample. Surface charging may change the kinetic energy of secondary electrons emitted from the sample surface. Accordingly, secondary-column electron-optical elements (e.g., electron lenses, deflectors, dispersing elements, etc.) may affect secondary electron beam(s) differently. Effects such as sample surface charging may cause secondary beam spots formed on the detector to shift and may influence imaging. Shifted beam spots may cause degradation of collection efficiency and increase of cross talk. Furthermore, variation of the kinetic energy of secondary electrons and variation of near-surface electric fields may lead to defocusing of secondary electron spots on the detector and deviation of the spots from original positions within the detector. Improvements in systems and methods of detection are thus desired.

SUMMARY

Embodiments of the present disclosure provide systems and methods for detection based on charged particle beams. In some embodiments, there may be provided a charged particle beam system that includes a detector. The detector may be used for beam spot tracking. A method of detecting charged particles may include detecting beam intensity as a primary charged particle beam moves along a first direction; acquiring a secondary beam spot projection pattern as the primary charged particle beam moves along a second direction; and determining a parameter of a secondary beam spot based on the acquired secondary beam spot projection pattern.

In some embodiments, there may be provided a method of compensating for beam spot changes on a detector. The method may include acquiring a beam spot projection pattern on the detector, determining a change of the beam spot projection pattern, and adjusting a parameter of a detector cell of the detector based on the change.

Furthermore, in some embodiments, there may be provided a method of forming virtual apertures with respect to detector cells of a detector. The method may include acquiring a beam spot projection pattern on the detector, determining a parameter of a beam spot of the beam spot projection pattern, determining a parameter of an aperture associated with a detector cell based on the parameter of the beam spot, determining a change of the beam spot projection pattern, adjusting the aperture based on the change, and determining a detection signal associated with the beam spot based on output of sensing elements within the aperture.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings.

FIGS. 23A-23C illustrate a method for mapping surface potential variation using a multi-beam SEM with a dispersive energy element in its secondary column, consistent with embodiments of the disclosure.

DETAILED DESCRIPTION

Figure 1:
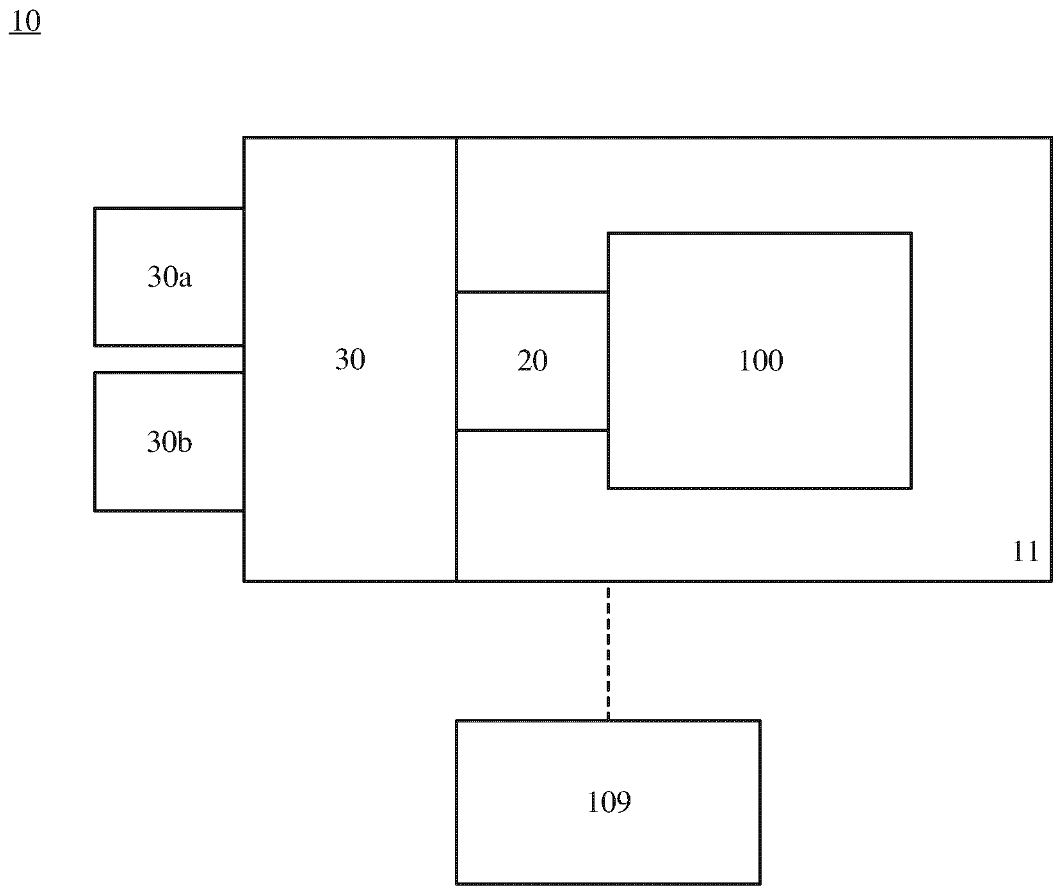
FIG. 1 is a diagrammatic representation of an exemplary electron beam inspection (EBI) system, consistent with embodiments of the disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Electronic devices are constructed of circuits formed on a piece of silicon called a substrate. Many circuits may be formed together on the same piece of silicon and are called integrated circuits or ICs. With advancements in technology, the size of these circuits has decreased dramatically so that many more of them can fit on the substrate. For example, an IC chip in a smart phone can be as small as a fingernail and yet may include over 2 billion transistors, the size of each transistor being less than 1/1,000th the width of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a “picture” of the structures. The image can be used to determine if the structure was formed properly and also if it was formed in the proper location. If the structure is defective, then the process can be adjusted so the defect is less likely to recur. To enhance throughput (e.g., the number of samples processed per hour), it is desirable to conduct inspection as quickly as possible.

An image of a wafer may be formed by scanning a primary beam of a SEM system (e.g., a “probe” beam) over the wafer and collecting particles (e.g., secondary electrons) generated from the wafer surface at a detector. Secondary electrons may form a beam (a “secondary beam”) that is directed toward the detector. Secondary electrons landing on the detector may cause electrical signals (e.g., current, charge, voltage, etc.) to be generated in the detector. These signals may be output from the detector and may be processed by an image processor to form the image of the sample.

The process of imaging may include focusing the primary beam to a point, and deflecting (e.g., bending) the beam so that it passes over regions of the wafer in a line-by-line pattern (e.g., a raster scan). At a given time, the beam may be focused to a particular position on a wafer, and output of the detector at this time may be correlated to that particular position on the wafer. An image may be reconstructed based on detector output at each time along the beam scan path.

A detector may include a pixelated array of multiple sensing elements. A pixelated array may be useful because it may allow adapting to the size and shape of beam spots formed on the detector. When multiple primary beams are used, with multiple secondary beams incident on the detector, a pixelated array may be helpful to segregate different regions of the detector associated with different beam spots.

To form detection groups for the different beam spots, first a picture of the detector surface may be acquired. In a "picture mode," output of each of the sensing elements of the pixelated array may be read, and an image that represents a projection pattern of secondary beam spots on the detector surface may be formed. That is, an image of the entire detector surface is generated. Based on this image, a boundary of a beam spot may be determined. Sensing elements located within the boundary may be grouped together, and their output may be merged together to acquire intensity of the one secondary beam spot associated with the boundary. In a "beam mode," output of the grouped sensing elements may be added together, and intensity of the beam spot may be acquired. In beam mode, output of only the grouped sensing elements may be used.

However, an issue may be encountered in that secondary beam spots formed on the detector are not static. Due to effects such as drift of the charged particle beam apparatus and variations in charging conditions of the sample under investigation, the secondary beam spots on the detector may constantly change. The secondary beam spots may change their size, shape, and location on the detector surface. In an existing SEM system, changes in secondary beam spots may be accounted for by switching to picture mode, acquiring a new projection pattern, and then switching back to beam mode. But constantly switching between different modes is time consuming and causes throughput to suffer. Furthermore, under certain conditions, beam spots may change rapidly, and switching between picture mode and beam mode may take so much time that rapid changes in beam spots are not accurately accounted for, and a beam spot cannot be tracked well.

Embodiments of the disclosure may provide systems and methods for detection that enable real-time tracking of secondary beam spots on a detector. In some embodiments, the retrace period of a scanning operation of a charged particle beam apparatus operating in beam mode may be used. During the retrace period, a portion of the sensing elements of the detector may be monitored. Ordinarily, the time period during the retrace may be unused and the primary beam may be blanked during the retrace. Embodiments of the disclosure, however, may keep the primary beam irradiating the sample at least partially during the retrace period, and may analyze information from sensing elements of the detector to update beam tracking. Sensing elements that are most likely to experience change (e.g., those near the beam spot boundary) may be focused on. Only a small number of sensing elements may need to be monitored during the retrace, allowing fast and efficient data transfer during the limited period available while the primary beam is being retraced. Secondary beam spot projection patterns may be monitored with every scan line. Secondary beam spots may be tracked in real time with high fidelity while the intensities of the secondary beam spots may be detected without interference.

Some embodiments may involve determining an effect on secondary beam spots formed on a detector (such as drift or charge accumulation) and compensating for the effect. The effect may include surface potential variation. Compensating for the effect may include manipulating the detector or other components of a charged particle beam system, such as a secondary optical system. For example, secondary beam spots formed on the detector may shift due to sample surface charging, and the detector may be controlled to adjust detector cells (where beam spot signal may be collected for detection) to follow the shifted beam spots.

The secondary optical system may be controlled to manipulate beamlets passing therethrough based on the determined effect. For example, the secondary optical system may include an anti-scanning deflector, and a signal may be provided to the anti-scanning deflector to perform overall stabilization of an array of secondary beamlets projected onto the detector. The array of secondary beamlets may be controlled so that positions of all beam spots formed on the detector are stabilized.

In some embodiments, virtual apertures may be used to trim off some regions of beam spots and follow the beam spots to compensate for effects such as shift. Virtual apertures may be implemented electronically. Like a physical aperture, a virtual aperture may cut off some regions of a beam, but virtual apertures may do so by manipulating which sensing elements in a detector are used for signal integration or changing their values (e.g., zeroing out sensing elements outside of an aperture hole). Virtual apertures may be configured to change positions based on beam spot shift, for example, so that the apertures are always centered around the beam spots. Parameters of apertures, such as size, shape, position, etc. may change based on beam spot changes.

Objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the disclosure, some embodiments may be described in the context of providing detection systems and detection methods in systems utilizing electron beams ("e-beams"). However, the disclosure is not so limited. Other types of charged particle beams may be similarly applied. Furthermore, systems and methods for detection may be used in other imaging systems, such as optical imaging, photon detection, x-ray detection, ion detection, etc. Additionally, the term "beamlet" may refer to a constituent part of a beam or a separate beam extracted from an original beam. The term "beam" may refer to beams or beamlets.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C. Expressions such as "at least one of" do not necessarily modify an entirety of a following list and do not necessarily modify each member of the list, such that "at least one of A, B, or C" should be understood as including only one of A, only one of B, only one of C, or any combination of A, B, and C.

Reference is now made to FIG. 1, which illustrates an exemplary electron beam inspection (EBI) system 10 that may be used for wafer inspection, consistent with embodiments of the disclosure. As shown in FIG. 1, EBI system 10 includes a main chamber 11 a load/lock chamber 20, an electron beam tool 100 (e.g., a scanning electron microscope (SEM)), and an equipment front end module (EFEM) 30. Electron beam tool 100 is located within main chamber 11 and may be used for imaging. EFEM 30 includes a first loading port **30*a* and a second loading port 30*b*. EFEM 30 may include additional loading ports. First loading port 30*a*** and second loading port 30*b* receive wafer front opening unified pods (FOUPs) that contain wafers (e.g., semiconductor wafers or wafers made of other materials) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown) which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 109 is electronically connected to electron beam tool 100, and may be electronically connected to other components as well. Controller 109 may be a computer configured to execute various controls of EBI system 10. While controller 109 is shown in FIG. 1 as being outside of the structure that includes main chamber 11, load/lock chamber 20, and EFEM 30, it is appreciated that controller 109 can be part of the structure.

A charged particle beam microscope, such as that formed by or which may be included in EBI system 10, may be capable of resolution down to, e.g., the nanometer scale, and may serve as a practical tool for inspecting IC components on wafers. With an e-beam system, electrons of a primary electron beam may be focused at probe spots on a wafer under inspection. The interactions of the primary electrons with the wafer may result in secondary particle beams being formed. The secondary particle beams may comprise backscattered electrons, secondary electrons, or Auger electrons, etc. resulting from the interactions of the primary electrons with the wafer. Characteristics of the secondary particle beams (e.g., intensity) may vary based on the properties of the internal or external structures or materials of the wafer, and thus may indicate whether the wafer includes defects.

The intensity of the secondary particle beams may be determined using a detector. The secondary particle beams may form beam spots on a surface of the detector. The detector may generate electrical signals (e.g., a current, a charge, a voltage, etc.) that represent intensity of the detected secondary particle beams. The electrical signals may be measured with measurement circuitries which may include further components (e.g., analog-to-digital converters) to obtain a distribution of the detected electrons. The electron distribution data collected during a detection time window, in combination with corresponding scan path data of the primary electron beam incident on the wafer surface, may be used to reconstruct images of the wafer structures or materials under inspection. The reconstructed images may be used to reveal various features of the internal or external structures or materials of the wafer and may be used to reveal defects that may exist in the wafer.

Figure 2A:
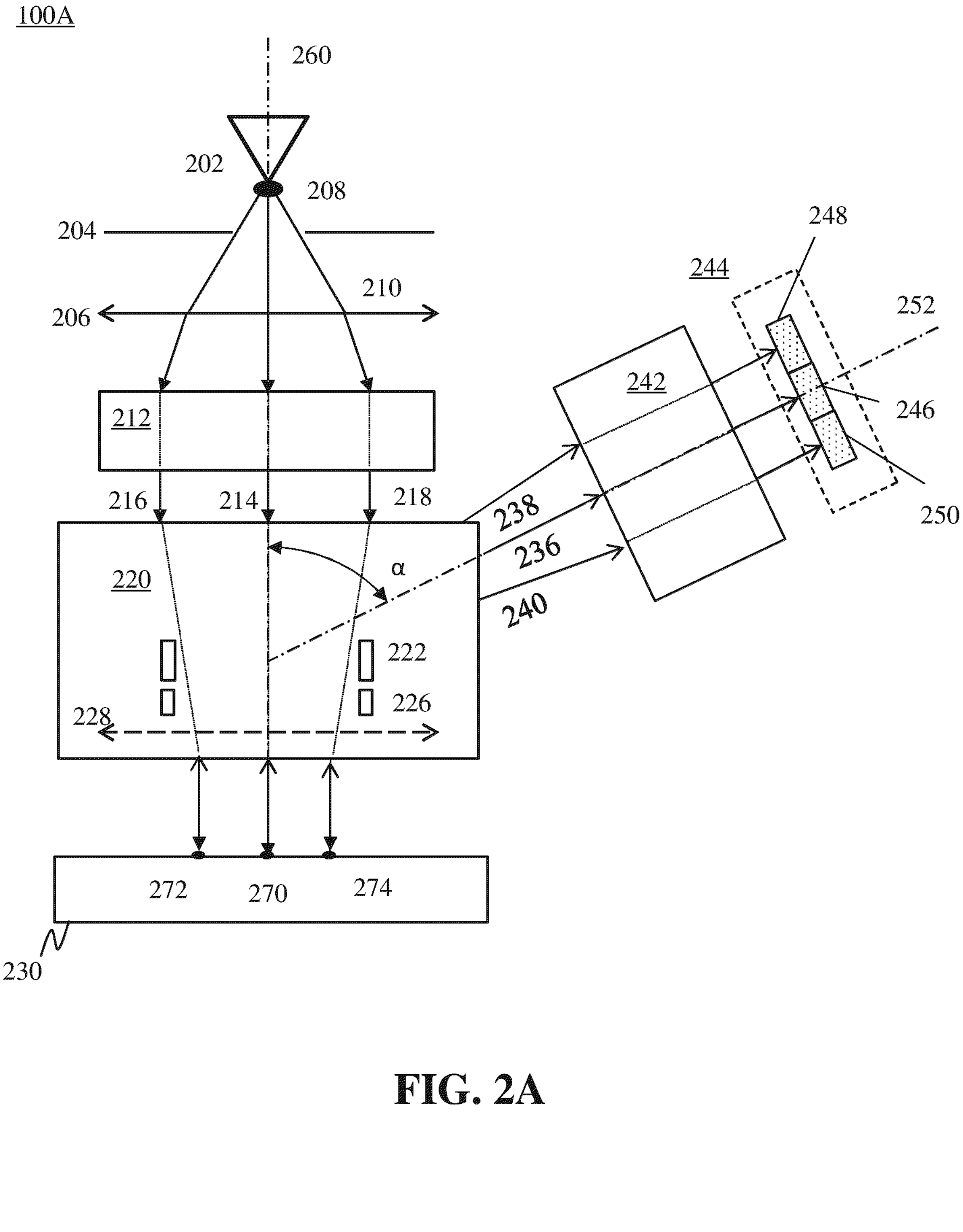
FIGS. 2A and 2B are diagrams illustrating a charged particle beam apparatus that may be an example of an electron beam tool, consistent with embodiments of the disclosure.

FIG. 2A illustrates a charged particle beam apparatus that may be an example of electron beam tool 100, consistent with embodiments of the disclosure. FIG. 2A shows an apparatus that uses a plurality of beamlets formed from a primary electron beam to simultaneously scan multiple locations on a wafer.

As shown in FIG. 2A, electron beam tool 100A may comprise an electron source 202, a gun aperture 204, a condenser lens 206, a primary electron beam 210 emitted from electron source 202, a source conversion unit 212, a plurality of beamlets 214, 216, and 218 of primary electron beam 210, a primary-electron projection optical system 220, a wafer stage (not shown in FIG. 2A), multiple secondary electron beamlets 236, 238, and 240, a secondary-electron optical system 242, and electron detection device 244. Electron source 202 may generate primary particles, such as electrons of primary electron beam 210. A controller, image processing system, and the like may be coupled to electron detection device 244. Primary-electron projection optical system 220 may comprise beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 100A. Secondary-electron optical system 242 and electron detection device 244 may be aligned with a secondary-electron optical axis 252 of apparatus 100A.

Electron source 202 may comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 may block off peripheral electrons of primary electron beam 210 to reduce size of beam (probe) spots 270, 272, and 274.

Source conversion unit 212 may comprise an array of image-forming elements (not shown in FIG. 2A) and an array of beam-limit apertures (not shown in FIG. 2A). An example of source conversion unit 212 may be found in U.S. Pat. No. 9,691,586; U.S. Publication No. 2017/0025243; and International Pub. No. WO 2018/122176, all of which are incorporated by reference in their entireties. The array of image-forming elements may comprise an array of micro-deflectors and micro-lenses. The array of image-forming elements may form a plurality of parallel images (virtual or real) of crossover 208 with a plurality of beamlets 214, 216, and 218 of primary electron beam 210. The array of beam-limit apertures may limit the plurality of beamlets 214, 216, and 218.

Condenser lens 206 may reduce divergence (e.g., collimates) of the primary electron beam 210. The e-beam currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be an adjustable condenser lens that may be configured so that the position of its first principle plane is movable. The adjustable condenser lens may be configured to be magnetic, which may result in off-axis beamlets 216 and 218 landing on the beamlet-limit apertures with rotation angles. The rotation angles change with the focusing power and the position of the first principal plane of the adjustable condenser lens. In some embodiments, the adjustable condenser lens may be an adjustable anti-rotation condenser lens, which involves an anti-rotation lens with a movable first principal plane. An example of an adjustable condenser lens is further described in U.S. Publication No. 2017/0025241, which is incorporated by reference in its entirety.

Objective lens 228 may focus beamlets 214, 216, and 218 onto a wafer 230 for inspection and may form a plurality of probe spots 270, 272, and 274 on the surface of wafer 230.

Secondary electron beamlets 236, 238, and 240 may be emitted from wafer 230 and travel back toward beam separator 222.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beamlets 236, 238, and 240 from beamlets 214, 216, and 218 and direct secondary electron beamlets 236, 238, and 240 towards secondary-electron optical system 242.

Deflection scanning unit 226 may deflect beamlets 214, 216, and 218 to scan probe spots 270, 272, and 274 over an area on a surface of wafer 230. In response to incidence of beamlets 214, 216, and 218 at probe spots 270, 272, and 274, secondary electron beamlets 236, 238, and 240 may be emitted from wafer 230. Secondary electron beams 236, 238, and 240 may comprise electrons with a distribution of energies including secondary electrons and backscattered electrons. Secondary-electron optical system 242 may focus secondary electron beamlets 236, 238, and 240 onto detection sub-regions 246, 248, and 250 of electron detection device 244. Detection sub-regions 246, 248, and 250 may be configured to detect corresponding secondary electron beamlets 236, 238, and 240 and generate corresponding signals used to reconstruct an image of the surface of wafer 230. Detection sub-regions 246, 248, and 250 may include separate detector packages, separate sensing elements, or separate regions of an array detector. In some embodiments, each detection sub-region may include a single sensing element.

Another example of a charged particle beam apparatus will now be discussed with reference to FIG. 2B. An electron beam tool 100B (also referred to herein as apparatus 100B) may be an example of electron beam tool 100 and may be similar to electron beam tool 100A shown in FIG. 2A. However, different from apparatus 100A, apparatus 100B may be a single-beam tool that uses only one primary electron beam to scan one location on the wafer at a time.

Figure 2B:
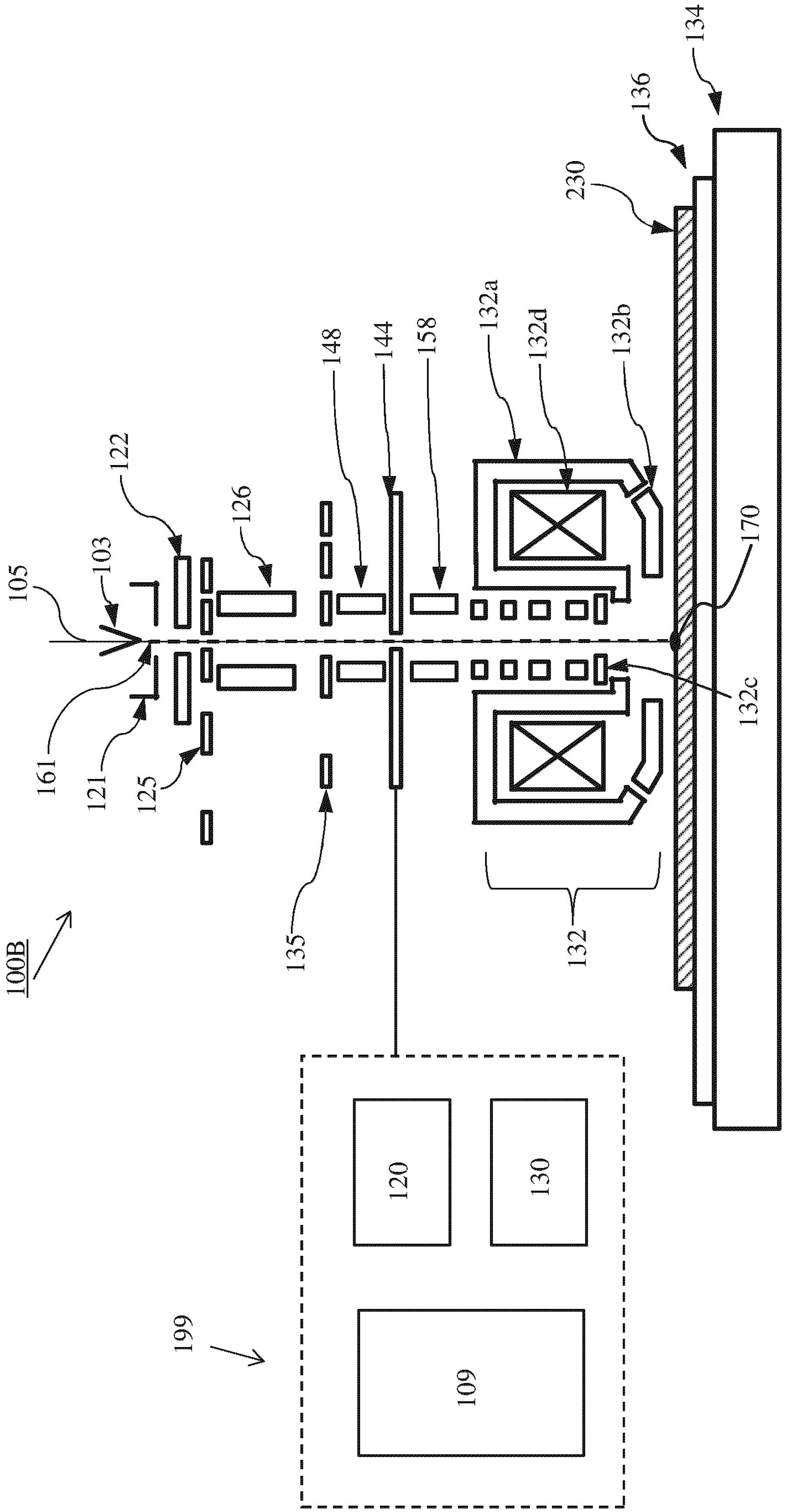

As shown in FIG. 2B, apparatus 100B includes a wafer holder 136 supported by motorized stage 134 to hold wafer 230 to be inspected. Electron beam tool 100B includes an electron emitter, which may comprise a cathode 103, an anode 121, and a gun aperture 122. Electron beam tool 100B further includes a beam limit aperture 125, a condenser lens 126, a column aperture 135, an objective lens assembly 132, and a detector 144. Objective lens assembly 132, in some embodiments, may be a modified SORIL lens, which includes a pole piece 132*a*, a control electrode 132*b*, a deflector 132*c*, and an exciting coil 132*d*. In a detection or imaging process, an electron beam 161 emanating from the tip of cathode 103 may be accelerated by anode 121 voltage, pass through gun aperture 122, beam limit aperture 125, condenser lens 126, and be focused into a probe spot 170 by the modified SORIL lens and impinge onto the surface of wafer 230. Probe spot 170 may be scanned across the surface of wafer 230 by a deflector, such as deflector 132*c* or other deflectors in the SORIL lens. Secondary or scattered particles, such as secondary electrons or scattered primary electrons emanated from the wafer surface may be collected by detector 144 to determine intensity of the beam and so that an image of an area of interest on wafer 230 may be reconstructed.

There may also be provided an image processing system 199 that includes an image acquirer 120, a storage 130, and controller 109. Image acquirer 120 may comprise one or more processors. For example, image acquirer 120 may comprise a computer, server, mainframe host, terminals, personal computer, any kind of mobile computing devices, and the like, or a combination thereof. Image acquirer 120 may connect with detector 144 of electron beam tool 100B through a medium such as an electrical conductor, optical fiber cable, portable storage media, IR, Bluetooth, internet, wireless network, wireless radio, or a combination thereof. Image acquirer 120 may receive a signal from detector 144 and may construct an image. Image acquirer 120 may thus acquire images of wafer 230. Image acquirer 120 may also perform various post-processing functions, such as image averaging, generating contours, superimposing indicators on an acquired image, and the like. Image acquirer 120 may be configured to perform adjustments of brightness and contrast, etc. of acquired images. Storage 130 may be a storage medium such as a hard disk, random access memory (RAM), cloud storage, other types of computer readable memory, and the like. Storage 130 may be coupled with image acquirer 120 and may be used for saving scanned raw image data as original images, and post-processed images. Image acquirer 120 and storage 130 may be connected to controller 109. In some embodiments, image acquirer 120, storage 130, and controller 109 may be integrated together as one electronic control unit.

In some embodiments, image acquirer 120 may acquire one or more images of a sample based on an imaging signal received from detector 144. An imaging signal may correspond to a scanning operation for conducting charged particle imaging. An acquired image may be a single image comprising a plurality of imaging areas that may contain various features of wafer 230. The single image may be stored in storage 130. Imaging may be performed on the basis of imaging frames.

The condenser and illumination optics of the electron beam tool may comprise or be supplemented by electromagnetic quadrupole electron lenses. For example, as shown in FIG. 2B, electron beam tool 100B may comprise a first quadrupole lens 148 and a second quadrupole lens 158. In some embodiments, the quadrupole lenses may be used for controlling the electron beam. For example, first quadrupole lens 148 may be controlled to adjust the beam current and second quadrupole lens 158 may be controlled to adjust the beam spot size and beam shape.

FIG. 2B illustrates a charged particle beam apparatus that may use a single primary beam configured to generate secondary electrons by causing the primary beam to interact with wafer 230. Detector 144 may be placed along optical axis 105, as in the embodiment shown in FIG. 2B. The primary electron beam may be configured to travel along optical axis 105. Accordingly, detector 144 may include a hole at its center so that the primary electron beam may pass through to reach wafer 230. FIG. 2B shows an example of detector 144 having an opening at its center. However, some embodiments may use a detector placed off-axis relative to the optical axis along which the primary electron beam travels. For example, as in the embodiment shown in FIG. 2A, discussed above, a beam separator 222 may be provided to direct secondary electron beams toward a detector placed off-axis. Beam separator 222 may be configured to divert secondary electron beams by an angle $\alpha$ toward an electron detection device 244, as shown in FIG. 2A.

A detector in a charged particle beam system may include one or more sensing elements. The detector may comprise a single-element detector or an array with multiple sensing elements. Sensing elements may include a diode or an element similar to a diode that may convert incident energy into a measurable signal. For example, sensing elements in a detector may include a PIN diode. Throughout this disclosure, sensing elements may be represented as a diode, for example in the figures, although sensing elements or other components may deviate from ideal circuit behavior of electrical elements such as diodes, resistors, capacitors, etc.

Figure 3:
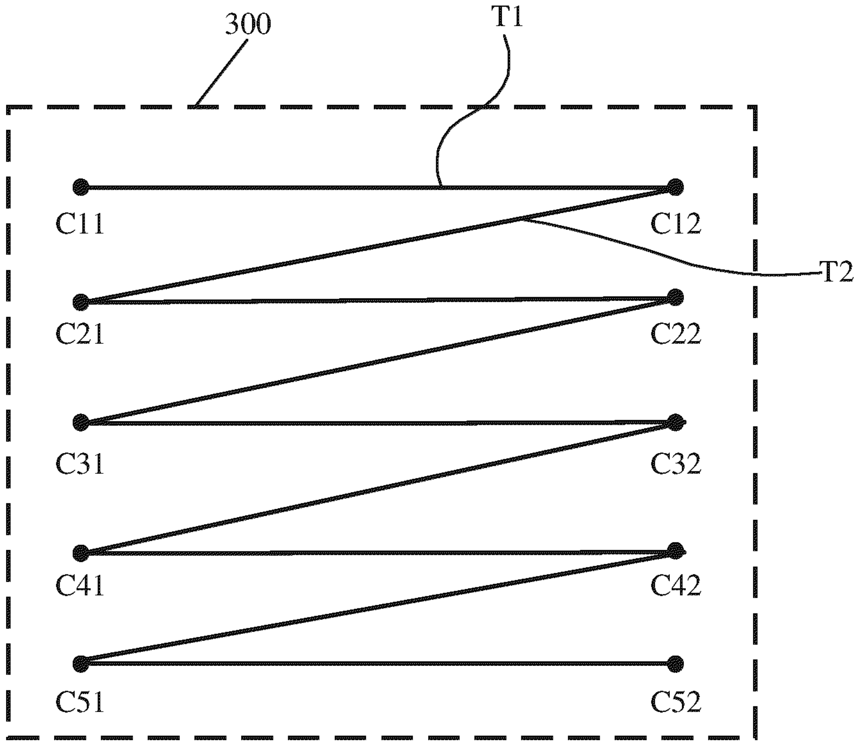
FIG. 3 illustrates a scan area and scan path, consistent with embodiments of the disclosure.

FIG. 3 illustrates a scan area and scan path, consistent with embodiments of the disclosure. As shown in FIG. 3, a scan area 300 may be provided on a surface of a sample. Scan area 300 may correspond to a FOV of a charged particle beam apparatus. The scan area may be within the FOV of the charged particle beam apparatus. During a scanning operation, a primary charged particle beam may scan in a raster pattern to cover scan area 300. In some embodiments, multiple beamlets may be used, and the scan path of each beamlet may correspond to that shown in FIG. 3, or the scan path of the array of beamlets may correspond to that shown in FIG. 3. The scan path may begin at a point C11 and proceed in a sawtooth pattern, or some other pattern. Points C11, C12, C51, and C52 may be the corners of scan area 300. Points C11, C12, C51, and C52 may be the fully deflected positions of the beam.

A primary charged particle beam may undergo a scanning operation. The scanning operation may include a first trace segment T1, as shown in FIG. 3. In the scanning operation, the primary charged particle beam may travel in a first direction from a first location to a second location. The scanning operation may begin from point C11 and proceed to point C12. Scanning may occur at a first speed. The path from point C11 to point C12 may correspond to a scan line. While the primary beam is scanning from point C11 to point C12, secondary particles may be collected at a detector. Intensity of a beam of secondary particles collected at the detector may be determined and a scan line of a charged particle beam image may be generated.

The primary charged particle beam may also undergo a return operation. The return operation may include a second trace segment T2, as shown in FIG. 3. The return operation may include a retrace. In the retrace, the primary charged particle beam may travel in a second direction from the second location to a third location. In some embodiments, the third location may coincide with the first location. The second direction may be opposite the first direction. In some embodiments, a sawtooth-like raster scan pattern may be used, and the second direction of the motion of the retrace may be angled with respect to the first direction. Still, the return operation may return the primary beam to approximately the same location as the first location so that a new scan on a fresh line can begin. The second direction may be approximately opposite the first direction.

As shown in FIG. 3, a retrace may occur from point C12 to point C21. The return operation may occur at a second speed. Further scanning may proceed from point C21, and cycles of scan and retrace may repeat. Further scan operations may proceed in the first direction. Further return operations may proceed in the second direction.

In a related art, a primary electron beam of a SEM is scanned across a sample in a raster pattern. During each line scan, intensity of a corresponding secondary electron beam is detected by an electron detection device. The detector may detect current of one or more sensing elements impinged by the secondary electron beam. After a line scan, the primary electron beam will perform a retrace. During the retrace, intensity of the corresponding secondary electron beam is not detected. In some embodiments, the primary electron beam is diverted to a place other than the sample surface (e.g., the primary electron beam is blanked) to reduce charge accumulation on the sample. Retrace periods may be treated as part of overhead of the system operation. The higher the proportion of retrace time in the overall scan time of the system, the lower the throughput of the system.

Figure 4A:
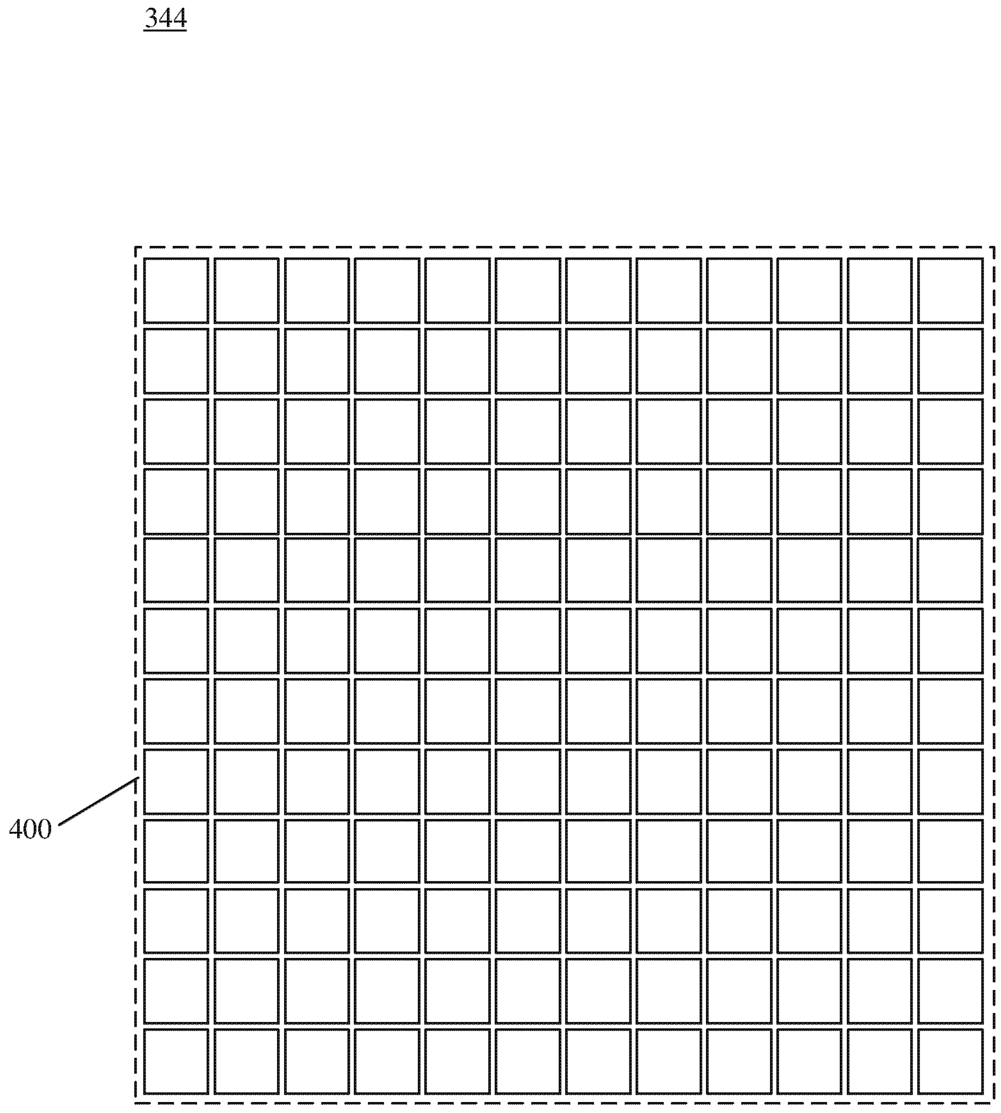
FIGS. 4A-4C illustrate a surface of a detector, consistent with embodiments of the disclosure.

Reference is now made to FIG. 4A, which illustrates a surface 344 of a detector, consistent with embodiments of the disclosure. Surface 344 may be a detection surface of detector 144 or electron detection device 244. The detection area of surface 344 may be divided into an array of smaller-area PIN diode elements. Each of the PIN diode elements may correspond to a discrete detection cell. A PIN diode may be pixelated into separate detection cells in various forms. For example, semiconductor detection cells may be divided by virtue of internal fields generated due to internal structures. Furthermore, in some embodiments, there may be physical separation between adjacent sensing elements. That is, in some embodiments, a detector array may be provided with sensing elements that are physically spaced apart from one another. There may be some isolation area provided between adjacent sensing elements.

As shown in FIG. 4A, there may be a region of interest 400 on surface 344. A pixelated array of sensing elements on a detector may make up region of interest 400. In some embodiments, there may be more sensing elements provided in the detector outside of region of interest 400. Region of interest 400 may be a portion of the detector.

Figure 4B:
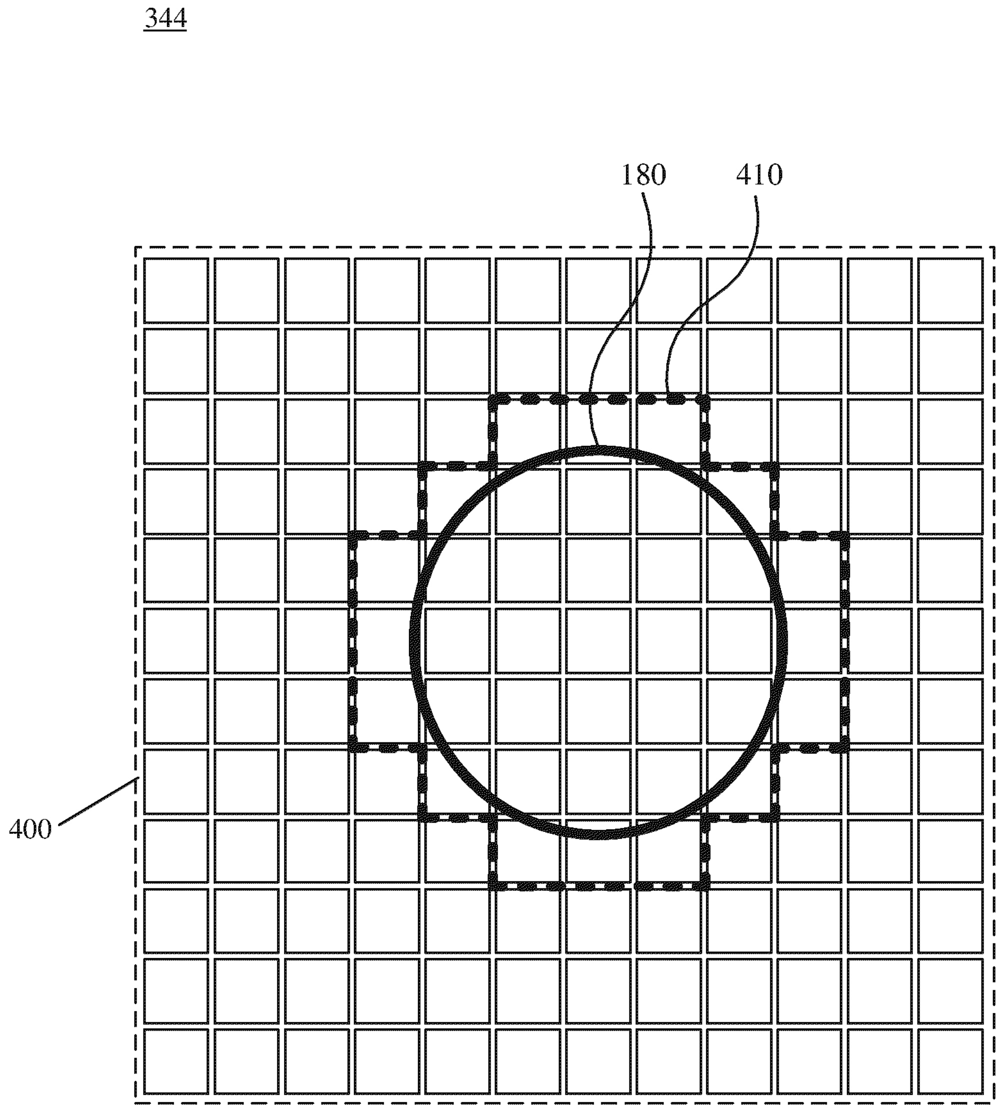

FIG. 4B shows a secondary beam spot 180 formed on surface 344 of a detector, consistent with embodiments of the disclosure. Beam spot 180 may have a well-defined center, or locus. Beam spot 180 may have an approximately round shape. Secondary particles may be generated in response to incidence of a primary beam on a sample. The secondary particles may form a beam (e.g., a secondary electron beam). The secondary electron beam may be incident on the detector and may form beam spot 180.

Furthermore, as shown in FIG. 4B, a boundary 410 may be determined. Boundary 410 may be provided so as to encompass sensing elements that receive charged particles from the secondary electron beam. The sensing elements contained within boundary 410 may be covered, at least partially, by the same charged particle beam spot. Boundary 410 may include a border of beam spot 180. As used herein, the term "boundary" may refer to an outer perimeter encompassing a beam spot as encoded by a detector. The shape of the boundary may conform to the shapes of individual sensing elements. A "border" may refer to an outline of a beam spot. The border of a beam spot may more closely correspond to a natural shape formed by charged particles of a beam impinging on a surface. For example, a beam spot may have an approximately round border and a more square or jagged boundary surrounding the border. In some embodiments, the border and boundary may coincide.

Determining a beam spot boundary may be based on an acquired beam spot projection pattern. A beam spot projection pattern may be acquired by reading individual outputs of sensing elements that may be included in a detector. In a "picture" mode, an image of the detector surface may be acquired, and a boundary or grouping of sensing elements associated with a beam spot may be determined. During picture mode, a detection system may be dedicated to projection pattern acquisition. It may be determined, for example, that electrons are being received in a group of sensing elements on the detector surface. The group of sensing elements may be continuous and may have a round shape. A beam spot boundary may be drawn around the sensing elements in the group. Each of the sensing elements within the boundary may be receiving electrons at least partially within the surface area of the sensing element. Sensing elements included in the group may be used for later processing, such as beam spot intensity determination (e.g., using a "beam" mode). Other processing in the picture mode may include pattern recognition, edge extraction, etc.

Figure 4C:
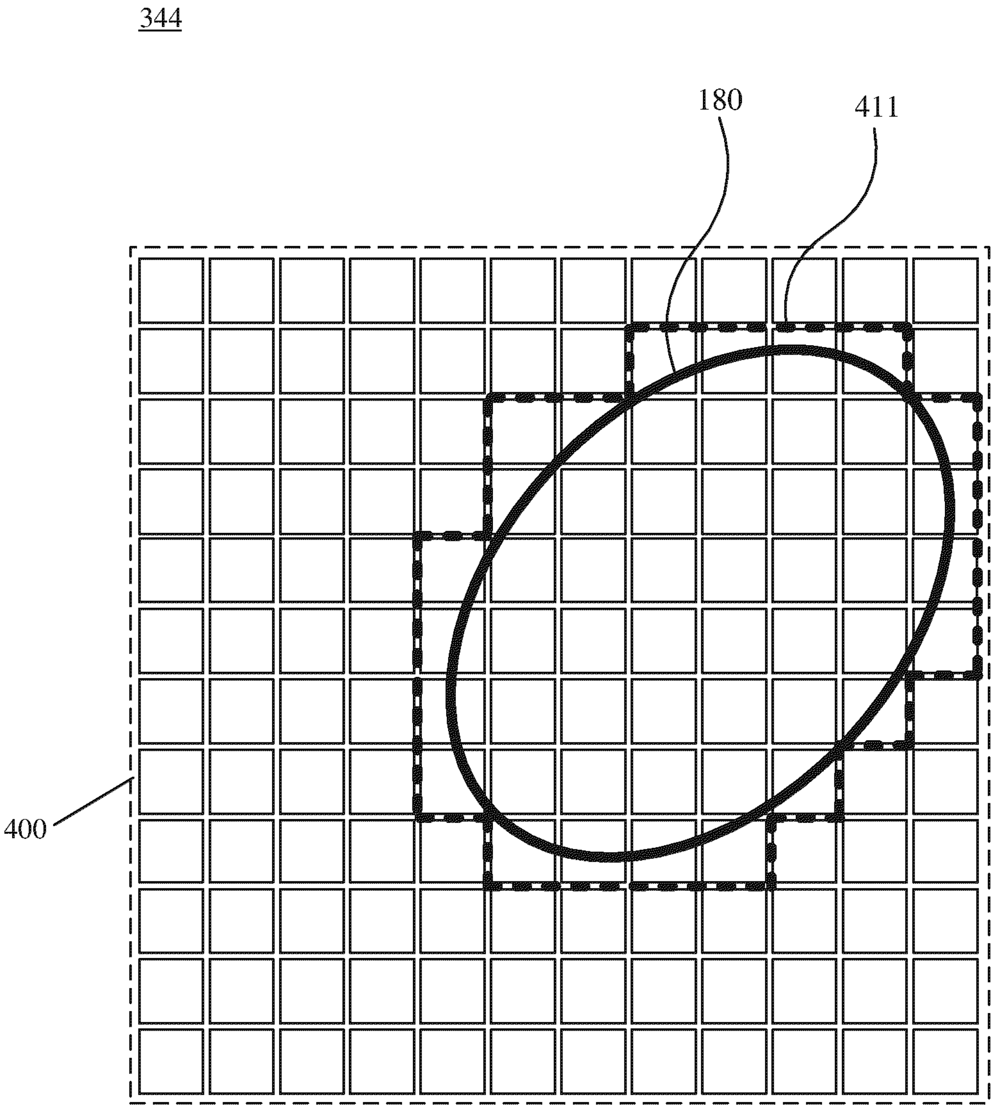

In some embodiments, beam spot 180 may deviate from a round shape. FIG. 4C shows beam spot 180 having an elongated shape. When beam spot 180 changes shape, a new boundary 411 may be determined that corresponds to the new shape. A grouping of sensing elements associated with beam spot 180 may be updated accordingly.

Beam spots formed on a detector of a charged particle beam apparatus may change shape due to, for example, drift of the charged particle beam apparatus and variations in charging conditions of the sample under investigation, etc. Drift may be a phenomenon of charged particle beam systems involving apparent movement of a sample under investigation. Drift may be caused by charged particle beam column charging and may influence the trajectories of charged particles impinging on a sample and detector. Drift may cause the characteristics of a secondary beam spot on a detector to change in aspects of, for example, size, shape, and location. Drift may involve a time-wise phenomenon and may become more pronounced over time. Drift may be a random phenomenon and may not be easily predicted and accounted for.

In addition to drift, charging conditions of a sample under investigation may change due to, for example, properties of the sample itself. Charging conditions may change due to materials or structures of the sample at a location where a primary charged particle beam scans across the sample. Changes in charging conditions may influence trajectories of secondary charged particles formed from the sample surface and heading toward the detector. This may also cause characteristics of the secondary beam spot on the detector to change. Characteristics of the sample under investigation may be unknown, hence the sample is being investigated. Therefore, it may be difficult to predict and account for changes in secondary charged particle beam spot size, shape, or location on a detector in advance.

In a comparative embodiment, a picture mode may be used to acquire an image of the detector surface. The image may reveal beam spot projection patterns on the detector. Based on the acquired image, boundaries or a grouping of sensing elements associated with a beam spot may be determined. Then, beam intensity may be determined using the sensing elements that are associated with a beam spot. SEM imaging may take place with constant switching between picture mode and beam mode to account for changes in beam spot characteristics. However, constantly switching between different modes is time consuming and causes throughput to suffer. Furthermore, under certain conditions, beam spots may change rapidly, and switching between picture mode and beam mode may take so much time that rapid changes in beam spots are not accurately accounted for, and a beam spot cannot be tracked well.

In some embodiments of the disclosure, beam spot projection tracking may be performed during a retrace period of a charged particle beam scanning operation. As discussed above with reference to FIG. 3, a retrace action may occur after each line scan during a normal SEM image acquisition process. For example, a primary charged particle beam may undergo a return operation after a scanning operation, the return operation including a second trace segment T2. The period of the retrace may be greater than or equal to a predetermined time period. The period of the retrace may be, for example, from hundreds of nanoseconds to several milliseconds long. The period of the retrace may be long enough to enable sensing element readout of at least some of the sensing elements of the detector. The period of the retrace may enable sensing element readout for sensing elements that are determined to be in a region of interest of the detector. The region of interest may include an edge of a beam spot.

Beam spot projection tracking performed during a retrace period may include performing sensing element readouts in a projection pattern tracking mode. The projection pattern tracking mode may include or may be similar to picture mode. Readouts performed in the projection pattern tracking mode may include performing parallel readouts of multiple sensing elements using multiple readout circuitries associated with the multiple sensing elements. The readout circuitries may include analog signal paths and analog-to-digital converters (ADCs) that may be provided in the detector and that each may be associated with respective sensing elements.

Parallel readouts of multiple sensing elements using multiple readout circuitries may be performed during each retrace period of a charged particle beam scanning operation. Parallel readouts may be performed for a portion of a retrace period. For example, a primary charged particle beam may be partially blanked during a retrace period, and parallel readouts of some sensing elements may be performed while the primary charged particle beam is not being blanked.

During each retrace period, a first number of sensing elements may be read out to acquire a secondary beam spot projection pattern on a detector. In some embodiments, depending on the overall number of sensing elements included in the detector, after each SEM image is captured, at least a portion of the secondary beam spot projection pattern may be acquired. Phenomena that affect the characteristics of the secondary beam spot projection pattern (e.g., drift), may be relatively slow compared to the speed of acquisition of SEM image frames. For example, drift may cause a relatively slow and continuous variation of the secondary beam spot projection pattern while a SEM system is in operation. At least partial acquisition of secondary beam spot projection patterns may be performed at points between normal SEM line scans. Acquisition of secondary beam spot projection patterns may be performed during retrace periods. Secondary beam spot projection patterns may be tracked in real time with high fidelity while intensities of secondary beams may be detected without interference. Overall throughput of a charged particle beam system may be maintained while performance may be enhanced by providing accurate beam spot tracking.

Figure 5A:
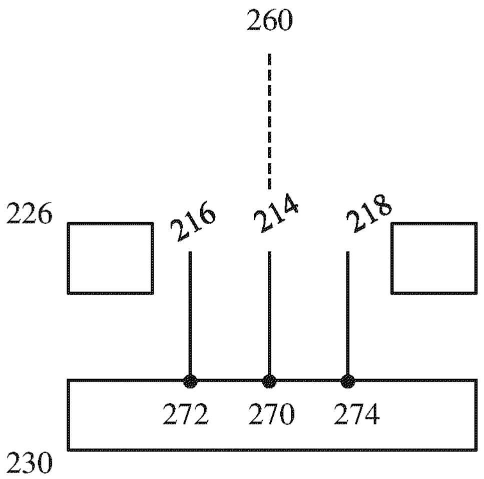
FIGS. 5A and 5B illustrate side views of scanning of primary electron beams, consistent with embodiments of the disclosure.
Figure 5B:
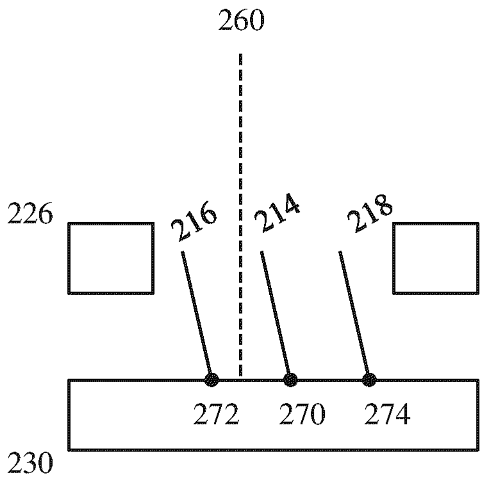
Figure 6A:
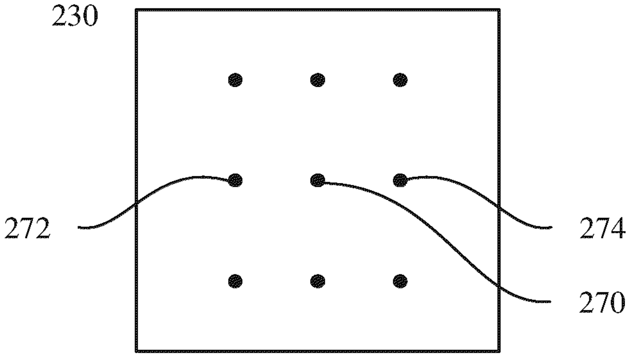
FIGS. 6A and 6B illustrate top views of scanning of primary electron beams, consistent with embodiments of the disclosure.
Figure 6B:
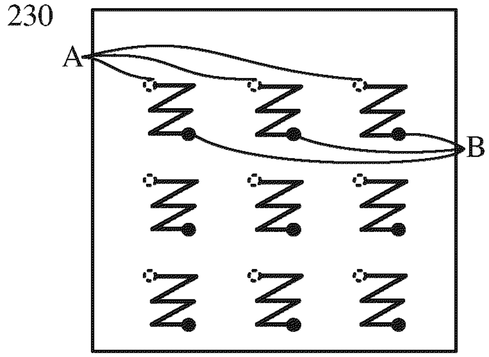

Reference will now be made to FIG. 5A, FIG. 5B, FIG. 6A, and FIG. 6B, which illustrate scanning of primary electron beams, consistent with embodiments of the disclosure. There may be a plurality of beams, e.g., primary electron beamlets, that scan across a surface of a sample. FIG. 5A and FIG. 5B show a side view of a portion of a primary charged particle beam column. Beamlets 214, 216, and 218 may be formed in the primary electron column and may travel parallel to primary optical axis 260. Beamlets 214, 216, and 218 may strike sample 230 and form beam spots 270, 272, and 274, respectively. Deflection scanning unit 226 may be configured to deflect beams traveling therethrough. As shown in FIG. 5B, deflection scanning unit 226 may deflect beamlets 214, 216, and 218 so that beam spots 270, 272, and 274 move across sample 230. FIG. 6A and FIG. 6B show corresponding top views of sample 230.

In a scanning operation mode of a multi-beam SEM, the primary deflection scanning unit may constantly move the array of primary beamlets across the inspected area. For example, deflection scanning unit 226 may deflect beamlets 214, 216, and 218 so that beam spots 270, 272, and 274 move from position A to position B in a sawtooth pattern, as shown in FIG. 6B. Beamlets may be deflected together so that beam spots on the sample surface move as a unit. Secondary electrons may be generated at each position that corresponding probe spots are formed on the surface of the sample. The secondary electrons may form a plurality of beamlets and may be directed toward secondary-electron optical system 242 (see FIG. 2A). The origin positions of the secondary electron beamlets during scanning may change constantly in operation due to scanning, and the paths of the secondary electron beamlets through a secondary-electron optical system 242 may also change. Movement of primary electron beamlet spots on the sample during scanning may also influence characteristics of secondary beam spots formed on a detector.

Figure 7A:
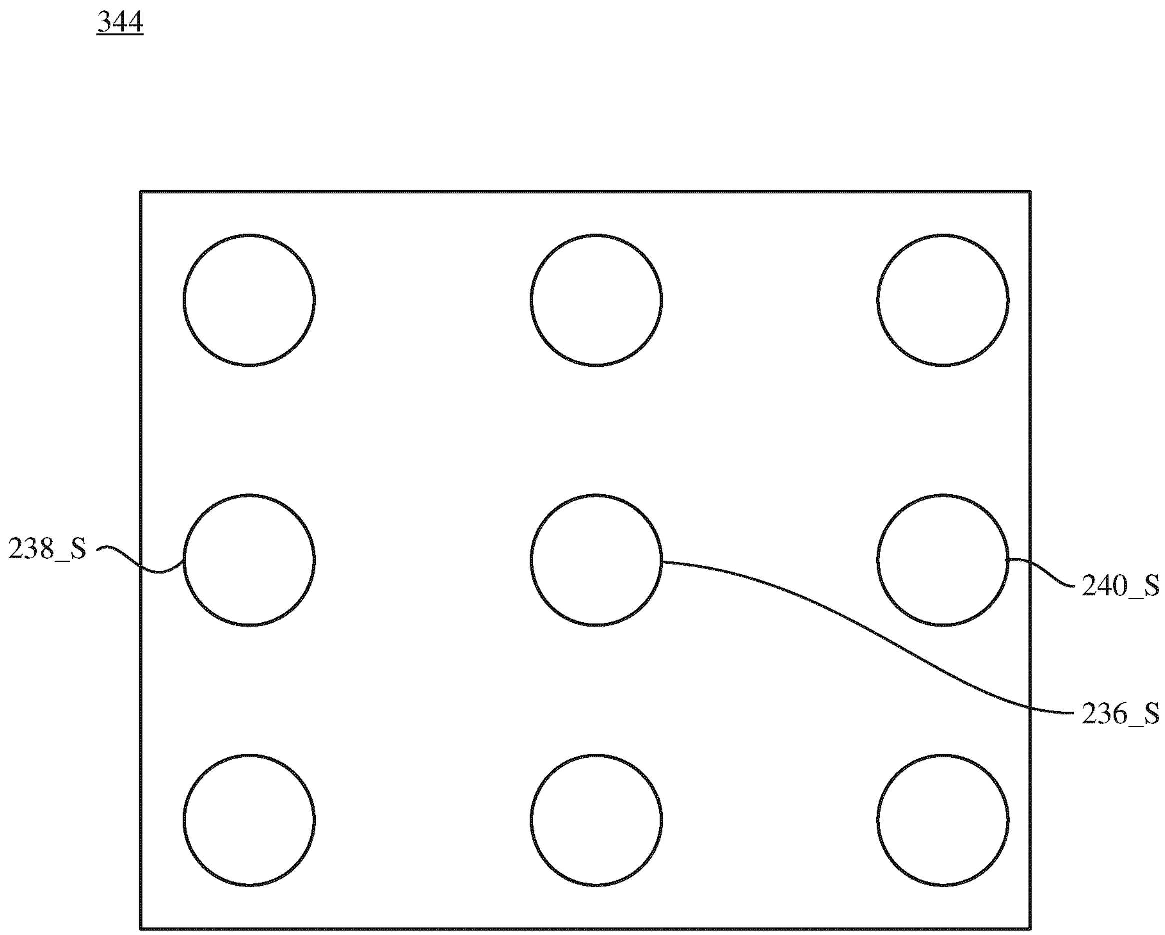
FIGS. 7A and 7B illustrate views of a surface of a detector, consistent with embodiments of the disclosure.

FIG. 7A illustrates a view of surface 344 of a detector, consistent with embodiments of the disclosure. The detector may be configured to receive a plurality of secondary charged particle beamlets. Secondary beam spots may be formed on surface 344 from the impingement of secondary charged particle beams on the detector. For example, secondary electron beamlets 236, 238, and 240 may impinge on electron detection device 244 (see FIG. 2A), and beam spots may be formed on electron detection device 244. As shown in FIG. 7A, secondary beam spots 236_S, 238_S, and 240_S may be formed on surface 344. Each of secondary beam spots 236_S, 238_S, and 240_S may be similar to beam spot 180, discussed above with reference to FIG. 4B. Each of secondary beam spots 236_S, 238_S, and 240_S may have an approximately round shape.

Figure 7B:
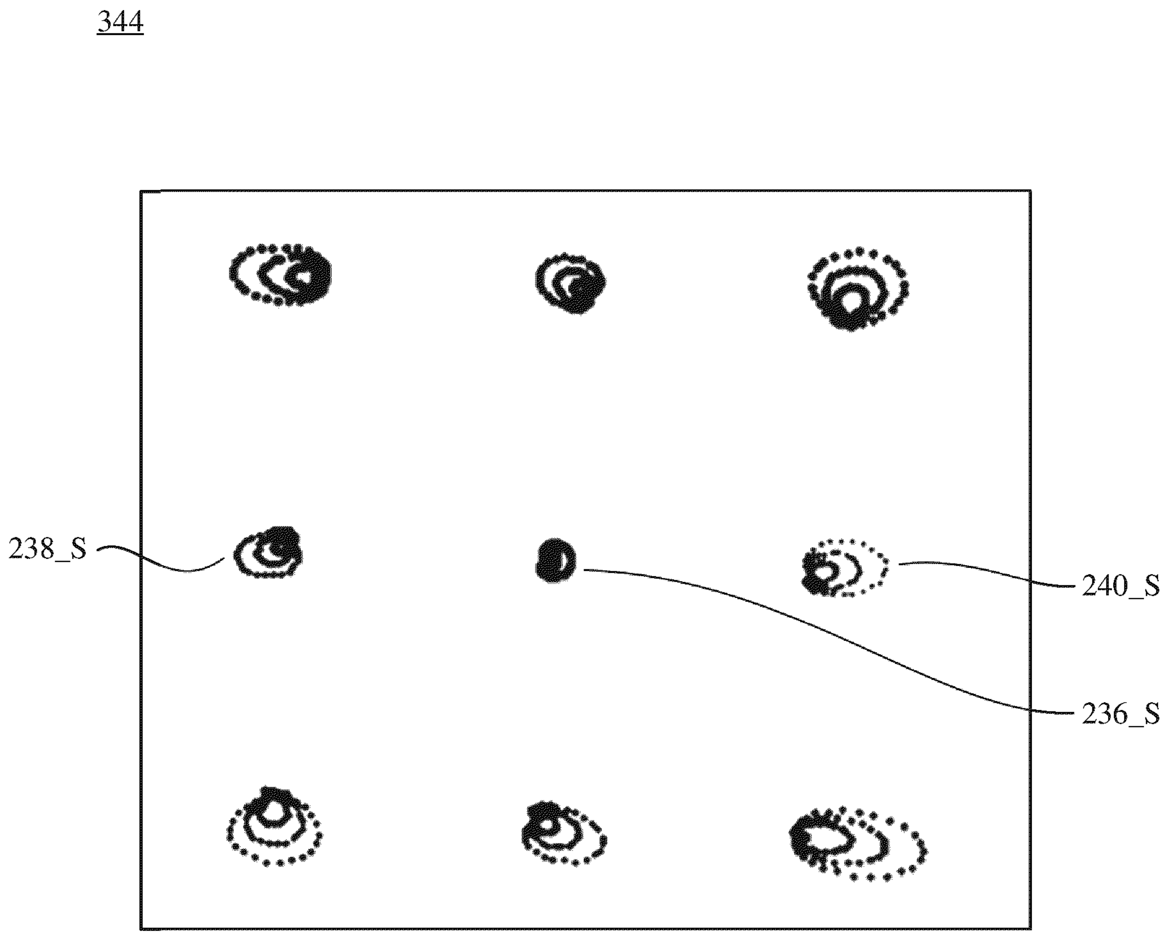

Reference is now made to FIG. 7B, which illustrates multiple beam spots deviating from a round shape. Deviation from a round shape may occur due to, for example, drift, changes in charging conditions, or any other movements in beam spots. Movements in beam spots may occur relatively slowly compared to a refresh rate of a beam spot tracking process. A beam spot tracking process may compensate for changes in characteristics of a beam spot (e.g., size, shape, location) that may be unpredictable and otherwise difficult to compensate for.

As shown in FIG. 7B, secondary beam spots may have characteristics that deviate from a standard round shape. Additionally, some secondary beam spots may differ from one another. FIG. 7B shows a beam spot 238_S and a beam spot 240_S having an elongated shape. Meanwhile, beam spot 236_S may correspond to an on-axis beamlet and may have an approximately round shape.

As discussed above, surface 344 may include a pixelated array of sensing elements on a detector. When beam spots change shape, different sensing elements may be covered by the beam spots. To accommodate changing shapes of beam spots, a pixelated array of sensing elements may adapt and form new boundaries associated with each beam spot. Groupings of sensing elements associated with an individual beam spot may be updated accordingly.

Figure 8A:
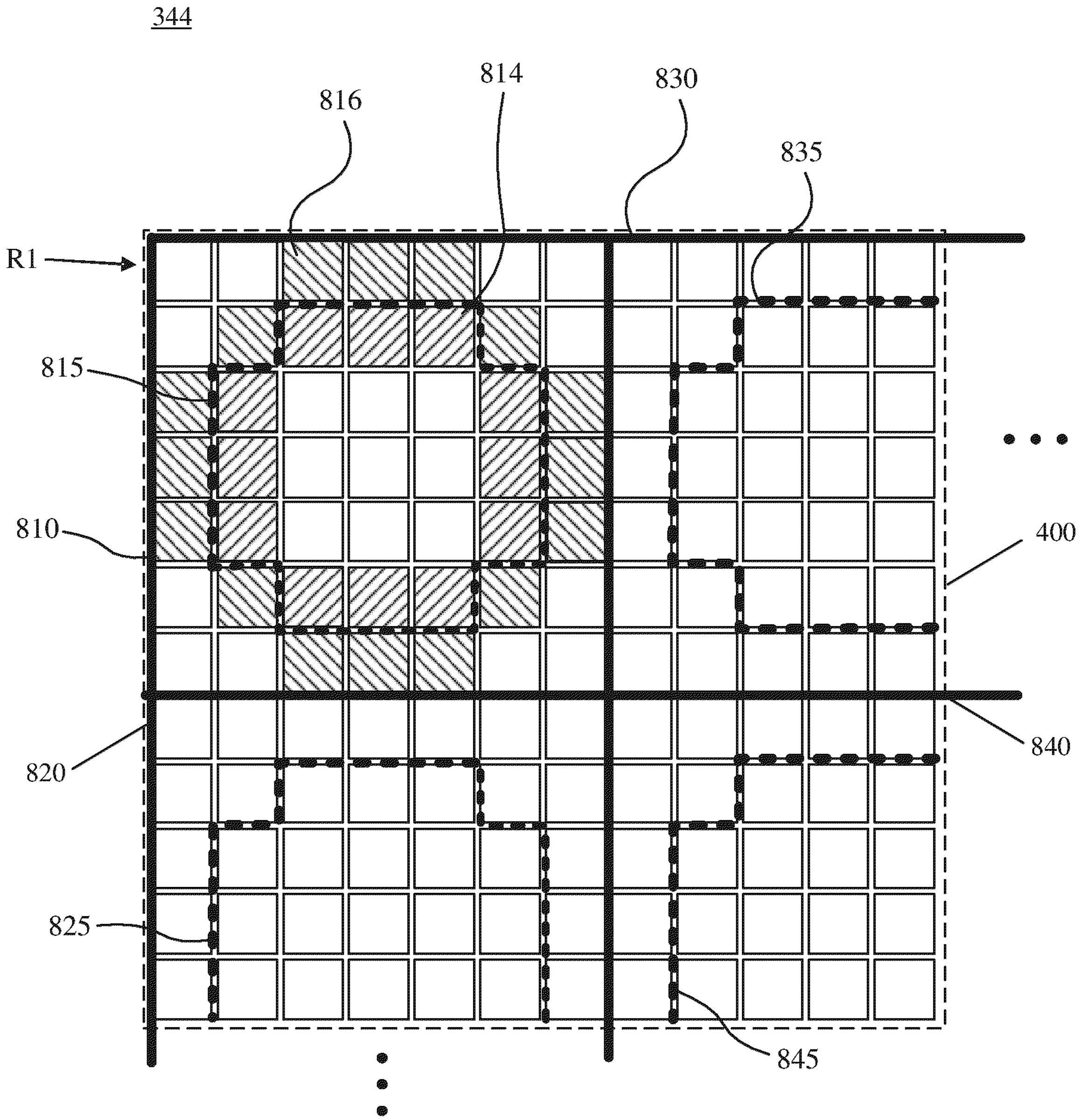
FIGS. 8A and 8B illustrate a surface of a detector, consistent with embodiments of the disclosure.

Reference is now made to FIG. 8A, which illustrates surface 344 of a detector, consistent with embodiments of the disclosure. A plurality of secondary charged particle beams may be incident on the detector. The detector may be configured so that secondary beam spots are formed in different regions on the detector surface. As shown in FIG. 8A, there may be a first region 810, a second region 820, a third region 830, and a fourth region 840. A charged particle beam system and detector may be configured so that a secondary charged particle beamlet is directed to its own region on the detector. Each of regions 810, 820, 830, and 840 may be configured to receive a secondary charged particle beam spot. It will be understood that further regions may be formed. For example, for a charged particle beam apparatus configured to generate a 3×3 array of primary charged particle beamlets, a detector may have at least an array of 9 regions to receive respective secondary charged particle beam spots. The regions may be configurable.

Surface 344 may include a plurality of sensing elements. Each region 810, 820, 830, and 840 may encompass multiple sensing elements. Regions may be changed by modifying which sensing elements are included in each region. In some embodiments, a region may include a boundary of a secondary charged particle beam spot. For example, for each of the beam spots that may be formed on surface 344, a boundary may be formed. As shown in FIG. 8A, a first boundary 815 may be formed. Similarly, a second boundary 825, a third boundary 835, and a fourth boundary 845 may be formed. Each of the boundaries may correspond to an individual secondary charged particle beam spot formed on surface 344. Secondary charged particle beam spots may have a round shape and boundaries 815, 825, 835, and 845 may also have an approximately round shape.

In a first mode, a secondary beam spot projection pattern on surface 344 may be acquired. The first mode may include a projection pattern tracking mode. The projection pattern tracking mode may include or may be similar to a picture mode. The first mode may include reading out the output of sensing elements included in a region of surface 344. Readouts of sensing elements may occur on a per-sensing element basis. For example, output of sensing elements included in the region may be read out one-by-one. Readouts of the sensing elements may be used to form a picture of the region of surface 344. For example, with reference to FIG. 8A, output of sensing elements included in first region 810 may be acquired. Using the output of sensing elements included in first region 810, a picture of a secondary beam spot may be formed. Furthermore, boundary 815 may be determined. It may be determined that sensing elements within boundary 815 are receiving electrons.

In a second mode, intensity of a secondary beam spot on surface 344 may be determined. The second mode may include beam mode. The second mode may include grouping sensing elements together and reading out the output of grouped sensing elements. Output of grouped sensing elements may be read out together, e.g., using a common bus or circuitries connecting multiple sensing elements. Rather than being read out one-by-one, output of multiple sensing elements may be read out together. Sensing elements may be grouped according to whether or not they are included within a boundary of a secondary beam spot. For example, with reference to FIG. 8A, output of sensing elements included within boundary 815 may be acquired. Output of grouped sensing elements may represent intensity of a secondary beamlet incident on surface 344.

Figure 8B:
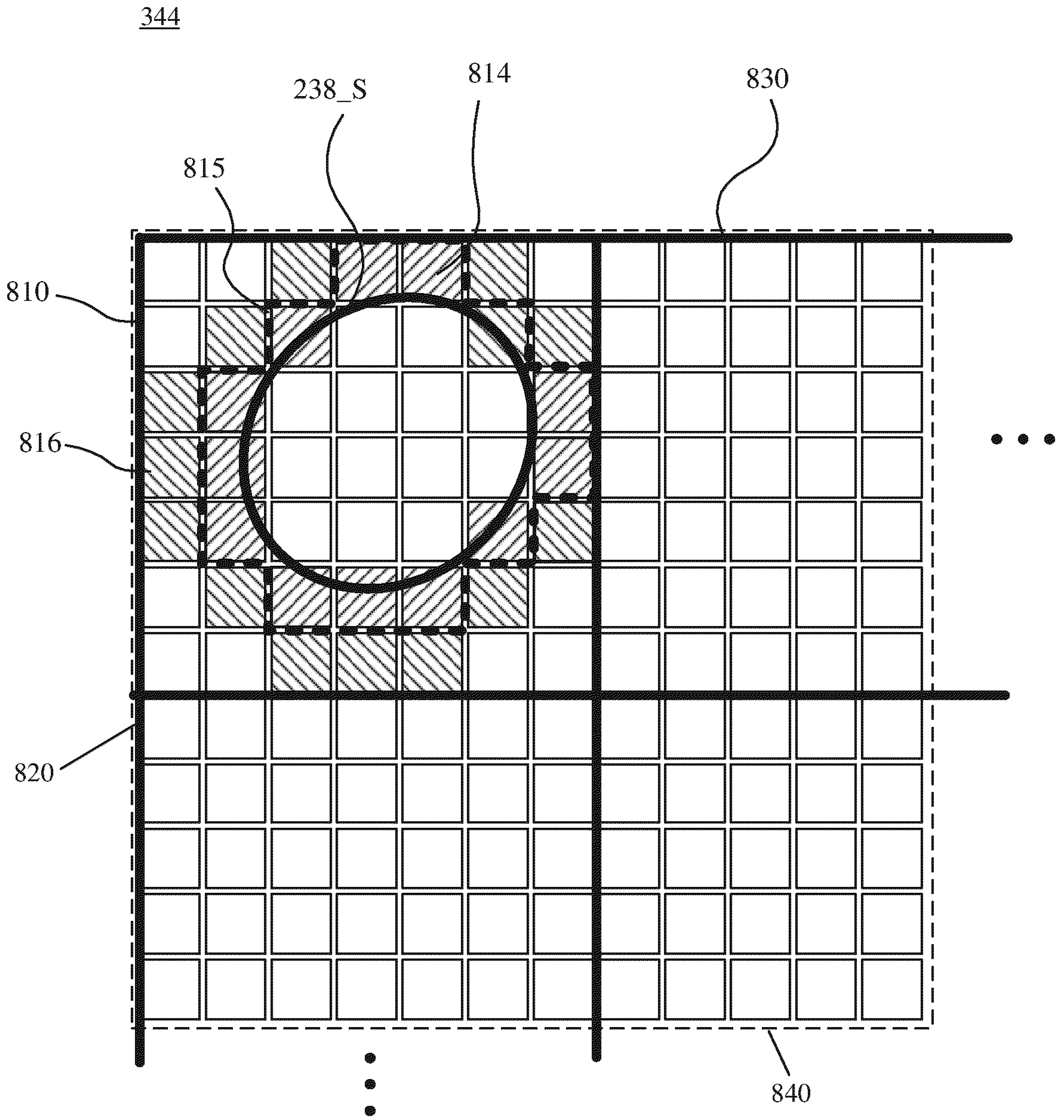

Characteristics of secondary charged particle beam spots may change in operation of a charged particle beam apparatus. Similar to beam spot 180 discussed above with respect to FIG. 4C, one or more of multiple beam spots incident on surface 344 may deviate from a round shape. FIG. 8B shows beam spot 238_S having an elongated shape. When beam spot 238_S changes shape, boundary 815 may be changed to correspond to the new shape. A grouping of sensing elements associated with beam spot 238_S on surface 344 may be updated accordingly.

Beam spot tracking may be performed by performing beam spot projection pattern tracking. Beam spot projection pattern tracking may include using a projection pattern tracking mode. Beam spot projection pattern tracking may include secondary beam spot projection pattern acquisition. Secondary beam spot projection pattern acquisition may be performed at a time that beam intensity determination is not being performed. In some embodiments, secondary beam spot projection pattern acquisition may be performed during a retrace period between line scans. During line scans, a charged particle beam system may be performing beam intensity determination. Beam intensity determination may include using beam mode. Beam intensity determination and beam spot projection pattern tracking may be performed while a primary charged particle beam of a charged particle beam apparatus moves in different directions. In some embodiments, charged particles detected during both beam intensity determination and beam spot projection pattern tracking may contribute to generation of a SEM image. In some embodiments, a SEM image may be generated based solely on charged particles detected during beam intensity determination. Charged particles detected during beam spot projection pattern tracking may be used for adjusting groupings of sensing elements, with the charged particles not being applied to generate a SEM image.

In some embodiments, the performance of beam intensity determination may be based on results from the secondary beam spot projection pattern acquisition. Beam intensity determination may use output from sensing elements included in a beam spot boundary. The beam spot boundary may be determined from the secondary beam spot projection pattern acquisition. Refreshing of the beam spot boundary may occur after each line scan. Based on the refreshed beam spot boundary, it may be determined to use different sensing elements for beam intensity determination. Refreshing may be performed during a retrace period.

The same or different groups of sensing elements may be used for beam intensity determination (e.g., in beam mode) and for beam spot projection pattern tracking. In some embodiments, sensing elements used for beam intensity determination may at least partially overlap with sensing elements used for beam spot projection pattern tracking. In some embodiments, sensing elements used for beam intensity determination and sensing elements used for beam spot projection pattern tracking may be mutually exclusive. In some embodiments, more sensing elements may be used in beam spot projection pattern tracking than in beam intensity determination.

To further improve the refresh rate of beam spot projection pattern tracking, refreshing of a beam spot boundary may be performed using only some of the sensing elements included in a region of a detector. A "region of interest" may be used, with the region of interest including fewer sensing elements than a total number of sensing elements included in the detector. For example, after one whole frame of a secondary beam spot projection pattern is acquired (e.g., a full frame forming a picture of a detector surface), the temporary locations, sizes, and shapes of secondary charged particle beam spots may be identified. In some embodiments, only the areas covered by the beam spots and nearby areas surrounding the beam spot may be monitored. In this way, only part of the detector surface instead of the whole surface may need to be read out in a per-sensing element manner during a retrace period.

Furthermore, in some embodiments, a number of channels used for data transmission may be adjusted to optimize performance and minimize power consumption. For example, if the overall pixel rate of a real-time secondary charged particle beam spot tracking is reduced to a certain level, the number of channels needed to be enabled during retrace periods for tracking may be reduced.

Beam spot tracking may be performed using partial monitoring of sensing elements. As shown in FIG. 8A, region 810 may include further regions of interest. There may be a beam inner peripheral region 814. Region 814 may be interior to boundary 815. There may also be a beam outer peripheral region 816. Region 816 may be exterior to boundary 815. In some embodiments, secondary beam spot projection pattern acquisition may be performed using only sensing elements included in a region of interest, such as region 814 or region 816. In some embodiments, a region of interest may include both region 814 and region 816.

The term "secondary beam spot projection pattern acquisition" may include acquisition of a full pattern of a secondary beam spot, or acquisition of only a part of the secondary beam spot.

Secondary beam spot projection pattern acquisition may include determining whether a boundary of a beam spot has changed. Determining whether the boundary has changed may include monitoring only some sensing elements, e.g., those in a region of interest. It may be determined, for example, that a boundary of a beam spot has changed when a sensing element in region 816 receives charged particles. Region 816 may be outside of boundary 815. Thus, if electrons are received in sensing elements of region 816, outside boundary 815, it may be determined that the shape of the beam spot has changed, and boundary 815 should be adjusted to include the sensing elements that received electrons. In some embodiments, a threshold may be used to determine whether a sensing element in a region of interest receives charged particles. The threshold may include a fixed value or may be set in an adaptive way. Adaptive setting of the threshold may help to reduce the rate of false detection of beam spot changes. The threshold may be set based on a variation of signal level, the variation corresponding to the amount of charged particles received by a sensing element among sensing elements in a region of interest. This may also help to reduce the rate of false detection.

In some embodiments, sensing elements used for secondary beam spot projection pattern acquisition may be the same as those used for beam mode. Rather than monitoring all sensing elements in region 810, for example, only sensing elements included within boundary 815 may be monitored for secondary beam spot projection pattern acquisition. The sensing elements used for secondary beam spot projection pattern acquisition may include all of the same sensing elements used for beam mode.

In some embodiments, sensing elements used for secondary beam spot projection pattern acquisition may be different from those used for beam mode. For example, only sensing elements included within region 816 may be monitored for secondary beam spot projection pattern acquisition. Groupings of sensing elements used for secondary beam spot projection pattern acquisition or beam mode may be partially overlapping, mutually exclusive, or may be selected based on a relationship between sensing elements and the beam spot.

In some embodiments, a region of sensing elements around the beam spot may be used for secondary beam spot projection pattern acquisition. The region may include a ring around the beam spot. The region may or may not include the sensing elements used for beam mode. There may be, for example, a first grouping of sensing elements used for beam mode and a second grouping of sensing elements that includes a ring around the first grouping (and which does not include any sensing elements of the first grouping). In some embodiments, the second grouping may include all of the sensing elements of the detector. In some embodiments, the second grouping may be more focused. In some embodiments, the second grouping may include a ring around the first grouping and all or some of the sensing elements in the first grouping. The ring may include region 816 as shown in FIG. 8A. The first grouping may include sensing elements within boundary 815. Furthermore, in some embodiments, the beam spot may include a plurality of secondary beam spots formed on the detector and the ring may include rings around respective groupings for each beam spot.

In some embodiments, a row of sensing elements may be used for secondary beam spot projection pattern acquisition. For example, as shown in FIG. 8A, a row R1 of sensing elements adjacent to an edge of boundary 815 may be used. When a sensing element in row R1 begins receiving electrons, it may be determined that a beam spot has changed shape and boundary 815 should be changed to include the sensing element receiving electrons.

Switching between modes such as secondary beam spot projection pattern acquisition and beam intensity determination may occur in a single step. For example, after acquiring sensing element output in a per-sensing element manner (e.g., performing one full surface monitoring), starting from the next frame, the area to be monitored may be reduced to just a part of the surface. Full surface monitoring may be performed during retrace time. Or it may be performed before starting of normal SEM image acquisition. In a phase of partial surface monitoring during a retrace period, a percentage reduction of the monitored areas may be performed in one step or multiple steps. Using multiple steps, each step may reduce a certain amount of area. A method may include acquiring a full picture and gradually focusing on regions of interest. Focusing on regions of interest may include a target acquiring process.

A target acquiring process may help to narrow down on regions of interest to monitor for beam spot changes. Target acquiring may involve determining information about the tendency of variation of beam spots on the detector surface including parameters such as the following: (i) moving direction of a beam spot, (ii) moving speed of a beam spot, (iii) acceleration direction of a beam spot, (iv) acceleration amount, (v) moving direction of each point on the boundary of a beam spot, (vi) moving speed of each point on the boundary of a beam spot, (vii) acceleration direction of each point on the boundary of a beam spot, and (viii) acceleration amount of each point on the boundary of a beam spot. The above parameters may be temporary (e.g., instantaneous) parameters determined at a particular time point. The parameters may be relative to a previous time point (e.g., a previous acquisition). Parameters of a beam spot may be determined based on representative features, such as a center of mass of the beam spot. For example, a moving speed of a beam spot may be determined based on a moving speed of a geometric center of mass of the beam spot.

Information about the tendency of variation of beam spots may be used to track and predict movement, size, and shape variation of beam spots. A parameter of a beam spot may be used to determine a region of interest. Secondary beam spot projection pattern acquisition may be performed using sensing elements in the region of interest. Output read out from sensing elements in the region of interest may be used to determine whether a boundary of the beam spot is to be changed.

Tracking of a beam spot may be performed for only a portion of the beam spot. It may be determined that a beam spot is static except for a portion of the beam spot. Information about the tendency of variation of a beam spot may be used to narrow a region of interest for tracking. For example, it may be determined that only a top half of a beam spot has a tendency to change. Furthermore, tracking may be performed on only some of beam spots included in a plurality of beam spots incident on a detector. For example, it may be determined that some beam spots are static (e.g., central beam spot 236_S shown in FIG. 7B) while other beam spots have a tendency to change.

In some embodiments, information about the tendency of variation of beam spots may be used to determine monitoring areas in the next frame of a secondary beam spot projection pattern on a detector. If tracking of a certain spot or spots is lost, then a full area (e.g., the whole detector surface) may be acquired for secondary beam spot projection pattern acquisition. Full area acquisition may be conducted in the next frame. Full area acquisition may be performed during retrace periods or by interrupting SEM image acquisition.

In some embodiments, secondary beam spot projection pattern acquisition may be performed only partially during a retrace period. For example, secondary beam spot projection pattern acquisition may occur only during a portion of second trace segment T2 (see FIG. 3). The portion used for secondary beam spot projection pattern acquisition may be the same or different from a period of acquisition of one frame of a SEM image. In some embodiments, the whole retrace period (e.g., the entire length of second trace segment T2) may be used for secondary beam spot projection pattern acquisition.

To reduce or control charging effects on a sample, a primary charged particle beam may be blanked during certain retraces or during certain portions of a retrace period. The primary charged particle beam may be diverted away from the sample surface. Blanking may depend on the refresh rate of the detector and area to be imaged.

In some embodiments, information acquired from secondary beam spot projection pattern acquisition may also be used to reveal properties of the sample. For example, due to different charging conditions on the sample, different drift of secondary beam spot projection patterns may occur on the detector.

Figure 9:
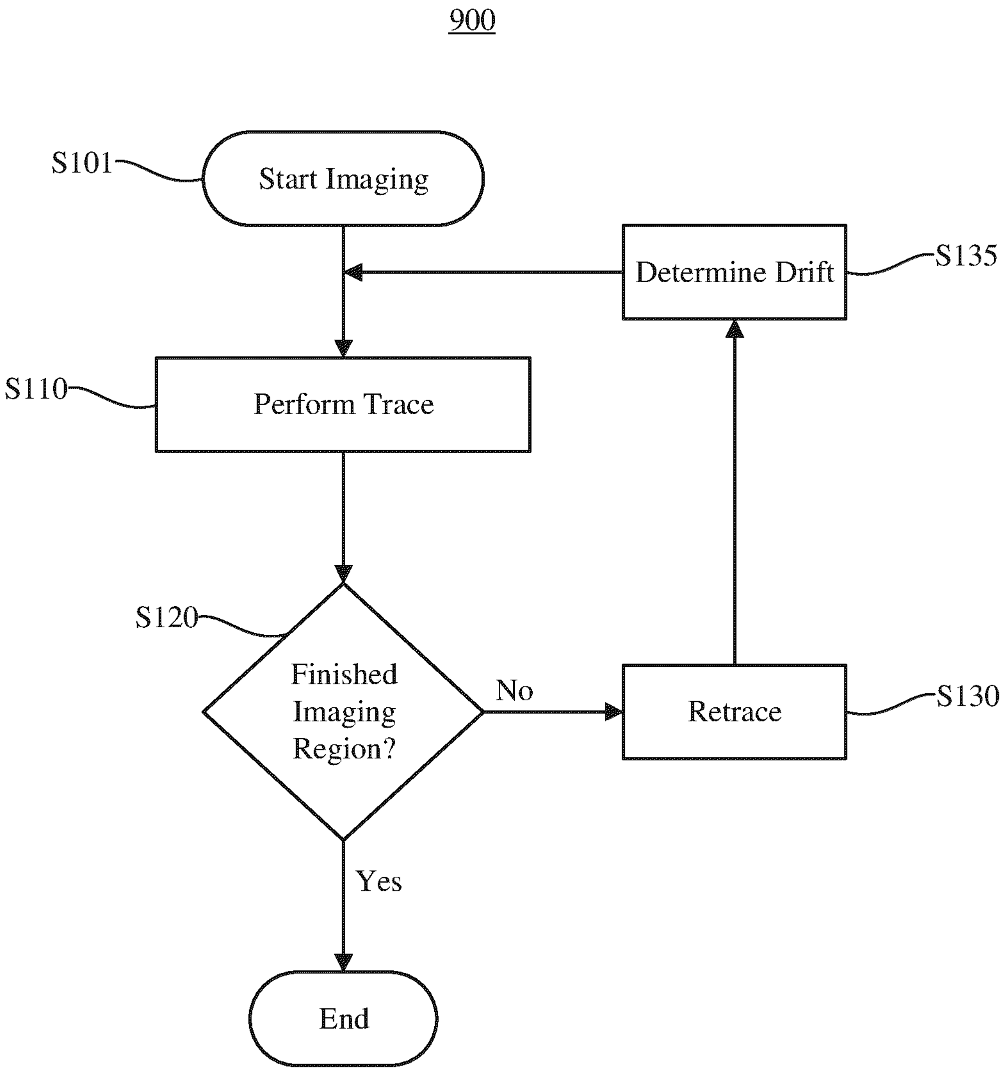
FIG. 9 is a flowchart illustrating a method that may be useful for electron detection, consistent with embodiments of the disclosure.

Reference is now made to FIG. 9, which is a flowchart showing a method 900 that may be useful for electron detection, consistent with embodiments of the disclosure. Method 900 may be performed by a charged particle beam system. The charged particle beam system may include EBI system 10 (see FIG. 1). As shown in FIG. 9, method 900 may begin from a step S101 of starting imaging. Imaging may include generating a primary beam of charged particles. The primary beam may include a plurality of beamlets. Imaging may include scanning a region of a sample, such as scan area 300 of FIG. 3.

Method 900 may include a step S110 of performing a trace. Step S110 may include causing a primary charged particle beam to undergo a line scan action on a sample surface. Step S110 may include causing the primary charged particle beam to move along first trace segment T1 (see FIG. 3). The line scan action may be in a first direction at a first speed. During the line scan, the intensity of a corresponding secondary electron beam may be detected by a detector.

Method 900 may include a step S120 of determining that imaging of the region is finished. Determining that imaging of the region is finished may include determining that all of line scans needed to cover the region have been completed. If imaging of the region is finished, method 900 may end. If imaging of the region is not finished, method 900 may proceed to a step S130 of retracing.

Step S130 may include causing the primary charged particle beam to undergo a return action. The return action may include a retrace. Step S130 may include causing the primary charged particle beam to move along second trace segment T2 (see FIG. 3). After the preceding line scan in the first direction is finished, the primary beam may move in a second direction at a second speed in preparation to start another line scan. The second direction may be opposite to the first direction. The return action may move the primary beam back to a location near where the preceding line scan started.

During the retrace, beam spot projection pattern tracking may be performed. Step S130 may include performing secondary beam spot projection pattern acquisition. Step S130 may include determining a boundary of a secondary beam spot on the detector. Step S130 may include using projection pattern tracking mode to acquire an image of the detector surface. Step S130 may include determining grouping of sensing elements associated with a beam spot. It may be determined that sensing elements included within a boundary are to be grouped together to be associated with a secondary beam spot.

Following step S130, method 900 may proceed to a step S135 of determining drift or other characteristics of a secondary beam spot. It may be determined, for example, that a secondary beam spot is drifting due to changes in a boundary of the secondary beam spot. Step S135 may include performing target acquiring. Target acquiring may involve determining information about the tendency of variation of the secondary beam spot.

Following step S135, method 900 may return to step S110 of performing a trace. Method 900 may proceed in cycles of performing a trace and performing a retrace. Method 900 may be used to perform line-by-line scanning of a region of a sample. A plurality of primary charged particle beamlets may be used, and a plurality of secondary beamlets may form a plurality of secondary beam spots of the detector. Step S110 may include simultaneously performing traces of a plurality of primary charged particle beamlets. Step S130 may include simultaneously performing retraces of the plurality of primary charged particle beamlets and performing beam spot projection pattern tracking of the plurality of secondary beam spots.

Sensing elements used in step S110 may be the same or different from those used in step S130. In some embodiments, step S110 may include performing a line scan using sensing elements grouped into a group to be associated with a secondary beam spot, and step S130 may include performing beam spot projection pattern tracking using only those sensing elements that are not grouped into any group. In some embodiments, step S130 may include performing beam spot projection pattern tracking using sensing elements that have been grouped into certain groups. During a retrace, there may be no need to perform beam intensity detection.

In some embodiments, beam spot projection pattern tracking may include (i) generating new frames of beam spot projection patterns based on information acquired during one or more retrace periods, and using the frames to determine changes in beam spots; (ii) generating partial frames of beam spot projection patterns based on information acquired during one or more retrace periods, the partial frames covering only areas that are covered by beam spots and their surrounding areas, and using the partial frames to determine changes in beam spots; or (iii) defining a boundary around the outside of each beam spot based on information acquired during one or more retrace periods, and detecting an event such as the beam spot crossing the boundary.

Figure 10:
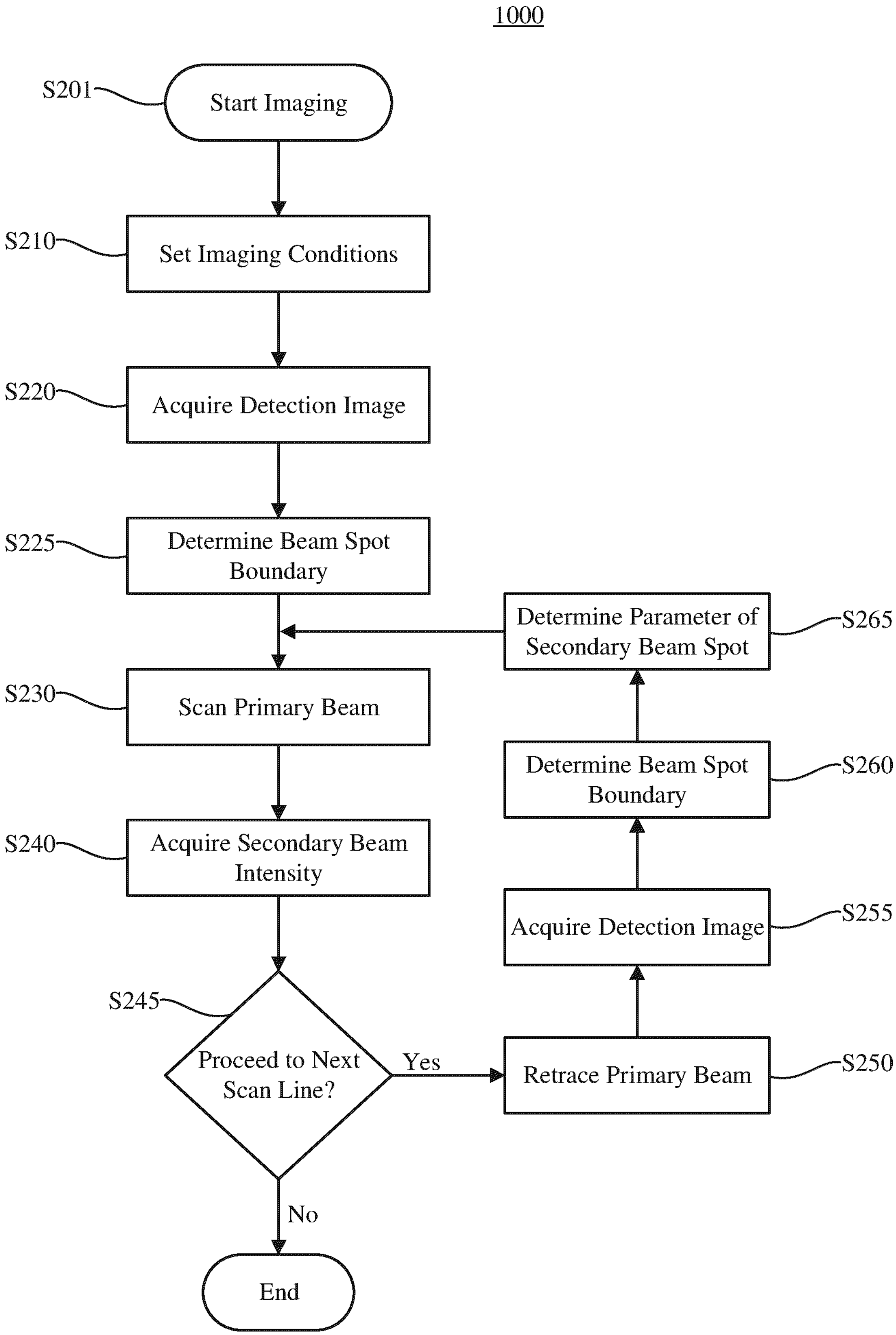
FIG. 10 is a flowchart illustrating a method that may be useful for electron detection, consistent with embodiments of the disclosure.

Reference is now made to FIG. 10, which is a flowchart showing a method 1000 that may be useful for electron detection, consistent with embodiments of the disclosure. Similar to method 900, method 1000 may be performed by a charged particle beam system. As shown in FIG. 10, method 1000 may begin from a step S201 of starting imaging. Imaging may include generating a primary beam of charged particles. The primary beam may include a plurality of beamlets.

Method 1000 may include a step S210 of setting imaging conditions. An initial imaging setting may be configured.

Method 1000 may include a step S220 of acquiring a detection image. Step S220 may include acquiring a secondary beam spot projection pattern on a surface of a detector. Step S220 may include operating in a picture mode. Step S220 may include acquiring a full frame of the surface of the detector. Step S220 may be used to determine an initial beam spot projection pattern from which beam spot tracking may be based.

Method 1000 may include a step S225 of determining a beam spot boundary. Step S225 may include determining boundaries for individual beam spots and determining grouping for sensing elements to be associated with individual beam spots.

Method 1000 may include a step S230 of scanning a primary charged particle beam. Step S230 may include performing a trace. Step 230 may include causing a primary charged particle beam to undergo a line scan action on a sample surface. Step S230 may include causing the primary charged particle beam to move along first trace segment T1 (see FIG. 3). The line scan action may be in a first direction at a first speed.

Method 1000 may include a step S240 of acquiring secondary beam intensity. Step S240 may include determining intensity of a secondary beam spot incident on the detector. Step S240 may include reading out outputs of sensing elements associated with the beam spot. Output of sensing elements may include electrical signals, such as current. Step S240 may include adding together current output from sensing elements that are grouped together and associated with a particular beam spot. Determination of beam intensity may occur during line scanning of step S230.

Method 1000 may include a step S245 of determining to proceed to a next scan line. Step S245 may be used to determine whether or not imaging of a region is finished. Determining that imaging of the region is finished may include determining that all of line scans needed to cover the region have been completed. If there are no further lines to scan, method 1000 may end. If there are further lines to scan, method 1000 may proceed to a step S250 of retracing.

Step S250 may include causing the primary charged particle beam to undergo a return action. Step S250 may include causing the primary charged particle beam to move along second trace segment T2 (see FIG. 3). After the preceding line scan in the first direction is finished, the primary beam may move in a second direction at a second speed in preparation to start another line scan. The second direction may be opposite to the first direction. The return action may move the primary beam back to a location near where the preceding line scan started. In some embodiments, step S250 may include at least a period of blanking the primary beam.

Method 1000 may include a step S255 of acquiring a detection image. Step S255 may include acquiring at least a partial frame of a detector surface. Step S255 may include monitoring only sensing elements that are included in a region of interest. For example, step S255 may include monitoring only region 816 of FIG. 8B. Step S255 may include performing secondary beam spot projection pattern acquisition. In some embodiments, secondary beam spot projection pattern acquisition may occur for only a portion of a retrace period.

Method 1000 may include a step S260 of determining a beam spot boundary. Step S260 may include determine whether a change to a previously determined boundary has occurred. The previously determined boundary may be that determined in step S255. It may be determined, for example, that a beam spot has intruded into region 816, and thus boundary 815 should be moved to include further sensing elements (see FIG. 8B). In some embodiments, it may be determined that a sensing element included within a boundary is no longer receiving electrons, and thus boundary 815 should be moved to exclude such sensing elements.

Method 1000 may include a step S265 of determining a parameter of a secondary beam spot. Parameters may be used to adjust a beam spot tracking process. It may be determined to modify a region of interest that may be used for acquiring a detection image as in step S255. Step S265 may include a target acquiring process that may be used to narrow down on regions of interest to monitor for beam spot changes. Target acquiring may include determining a parameter such as: (i) moving direction of a beam spot, (ii) moving speed of a beam spot, (iii) acceleration direction of a beam spot, (iv) acceleration amount, (v) moving direction of each point on the boundary of a beam spot, (vi) moving speed of each point on the boundary of a beam spot, (vii) acceleration direction of each point on the boundary of a beam spot, and (viii) acceleration amount of each point on the boundary of a beam spot.

Following step S265, method 1000 may return to step S230 of scanning a primary beam. Method 1000 may proceed in cycles of performing scanning and performing retracing. Beam spot tracking may occur during retrace periods.

Beam spot tracking may be used to update groupings of sensing elements used in detection processes, such as beam intensity determination. Beam spot tracking may be used to update boundaries of beam spots and update groupings of sensing elements associated with beam spots in real time as charged particle beam imaging is occurring. Retraces may occur between line scans, and beam tracking may be performed using time periods associated with retraces. Time that is ordinarily wasted may be used to acquire information about secondary beam spot projection patterns. By the time a new line scan begins, updated information about secondary beam spot projection patterns may be used to modify groupings of sensing elements used for beam intensity determination. Collection efficiency of charged particles associated with individual beam spots may be enhanced. Cross-talk between beams may also be reduced using real-time beam spot projection pattern tracking. Improvement may be achieved in SEM imaging such as signal-to-noise ratio (SNR) and overall throughput. Beam tracking may be especially effective in applications where low probe current is used.

By properly controlling secondary electron beam projection pattern tracking processes and blanking combined with acquiring information of beam intensity of the primary beams, charging of the sample may be manipulated. Beam tracking may be useful in applications such as voltage contrast inspection.

Furthermore, in some embodiments, there may be provided systems and methods to operate a detection system based on a two-dimensional (2D) pixelated detector of an apparatus with plural charged-particle beams. Systems and methods may involve stabilization of secondary electron detection and minimization of the beamlets' cross-talk for the apparatus and mapping variation of surface potential. An operation mode may be utilized in multi-beam Scanning Electron Microscopes (SEMs), for example. Examples of such an apparatus with plural charged-particle beams may be found in U.S. Pat. No. 9,691,588. Examples of a secondary electron projection-imaging system may be found in U.S. Pat. No. 10,141,160 and U.S. Provisional App. No. 63/081,715. Some embodiments may help to enhance the detection of a plurality of secondary electron beamlets with improved collection efficiency and with reduced cross-talk.

In some embodiments, there may be provided an operation mode of a 2D pixelated detector, where the detection of secondary electron beamlets is implemented using: (i) detector cells tracking positions of beam spots on the detector and (ii) electronic apertures enclosing the beam spots on the detector. Properties of electronic apertures, such as shapes, sizes, and positions, may be updated dynamically. Some embodiments may help to minimize variations in collection efficiency and cross-talk arising from variation of secondary electron beam spots on the detector while scanning. The shifts and variations of beam spots on the detector may be caused by effects such as scanning on charged surface regions, voltage contrast defects, imperfect operation of the anti-scanning system, or any other reason.

For systems having dispersive elements in the secondary electron column, some embodiments may utilize the shifts of beam spots on the 2D detector induced by the variation of the kinetic energy of secondary electrons for measuring and mapping the surface-potential variation on the sample surface.

Embodiments herein may relate to a charged-particle apparatus that may have a plurality of charged-particle beams. More particularly, some embodiments may relate to an apparatus that employs plural charged-particle beams (beamlets) to simultaneously acquire the images of plural scanned regions of an observed area on a sample surface. Such an apparatus may be used to inspect or review defects on wafers or masks with high resolution and high throughput, and may be useful in the semiconductor manufacturing industry.

In a microchip's fabrication process, individual semiconductor components and microcircuits may be formed on a piece of silicon or other material referred to as a wafer (or a wafer substrate). The microcircuits formed within one chip are also referred to as integrated circuits (ICs). Fabrication of ICs is a complex process often involving hundreds of steps. Even a minor deviation of the formed structures from a design pattern at one of the fabrication steps can result in a non-functioning IC once the fabrication process is completed. Some defects can make the chip completely useless. Since the microchip's fabrication is time-consuming and expensive, the manufacturing process must be established, finely tuned, and continuously monitored to maximize the fabrication yield, minimizing the quantity of non-functioning chips.

The components of chip circuit structures may be inspected at various stages of their formation to maximize the yield of functional chips. A goal may be to ensure that they are free of defects and fabricated according to design patterns. For the inspections, one may apply a charged-particle beam systems that utilize a particle beam to scan an inspected surface area and reconstruct surface details by collecting the secondary particles generated at the surface.

In particular, inspection tools based on SEM principles may be employed for defect inspection and the characterization of micro-circuits structures. Typically, SEM uses an electron beam to scan surface structures that may be hard to characterize using other technologies (e.g., optical inspection tools) due to the limitations of resolution or the lack of sensitivity to certain kinds of defects. SEM images may allow determining if the semiconductor components and the micro-circuits have been formed correctly and at proper locations. If flaws are detected, then the problem's root cause can be investigated, and the process can be fine-tuned to minimize the probability of defects reoccurring.

A significant advantage of the SEM wafer inspection tools versus tools utilizing competing technologies (e.g., optical inspection tools) is the sensitivity of SEM measurements to an accumulation of electrons in the sample surface's vicinity. SEM signal intensity may be proportional to an electron density inside the sample surface (via variation of the electrons' scattering cross-section leading to the electron-yield variation). It may also be sensitive to the charge accumulation outside the sample (surface charging) since the charge localized in the vicinity of the surface affects the near-surface electric fields, affecting the electron yield and the kinetic energies of the electrons leaving the sample surface.

In a single beam SEM, the surface image is created by scanning an inspected area with a focused primary-electron beam line-by-line. When the primary-electron beam hits the surface, a spot emitting secondary and back-scattering electrons is formed. It may be referred to as a probe spot. Both secondary and back-scattering electrons may be referred to as secondary electrons. The surface image is reconstructed by collecting the secondary electrons emitted from the probe-spot on the surface and plotting the secondary electron intensity versus the probe spot's position.

Creating the surface's high-resolution image line-by-line can be a slow process (even if the SEM scanning rate is high). As a result, wafer inspection may be very time-consuming. Multi-beam SEM systems may improve the measurement speed and achieve the higher throughput for wafer inspection applications. In a multi-beam SEM, an array of primary electron beams (e.g., beamlets) is formed to scan a plurality of the sub-regions within an inspected area simultaneously. The array of the probe spots is formed from the points where the primary beams hit the sample surface. Multiple secondary electron beamlets originating from the probe spots are formed and directed to the detector via the secondary electron column. The multi-beam SEM detector may include an array of electron-detector elements (e.g., sensing elements). There may be provided an array of individual sensors or a two-dimensional (2D) pixelated detector, for example. In some embodiments, a detector cell may be formed using a groups of pixels that may be made up of individual sensing elements. The secondary column of the SEM may be configured so that each detector cell detects the intensity of a secondary electron beamlet associated with one of the probe spots, scanning the corresponding sub-region of an inspected area.

The sensitivity of SEM measurements to the charge accumulated in the vicinity of the sample/vacuum interface may be a great advantage of inspection tools utilizing SEM principles. However, performing the measurements on charging surfaces can be a challenging task.

Charge accumulated in the surface vicinity may affect electron yield and energies of electrons emitted from the sample surface. Such charge may also affect the local electric fields tailored to collect the secondary electrons emitted from probe spots and that form secondary electron beamlets. The variation of the electron yield by the charge localized at the sample surface may create voltage contrast on the SEM images that may be utilized for defect inspection. But the variation of the kinetic energy of secondary electrons and the variation of the near-surface electric fields may lead to defocusing of the secondary electron spots on the detector and deviation of the spots from original positions within the detector array. Therefore, for the multi-beam SEM, measurements on highly charging surfaces (e.g., in regions-of-interest) or mapping voltage contrast defects may be challenging.

Effects such as surface charging may change the kinetic energy of secondary electrons emitted from the sample surface. Accordingly, the secondary-column electron-optical elements (e.g., electron lenses, deflectors, dispersing elements, or any component for influencing beams) will affect the secondary electron beams differently. In multi-beam SEM systems, surface charging may lead to defocusing of the secondary electron spots on detector cells and may shift the spots with respect to the detector cells (especially if the system design includes dispersing elements in the secondary-column). Surface charging may lead to a wide variation of collection efficiency of individual beamlets and cross-talk while scanning and may alter the images obtained with multi-beam SEMs. Certain features on the multi-beam SEM images obtained on charging surfaces (or charged surface elements) may have different image intensity than the same features on the corresponding images obtained with conventional single beam SEMs. The images may be fully or partially inverted, have distinct contrast, have their image intensity for the charged areas or elements changed from bright to dark, and vice-versa, making image interpretation difficult.

Multi-beam SEM measurements on structures having elements formed of low-conducting materials and creating charging surfaces (e.g., insulating oxides and nitrides), as well as voltage contrast measurements used for the detection of defects in micro-circuits formed on semiconducting wafers may be the topic of great interest in the semiconductor industry.

To enhance the performance of surface mapping and defect inspection using multi-beam SEMs in the presence of surface charging, it would be beneficial to minimize collection efficiency variation of the secondary electron beamlets and cross-talk variation.

In a multi-beam SEM, the electrons emitted from a sample surface after passing the secondary electron column may impinge on the detector. For example, as shown in FIG. 2A, beam spots 270, 272, 274 may be formed on wafer 230 and secondary electron beamlets 236, 238, and 240 may be emitted from the surface of wafer 230. Secondary-electron optical system 242 may project secondary electron beamlets 236, 238, and 240 onto electron detection device 244. Electron detection device 244 may comprise an array of individual detector elements (e.g., single sensing elements) or may be implemented using a large-area two-dimensional (2D) pixelated detector for detecting a plurality of secondary electron beamlets. For example, as shown in FIG. 4A, there may be provided a detector with surface 344 making up its detection area. In some embodiments, for a pixelated detector, the detector elements for individual beamlets may be implemented by grouping pixels into detector cells. As shown in FIG. 8A, there may be first region 810, second region 820, third region 830, and fourth region 840 formed on surface 344 of the detector. Each of regions 810, 820, 830, and 840 may include or make up a detector cell.

Parameters such as size, shape, and spacing of individual detector cells may be adjusted, for example as discussed in U.S. Provisional App. No. 63/081,715. A detector cell of a larger size may include more pixels (e.g., more sensing elements). Parameters may be adjusted so as to optimize a system's detection performance. For example, choosing a larger size of each detector cell may allow a larger collection efficiency to be achieved. But it may also lead to greater cross-talk because the cells may collect more electrons from neighboring beamlets. Oppositely, if a beam spot is not fully enclosed by a detector cell, a certain part of the electron beamlet may be lost, and the collection efficiency will be low. In some embodiments, for achieving high collection efficiency and minimum cross-talk of secondary electron beamlets, the sizes, shapes, and positions of the detector cells (or single sensors) may be configured so as to closely reproduce (e.g., match) the beam spots.

In some embodiments, a useful parameter for a secondary electron column's detection performance may be the stability of the secondary electron beamlets with respect to the individual detector cells. In some embodiments, detector cells of 2D pixelated detectors may be fixed during scanning. Each detector cell has a one-to-one correspondence to one of the probe spots. A cell's size, shape, and position may be chosen to maximize the beam spot's collection efficiency and minimize the cross-talk with the other beamlets. Without scanning, the spots' positions should be stable with respect to the detector and the corresponding detector cells. During scanning, an anti-scanning system may be configured to compensate for an offset of the secondary electron beamlets with respect to their nominal (e.g., static) positions on the detector. However, due to various limitations, e.g., the charge accumulated at the scanned surface or imperfect operation of the anti-scanning system, the secondary electron spots may not be entirely stable on the detector on a frame-to-frame basis.

A secondary electron beam spot may shift with respect to its corresponding detector cell (or the spot changes size or shape), partially going beyond the cell's boundary. In such a case, collection efficiency (CE) may be affected. In some embodiments of the disclosure, a detector cell of a 2D pixelated detector may be dynamically redefined so as to track a beam spot. A reduction in collection efficiency caused by the spot's shift with respect to the cell may be avoided.

In some embodiments, a method is provided for stabilization of secondary electron collection performance via stabilization of relative positions of beam spots and detector cells on a pixelated two-dimensional detector.

In an embodiment, the method comprises adjusting positions of detector cells on a frame-by-frame basis (e.g., time scale) so as to track positions of beam spots of secondary beamlets on the detector. A system may be configured so that full-frame images formed on the detector are read at SEM scanning rate. Images may be analyzed using image processing algorithms to determine secondary electron beam spot positions (in some embodiments, in real time using, e.g., parallel computing algorithms, or with a time delay). Detector cells may be allocated around beam spots for measuring individual beamlet signals. Detector cells may be customized, e.g., having a square, rectangular, circular, elliptical or any arbitrary shape.

Figure 11:
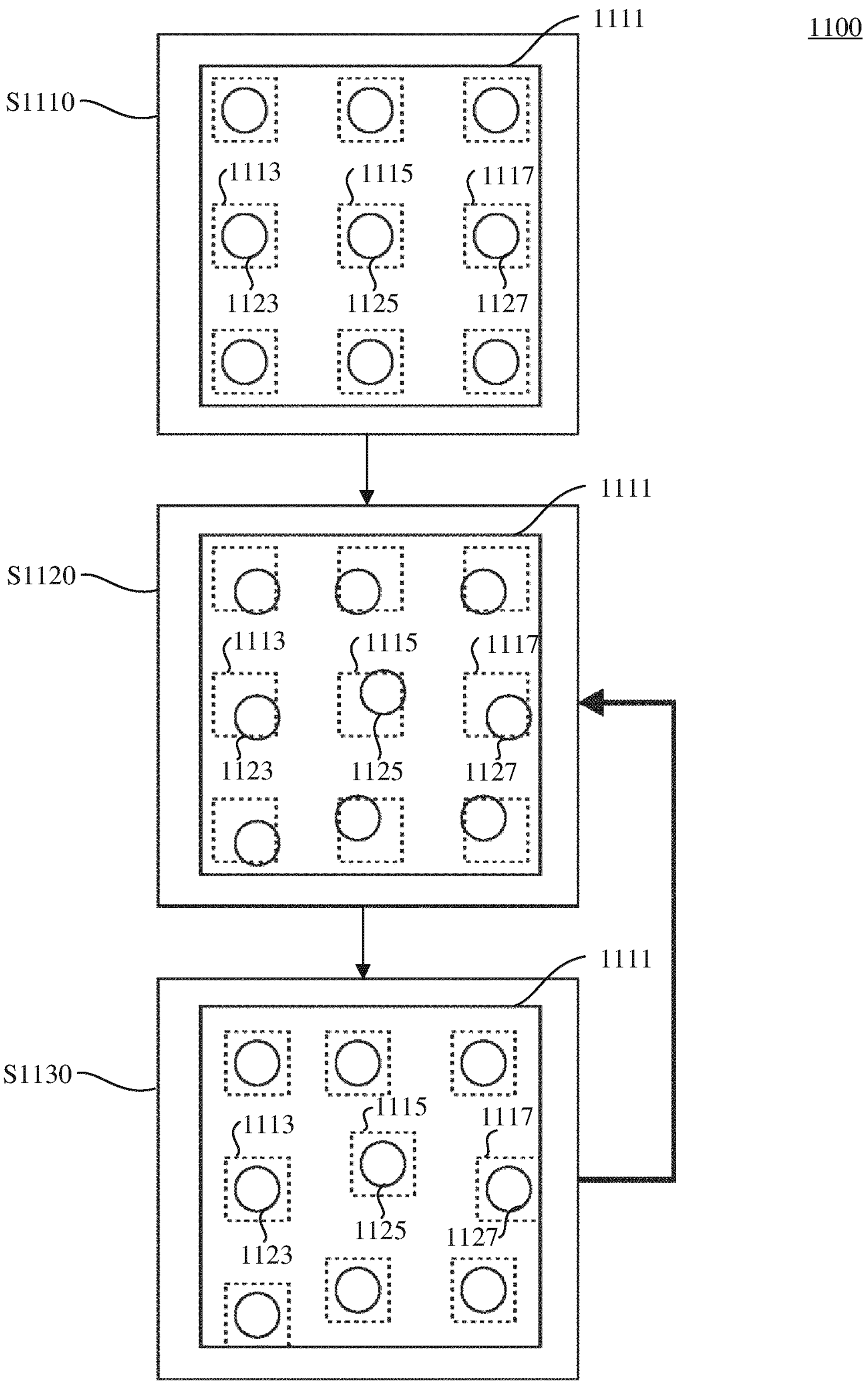
FIG. 11 is a diagrammatic representation of an algorithm underlying a method for beam spot tracking, consistent with embodiments of the disclosure.

Reference is now made to FIG. 11, which is a diagrammatic representation of an algorithm underlying a method 1100 for beam spot tracking, consistent with embodiments of the disclosure. Method 1100 may include a first step S1110, a second step S1120, and a third step S1130. Step S1110 may include determining nominal parameters for detector cells. Step S1110 may include performing full frame imaging of a detector. As shown in FIG. 11, a detector 1111 may be provided, and detector 1111 may be a 2D pixelated detector having a plurality of detector cells including a cell 1113, a cell 1115, and a cell 1117. Parameters of cells 1113, 1115, and 1117, such as position, shape, and size may be predetermined. In some embodiments, parameters of cells 1113, 1115, and 1117 may be determined based on results of imaging a surface of detector 1111. Step S1110 may include performing secondary beam spot projection pattern acquisition. Step S1110 may include determining parameters, such as size, shape, and position, of beam spots on detector 1111. It may be determined, for example, that beam spots 1123, 1125, and 1127 are at their nominal positions. Nominal positions of beam spots may correspond to undeflected positions of probe spots in the center of a field-of-view. Nominal parameters of cells 1113, 1115, and 1117 may be determined as parameters that correspond to nominal positions of beam spots.

As shown in FIG. 11, detector 1111 may be configured to have a plurality of detector cells including detector cells 1113, 1115, and 1117. Detector cells may be used for collecting the signal of particular probe spots on the sample. Detector cells may be used for determining collection efficiency and cross-talk. Detector cells may be configured so that output signals of all sensing elements in a particular detector cell are integrated and used for forming a detection signal to associate with a beam spot. In the state shown in step S1110, beam spots 1123, 1125, and 1127 and detector cells 1113, 1115, and 1117 may be arranged according to their nominal positions in an N×N detector array.

Step S1120 may include acquiring a secondary beam spot projection pattern at a time subsequent to step S1110. Step S1120 may include determining a change of the secondary beam spot projection pattern. For example, step S1120 may include determining a shift of a beam spot. Shifts of multiple beam spots of the secondary beam spot projection pattern may be determined. The change may be based on an effect, such as surface charging. In some embodiments, the change may include changes in other parameters of beam spots, such as changes in size, shape, and orientation. The secondary beam spot projection pattern may be determined using a group of sensing elements included in one or more detector cells. Step S1120 may include acquiring an image of beam spots from detector 1111 for a new sample position of the beam spots. As shown in FIG. 11, in step S1120, a new full-frame detector image may be recorded that reveals that beam spots have shifted with respect to previous positions due to, for example, an effect such as surface charging. If the shifted beam spots do not coincide well with respective detector cells, then electron collection efficiency of the individual beamlets may be reduced and cross-talk with the other beamlets may be increased.

Step S1130 may include performing compensation of the change determined in step S1120. Step S130 may be configured to eliminate or mitigate effects of, for example, reduction of collection efficiency and increase of cross-talk due to shifts of the spots. Step S1130 may include identifying new positions of beam spots using image analysis and shifting positions of detector cells accordingly. Step S130 may include adjusting positions of detector cells to be centered around new positions of the beam spots. Step S1130 may be performed on a frame-by-frame basis. In some embodiments, positions of detector cells in step S1130 may be used as an initial state for detector cells used in the analysis of a next acquired image or the same undeflected positions of detector cells may be used as initial positions of the cells. Step S1130 may include adjusting parameters of detector cells, such as position, size, and shape. Detector cells may include a plurality of sensing elements of a detector, and the sensing elements may be arranged into groups and associated with a particular detector cell. Sensing elements associated with a detector cell may be used to integrate output signal to determine intensity of a beam spot projected on the detector cell. Adjusting positions of detector cells may include determining which sensing elements are associated with particular detector cells. For example, some sensing elements may be added or removed from a group of sensing elements associated with a detector cell to cause the detector cell to move to a new position on the detector.

Method 1100 may be iteratively performed. After step S1130, the method may return to step S1120 and may continue processing. Secondary beam spot projection patterns may be continuously acquired, and shifting or other changes of beam spots may be accommodated by adjusting detector cells.

In some embodiments, a method may be adopted for implementation using a detector that provides partial frame images. The method may be applied to detectors that may be unable to provide full-frame images at the target scanning rate. In some embodiments, a detector's specifications may be limited so that only sub-frames (e.g., sub-regions of the full detector frame) are read from the detector at the target scanning rate. With such a detector, it may be desirable to configure individual detector elements to be larger than the cells used to collect signals of the individual secondary electron beamlets and large enough that shift of beam spots on a frame-to-frame basis does not cause beam spots to move outside of the sub-frames. If size of the sub-frames is large enough to satisfy these conditions then one sub-frame may serve as one detector element used to record beamlet signal for further analysis. For this case, stabilization of secondary electron collection performance may be implemented in a similar way as that for the case when full detector images are obtained from the detector.

Figure 12:
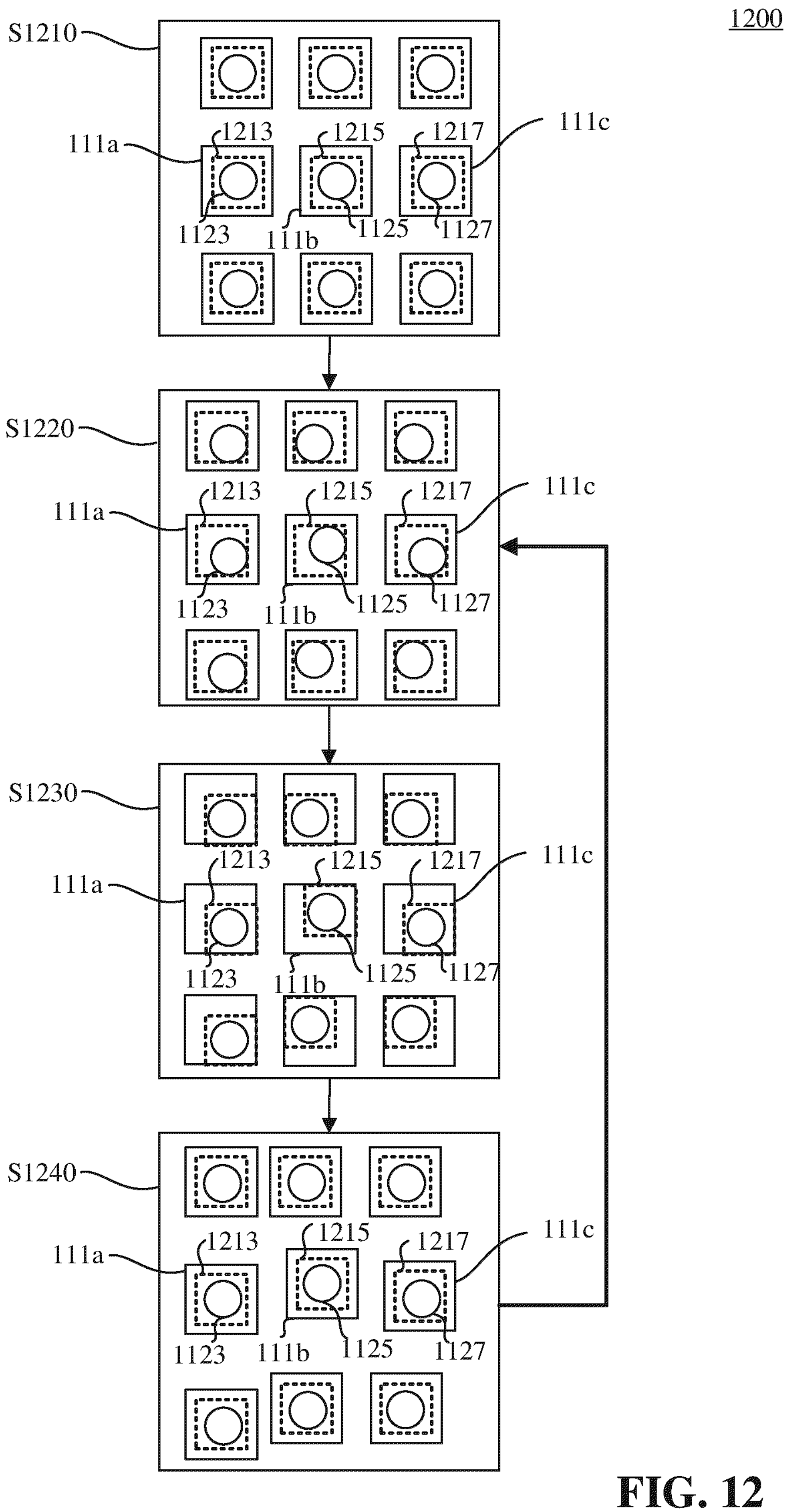
FIG. 12 is a diagrammatic representation of an algorithm underlying a method 1200 for beam spot tracking, consistent with embodiments of the disclosure.

Reference is now made to FIG. 12, which is a diagrammatic representation of an algorithm underlying a method 1200 for beam spot tracking, consistent with embodiments of the disclosure. Method 1200 may include a first step S1210, a second step S1220, a third step S1230, and a fourth step S1240. Step S1210 may include determining nominal parameters for detection cells. Step S1210 may include performing partial frame imaging of a detector. As shown in FIG. 12, there may be provided a plurality of detector elements, including detector element 111*a*, detector element 111*b*, and detector element 111*c*. Detector elements 111*a*, 111*b*, and 111*c* may be separate, independent detectors. In some embodiments, detector elements 111*a*, 111*b*, and 111*c* may be different regions of a configurable larger detector. In some embodiments, detector elements 111*a*, 111*b*, and 111*c* may represent sub-frames of a detector that are able to be read from the detector on a frame-by-frame basis at a target scanning rate.

As shown in FIG. 12, in step S1210, beam spots 1123, 1125, and 1127 may be in nominal positions along with detector elements 111*a*, 111*b*, and 111*c* and detector cells 1213, 1215, and 1217. As shown in step S1220, at a new scanning step, beam spots on the detector may be shifted due to, e.g., different charging of sample surface regions, and beam spots 1123, 1125, and 1127 may not be aligned with detector cells 1213, 1215, and 1217 or with detector elements 111*a*, 111*b*, and 111*c*. Step S1220 may include performing secondary beam spot projection pattern acquisition. Step S1220 may include obtaining spot images for each detector element and storing them in memory.

Step S1230 may include determining a change of a beam spot projection pattern. Step S1230 may include analyzing images of beam spots within individual detector elements and determining positions of beam spots. Based on analysis results, positions of detector cells 1213, 1215, and 1217 may be adjusted so as to follow beam spots 1123, 1125, and 1127. Detector cells with adjusted positions may be used to integrate signals for individual beamlets.

Method 1200 may include step S1240. Step S1240 may include adjusting positions of detector elements 111*a*, 111*b*, and 111*c* so as to following positions of detector cells. For example, detector element 111*a* may be moved so as to be centered around detector cell 1213. In some embodiments, if deviations beam spots from nominal positions are small enough that beam spots remain within respective detector elements located at nominal positions, or if beam spots shifts are random on a frame-by-frame basis, then positions of detector elements 111*a*, 111*b*, and 111*c* may be fixed during scanning. In some embodiments, detector elements 111*a*, 111*b*, and 111*c* may represent sub-frames, and the sub-frames may be adjusted based on the determined change in the beam spot projection pattern. Adjustments of sub-frames may be similar to that of detector elements, and, for example, adjusting positions of sub-frames may include determining which sensing elements of the detector are associated with particular sub-frames. A group of sensing elements associated with a sub-frame may be larger and may encompass a group of sensing elements associated with a detector cell.

Method 1200 may be iteratively performed. After step S1240, the method may return to step S1220 and may continue processing. Secondary beam spot projection patterns may be continuously acquired, and shifting or other changes of beam spots may be accommodated by adjusting detector cells and detector elements. In some embodiments, step S1240 may be omitted and method 1200 may cycle by returning to step S1220 after step S1230.

In some embodiments, a method may be adopted for instances where sub-frames of individual detector elements are used to process information for beam spot tracking. Sub-frames may be used due to technical limitations of a detector or any other reason. In some embodiments, only sub-frames with sizes smaller than that required to realize detector elements based on an individual sub-frame, may be read fast enough to support a target scanning rate. In such cases, individual detector cells of a necessary size may be realized by utilizing groups of sub-frames.

Figure 13:
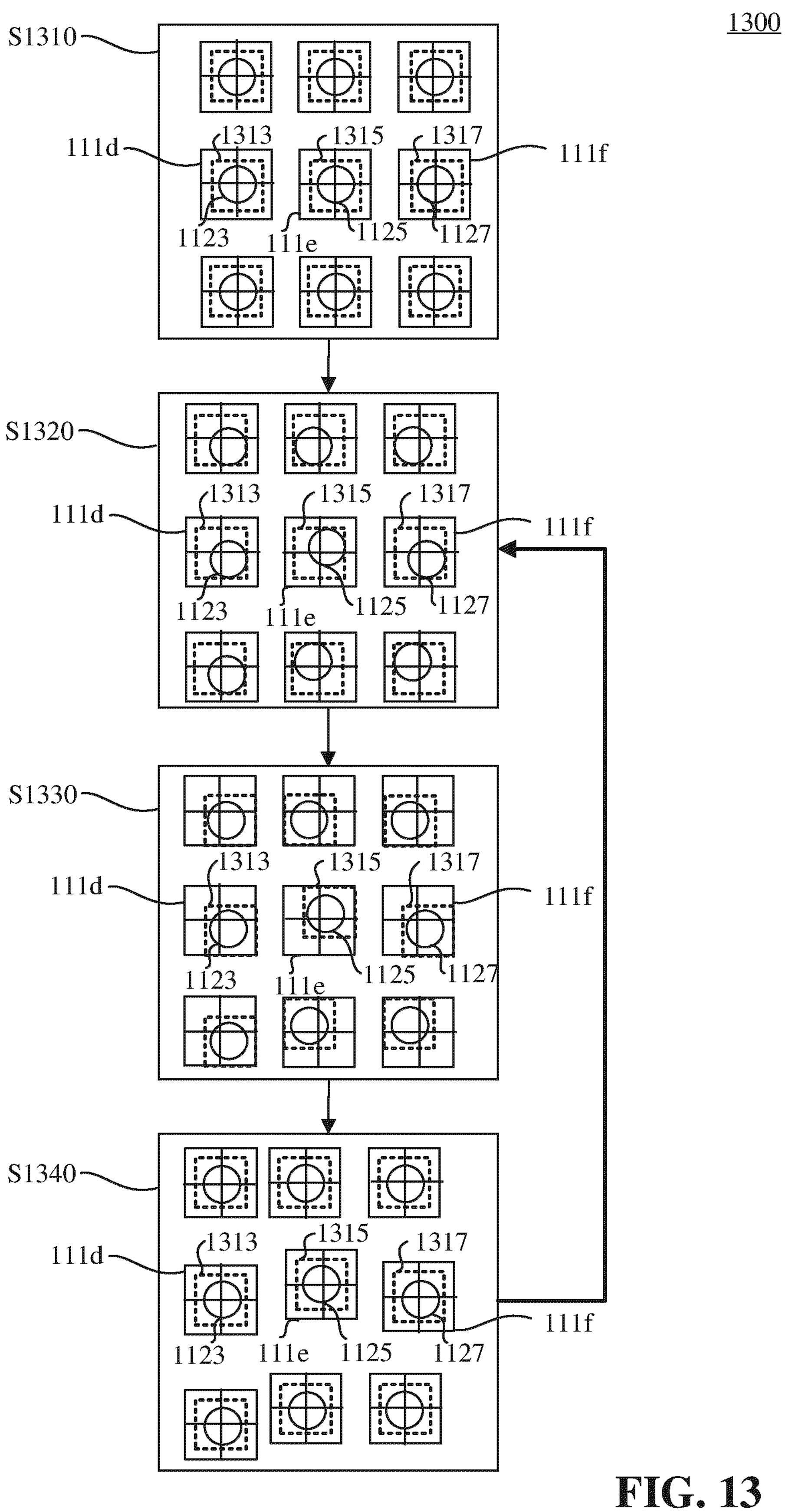
FIG. 13 is a diagrammatic representation of an algorithm underlying a method 1300 for beam spot tracking, consistent with embodiments of the disclosure.

Reference is now made to FIG. 13, which is a diagrammatic representation of an algorithm underlying a method 1300 for beam spot tracking, consistent with embodiments of the disclosure. Method 1300 may include a first step S1310, a second step S1320, a third step S1330, and a fourth step S1340. Step S1310 may include determining nominal parameters for detection cells. As shown in FIG. 13, there may be provided a plurality of detector elements, including detector element 111*d*, detector element 111*e*, and detector element 111*f*. Each detector element may be implemented as a groups of sub-frames. The number of sub-frames may be four, or any other number. The group of sub-frames may provide sufficient area for a respective detector element to implement a detector cell large enough to integrate beamlet signals for a spot incident on the detector cell and to adjust the position of the detector cell if beam spots move with respect to detector elements. As shown in FIG. 13, at step S1310, beam spots 1123, 1125, and 1127 may be at nominal positions, along with detector cells 1313, 1315, and 1317. Each of detector elements 111*d*, 111*e*, and 111*f* may be realized using groups of four sub-frames. Each sub-frame may have its own dedicated processor. For example, detector element 111*e* may be divided into four sub-frames, and each of the sub-frames may be associated with a processor used to analyze signals collected in its sub-frame. The processors may be configured to operate in parallel.

As shown in FIG. 13, step S1320 may include obtaining beam spot images within individual detector elements for a new scanning step. Beam spots may be shifted with respect to detector elements, e.g., due to surface charging or some other effect. Step S1330 may include analyzing beam spot images and adjusting positions of detector cells so that detector cells follow new positions of beam spots. Detector cells located at the new positions may be used to integrate the beamlets signals and to determine CE and CT. Step S1340 may include adjusting positions of detector elements according to the positions of detector cells. If, for example, beam spot shifts during scanning from their nominal positions are small enough that beam spots remain within detector elements located at the nominal positions, then positions of detector elements may be fixed during scanning. Positions of detector elements may also be fixed if shifting detector elements based on current spot positions is not useful for predicting new spots positions (e.g., if beam spots shifts are random on a frame-by-frame basis).

In some embodiments, analysis of beam spot images may be performed in real-time on a frame-by-frame basis. In such cases, stabilization of secondary electron detection in multi-beam SEMs based on detector cells that follow positions of beam spots may be implemented for routine wafer-inspection measurements (e.g., as a general operation method). If computational resources do not allow for performing image analysis in real-time, then image frames (or sub-frames) may be stored in memory and analyzed with a time delay. In some embodiments, parallel computation may be used and image analysis may be realized with only a minor time delay, if any. In this case, the suggested operation method can be implemented as a separate scanning mode providing the better-quality images to better understand the contrast observed in SEM images compared to a standard operation with fixed detector cells.

In some embodiments, parameters of detector cell may be adjusted. For example, size of detector cells may be increased. Increasing a detector cell's size may prevent a beam spot from leaving the detector cell, stabilizing collection efficiency. However, increasing size may increase cross-talk. In some embodiments, a trade off relationship between collection efficiency and cross-talk may be established for a parameter (e.g., detector cell size), and the parameter may be optimized.

In some embodiments, detector cells may be chosen to be larger than beam spots that are formed on the detector, and only a part of each detector cell may be exposed to the beam spot. Only a part of the detector cell may detect the corresponding secondary electron beamlet's electrons and will contribute to the beamlet signal's detection. A detector cell's area generating signal proportional to beamlet intensity may be referred to as an effective detection area. The effective detection area may be determined as the overlap between the beam spot and the detector cell area.

Physical apertures placed along a secondary electron beamlet's path may limit the effective detection area, partially blocking the secondary electron beamlets' tails and reducing cross-talk. However, if the secondary electron beamlets shift with respect to the apertures, collection efficiency may be reduced.

Some embodiments may employ a virtual aperture. The virtual aperture may include an electronic aperture. By analogy with physical apertures, virtual apertures may be used to control the effective detection areas of detector cells on 2D-pixelated detector cells. Apertures may be implemented electronically and may enclose beam spots on detector cells. Apertures may be configured to maximize an individual beamlets' secondary electron collection efficiency and minimize cross-talk. Parameters of apertures, such as shapes, sizes, and positions, may be updated dynamically with any frequency (e.g., from a static state up to a frame-by-frame rate). Apertures may be configured to reduce the variation of collection efficiency and cross-talk of individual secondary electron beamlets arising from the variation of beam spots on detector cells during scanning while the detector cells are fixed or updated with lower frequency. The variations of beam spots on the detector can be caused by, e.g., scanning on charged surface regions, voltage contrast defects, or any other reasons.

A virtual aperture on a 2D-detector cell may be implemented by selectively controlling signals from specific regions of a detector cell (e.g., individual pixels or pixel groups). Like physical apertures used along an electron beam's path, virtual aperture may be configured so as not to affect the signals of detector pixels within an inner area of the aperture (e.g., inside the aperture hole boundary). Apertures may be configured to zero out (or modify) the signal of detector pixels from outer regions of the aperture (e.g., outside of the aperture hole boundary). In some embodiments, virtual apertures may be realized electronically at the detector-hardware level. In some embodiments, the concept of electronic apertures and the underlying algorithms may also be implemented partially or in full utilizing digital image processing using computer computations.

Apertures may be implemented electronically (or virtually), and they may have the flexibility of changing parameters such as shape, size, and positions. These parameters may be set statically for current SEM imaging conditions or defined dynamically during scanning so as to maximize collection efficiency and minimize cross-talk. Adjusting a parameter of a detector cell may include adjusting an aperture on the detector cell. For example, adjusting a parameter of a detector cell based on a determined change of a beam spot projection pattern may include moving an aperture formed with respect to the detector cell to follow a particular beam spot of the beam spot projection pattern.

The signal of specific detector cells' pixels (e.g., individual sensing elements making up a detector) may be controlled by setting up a threshold intensity level for discriminating pixels representing the beamlet spot signal (e.g., high signal level) from the pixels representing background signal surrounding the spot (e.g., low-intensity level). The high-intensity pixels may be configured to hold their signal intensities, while the signals from the low-intensity pixels may be set to zero. Therefore, in some embodiments, only the high-intensity pixels will contribute to the integrated cell-intensity signal.

In some embodiments, contributions of pixels to the total measured beamlet signal may be controlled to modulate the pixels' sensitivity to secondary electrons (e.g., setting a high or low sensitivity of the pixels to the electrons).

Examples of algorithms underlying an electronic apertures' implementation on a 2D pixelated detector cells are illustrated as follows.

A large 2D pixelated detector area may be split into an array of detector cells. For example, as shown in FIG. 4, surface 344 of a detector may include a plurality of sensing elements. Within surface 344, one or more detector cells may be formed. For example, as shown in FIG. 8A, there may be formed first region 810, second region 820, third region 830, and fourth region 840. Each of regions 810, 820, 830, and 840 may correspond to a detector cell. Detector cells may be positioned at nominal positions of beam spots. Detector cells may be square, rectangular, parallelogram, elongated, or any other shape. Furthermore, an array of detector cells may be formed in a regular repeating grid, square grid, rectangular grid, offset pattern, rotated pattern, or any other arrangement.

Reference is now made to FIGS. 14A-14E, which illustrate examples of virtual apertures imposed on 2D pixelated detectors, consistent with embodiments of the disclosure.

In some embodiments, a method may involve virtual apertures that supplement a 2D pixelated detector having a plurality of detector cells. Apertures for each detector cell may be realized using thresholding of pixels of a detector cell before integrating beamlet signal intensity from all pixels of the detector cell. The threshold level for determining the aperture-hole boundary may be set at a certain level, e.g., 0.5 to 5% of a spot peaks' maxima or proportionally to the total intensity of the detector cell.

An aperture's boundary separating inner and outer regions of the aperture may be set using a threshold. The threshold may be set using a predetermined intensity level, such as 5% of a maximum value of beam spot intensity within a detector cell. Pixels having an intensity value less than the threshold may be filtered out, and pixels having an intensity value greater than or equal to the threshold may be used to contribute to beam spot intensity detection signal. For example, pixels within the detector cell having an intensity greater than or equal to the threshold may be held the same and may correspond to the aperture hole's inner area. Pixels within the detector cell having intensity less than the threshold may be set to zero and may correspond to the aperture's outer region. Beam spot intensity from the detector cell's whole area may be integrated. Pixels of the detector cell in the aperture's outer area may have zero value, and so beam spot intensity may be determined using only pixels in the aperture's inner area.

Figure 14A:
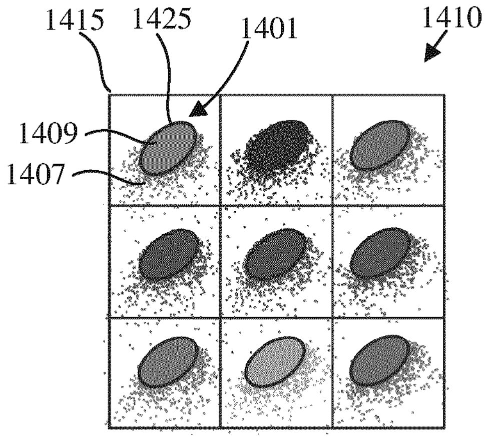
FIGS. 14A-14E illustrate examples of virtual apertures imposed on 2D pixelated detectors, consistent with embodiments of the disclosure.

FIG. 14A shows a detector 1410 with a plurality of secondary electron beam spots projected thereon. The beam spots may include, for example, beam spot 1401 that is formed in detector cell 1415. In the position shown in FIG. 14A, beam spots may be in nominal positions in an N×N detector array. Detector cell 1415 may be used to detect and integrate beamlet signal for a beam spot enclosed in detector cell 1415. There may be formed an aperture 1425 in detector cell 1415. Aperture 1425 may have an elongated shape that may substantially match beam spot 1401. The elongated shape of aperture 1425 may represent the boundary of a virtual aperture. An outer part 1407 of beam spot 1401 may be outside of aperture 1425 and an inner part 1409 of beam spot 1401 may be inside of aperture 1425.

Figure 14B:
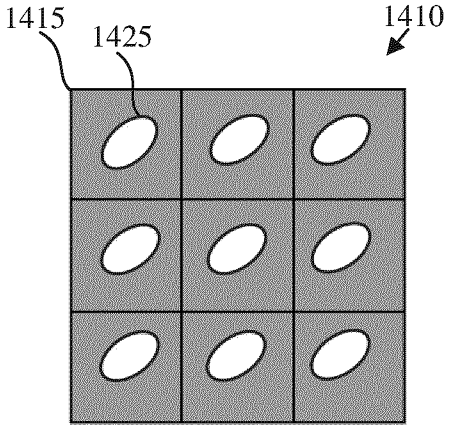

FIG. 14B shows virtual apertures corresponding to the beam spot projection pattern shown in FIG. 14A. As shown in FIG. 14B, aperture 1425 in detector cell 1415 may have an elongated shape that substantially corresponds to the shape of a beam spot. Parameters of apertures (e.g., shape, size, position) may be updated dynamically up to a frame-by-frame rate while keeping detector cells fixed. In some embodiments, Parameters of apertures may be updated with a different frequency.

A virtual aperture within a detector cell may be configured so as not to affect the signals of pixels signals within the boundary of the aperture. For example, pixels covered by inner part 1409 of beam spot 1401 may be unaffected. On the other hand, signals of pixels outside of the boundary of the aperture may be zeroed. For example, pixels that lie in outer part 1407 of beam spot 1401 (or pixels that are not covered by any beam spot) may have their signal zeroed. As shown in FIG. 14B, such regions may be shaded dark, indicating that their signal is not used for beam spot intensity detection.

Figure 14C:
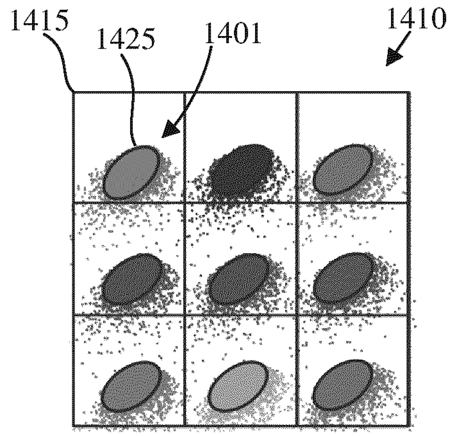
Figure 14D:
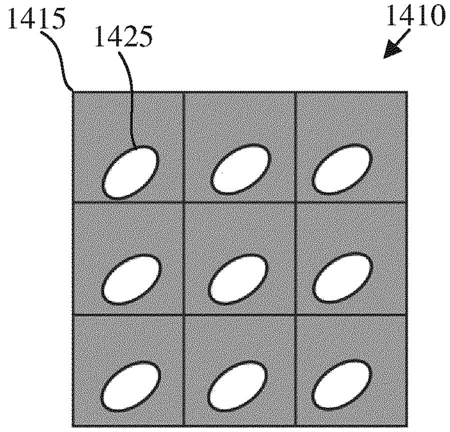

FIG. 14C shows a case where beam spots are shifted due to an effect such as surface charging. An algorithm may be configured to dynamically follow beam spots within detector cells. For example, as beam spot 1401 moves within detector cell 1415, an algorithm may determine individual pixels that have intensity levels above, below, or equal to a threshold and update parameters of aperture 1425 accordingly. Pixels having intensity above the threshold may be associated with an inner region of aperture 1425, and pixels having intensity below the threshold may be associated with an outer region of aperture 1425 and may have their value zeroed. Aperture 1425 may automatically move to follow beam spot 1401. FIG. 14D shows virtual apertures corresponding to the beam spot projection pattern shown in FIG. 14C.

Figure 14E:
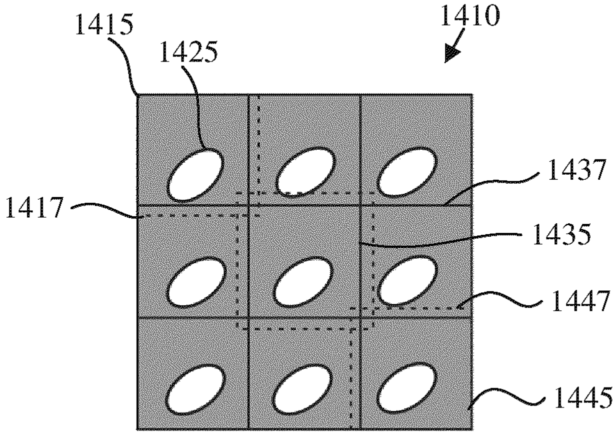

FIG. 14E shows a case where images of neighboring detector cells may be stitched together to allow for creation of virtual detector cells having sizes different from that of the original detector cells. For example, detector cell 1415 may be configured to be expanded to include a region bounded by expanded boundary 1417. Information captured from neighboring detector cells may be processed, and a virtual detector cell may be created that includes information from detector cell 1415 plus information from neighboring detector cells. Virtual detector cells may enable a wider range for compensating for beam spot shift than when detector cells are treated independently. For example, as a beam spot approaches the edge of a detector cell, it may be useful to use a neighboring detector cell's pixels to associate with that beam spot. As shown in FIG. 14E, aperture 1425 may approach the bottom edge of detector cell 1415. If the beam spot continues to shift downward, using virtual detector cells may allow aperture 1425 to continue to follow the beam spot even into a region bounded by expanded boundary 1417. Any of the detector cells in detector 1410 may apply virtual detector cells. For example, detector cell 1435 may be configured to use pixels of neighboring detector cells into a region bounded by expanded boundary 1437. Detector cell 1445 may be configured to use pixels of neighboring detector cells into a region bounded by boundary 1447.

Figure 15:
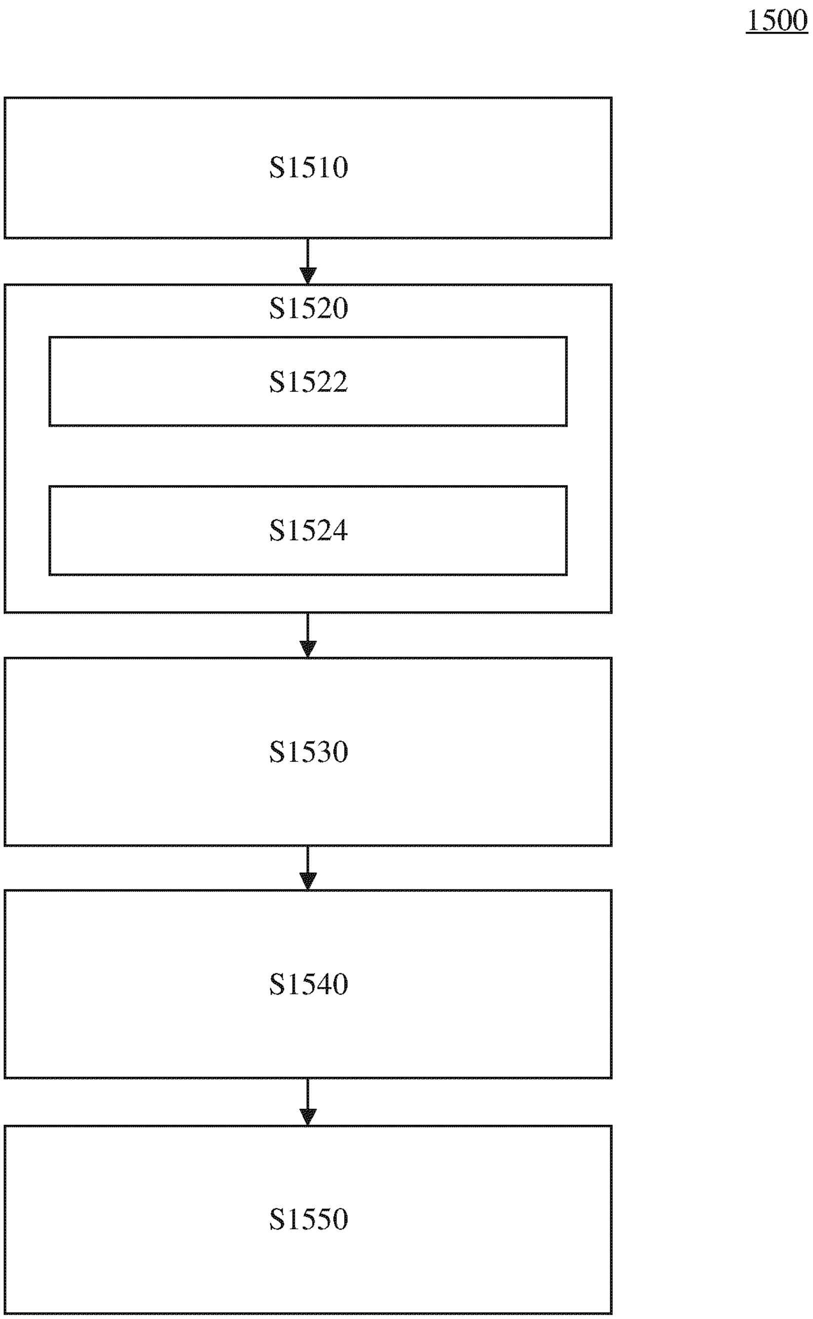
FIG. 15 is a block diagram illustrating a method 1500 for implementing virtual apertures, consistent with embodiments of the disclosure.

FIG. 15 is a block diagram illustrating a method 1500 for implementing virtual apertures, consistent with embodiments of the disclosure. Method 1500 may be implemented as an algorithm. A controller, such as controller 109 may be configured to perform method 1500. In some embodiments, circuitry for performing method 1500 may be provided in a component, such as detector 144 or electron detection device 244. Method 1500 may include step S1510 that may include acquiring a secondary beam spot projection pattern on a detector. Beam spot images may be acquired by detector cells that are exposed to secondary electron beamlets.

Method 1500 may include step S1520 of determining parameters of beam spots. Step S1520 may include step S1522 of determining a maximum of a beam spot's intensity. Step S1522 may include determining which pixel of a detector cell has the maximum intensity value and determining the intensity level. Step S1522 may be performed for each detector cell. Step S1522 may be performed using several pixels for each detector cell to increase accuracy and filter out possible single pixel spikes. Step S1520 may include step S1524 of determining total spot intensity for each beam spot. In some embodiments, step S1524 may be performed alternatively to step S1522. Other parameters may be determined, such as size of a beam spot, that may be used so that parameters of an aperture may be updated accordingly (e.g., increasing a radius of aperture 1425 in response to determining that beam spot 1401 has enlarged).

Method 1500 may include step S1530 of determining a parameter of an aperture. Step S1530 may include setting a threshold. A threshold value for each detector cell may be set proportionally to the corresponding maximum beam spot intensity value or the total intensity value determined in step S1520.

Method 1500 may include step S1540 of performing thresholding processing. Within each detector cell, pixels with an intensity above the threshold value are considered inside the electronic aperture hole and hold their values. Pixels with an intensity below the threshold are regarded as outside of the aperture hole and erased. In some embodiments, determinations may be made based on whether intensity is greater than or equal to the threshold, or, based on whether intensity is less than or equal to the threshold.

Method 1500 may include step S1550 of determining detection signal. Step S1550 may include obtaining individual beamlet intensity for each detector cell. Step S1550 may include integrating the signals from all pixels of a detector cell.

According to an algorithm consistent with method 1500, an individual detector cell's integrated secondary electron beam spot intensity may include only contributions of pixels with intensities larger than the threshold value. The detector cell's pixels with intensity values below the threshold may have no contribution to the integrated detector cell's spot signal.

Virtual apertures within detector cells may be set statically before scanning or may be set dynamically on a frame-by-frame basis while scanning. Boundaries of virtual apertures within the detector cells may naturally closely reproduce the spots' shapes, sizes, and positions of the secondary electron beam spots and limit the detector cells' effective detection areas.

According to an algorithm consistent with method 1500, a reduction of collection efficiency due to shifting of secondary electron beam spots with respect to detector cells may be avoided. Simultaneously, the effective detection areas of detector cells may remain small, enclosing only the main parts of the secondary electron spots, and cross-talk (CT) may be limited.

Figure 16:
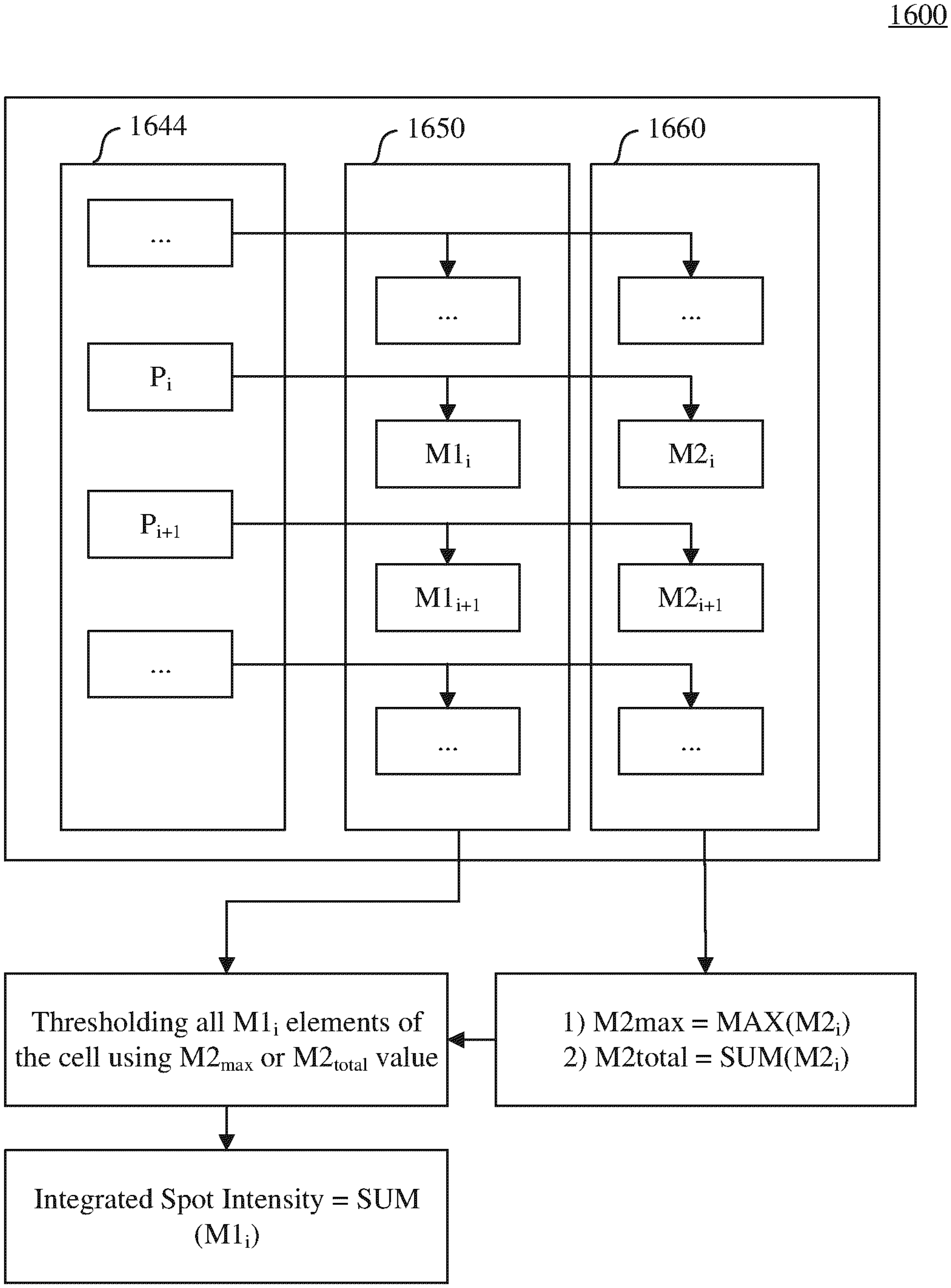
FIG. 16 is a diagrammatic representation of a signal processing scheme for implementing dynamic virtual apertures at the detector hardware level, consistent with embodiments of the disclosure.

FIG. 16 is a diagrammatic representation of a signal processing scheme for implementing dynamic virtual apertures at the detector hardware level, consistent with embodiments of the disclosure. As shown in FIG. 16, a detector device 1600 may be provided. Detector device 1600 may include a detector cell pixel array 1644, a first memory array 1650, and a second memory array 1660. Detector cell pixel array 1644 may be provided for each detector cell in detector device 1600.

Initially, a detector cell exposed to a secondary electron beam may obtain the beam spot's pixelated image. Intensity values of the pixels may be copied from detector cell pixel array 1644 into one or more memory cell arrays, such as first memory array 1650 or second memory array 1660. First and second memory arrays 1650, 1660 may be used for separate processing steps. Information from a memory array may be used to find the beam spot's maximum intensity or the total intensity of the detector cell. The threshold value may be defined proportionally to the corresponding maximum spot intensity or total intensity determined previously determined. In some embodiments, intensity values stored in cells of second memory array 1660 may be compared with the threshold value. Thresholding processing may be performed using first memory array 1650. Within a memory array representing the detector cell, the sensing elements (e.g., pixels) with an intensity above the threshold value may be considered inside the virtual aperture hole and hold their values. The sensing elements (e.g., pixels) with an intensity below the threshold may be regarded as outside of the aperture hole and erased. Each detector cell's individual beamlet intensity may be obtained by integrating the signals from all memory elements representing the whole detector cell's area.

In some embodiments, virtual apertures having predetermined parameters may be implemented for 2D-pixelated detector cells. A 2D-pixelated detector's area may be split into an array of detector cells. The detector cells may be positioned at nominal positions of secondary electron beam spots on the detector. An aperture mask may be set with specific boundary contour and size to define virtual apertures with predetermined parameters. Parameters of the virtual apertures may be determined so as to enclose particular regions of beam spots. For example, virtual apertures may aim to enclose regions of maximum intensity of the beam spots. Virtual apertures may be configured to be centered around positions of maximum intensity. Virtual apertures may have any shape, e.g., square, rectangle, circle, ellipse, or a shape reproducing the secondary electron beam spots. Parameters of the virtual apertures may be adjusted so as to follow variation of beam spots.

Figure 17A:
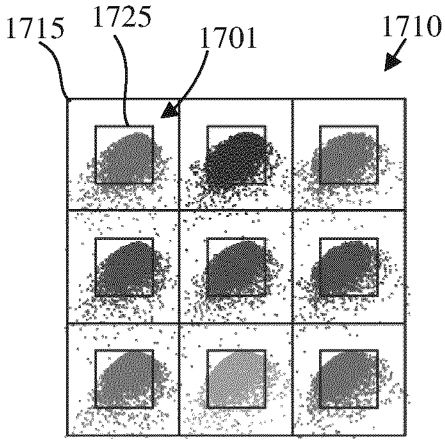
FIGS. 17A-17D illustrate examples of virtual apertures with a predetermined shape, consistent with embodiments of the disclosure.

Reference is now made to FIGS. 17A-17D, which illustrate examples of virtual apertures with a predetermined shape, consistent with embodiments of the disclosure. FIG. 17A shows a detector 1710 with a plurality of secondary electron beam spots projected thereon. The beam spots may include, for example, beam spot 1701 that is formed in detector cell 1715. In the position shown in FIG. 17A, beam spots may be in nominal positions in an N×N detector array. Detector cell 1715 may be used to detect and integrate beamlet signal for a beam spot enclosed in detector cell 1715. There may be formed an aperture 1725 in detector cell 1715. Aperture 1725 may have a square shape that may enclose a centroid of beam spot 1701.

Figure 17B:
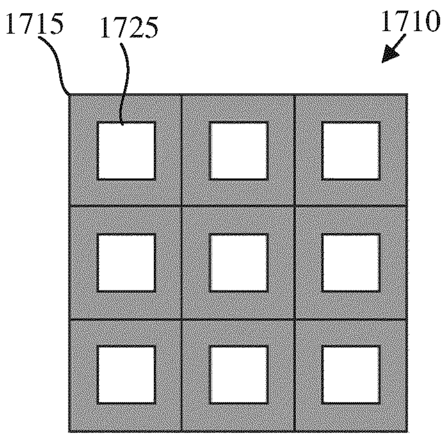

FIG. 17B shows virtual apertures corresponding to the beam spot projection pattern shown in FIG. 17A. Parameters of apertures (e.g., shape, size, position) may be updated dynamically up to a frame-by-frame rate while keeping detector cells fixed. In some embodiments, parameters of apertures may be updated with a different frequency.

Figure 17C:
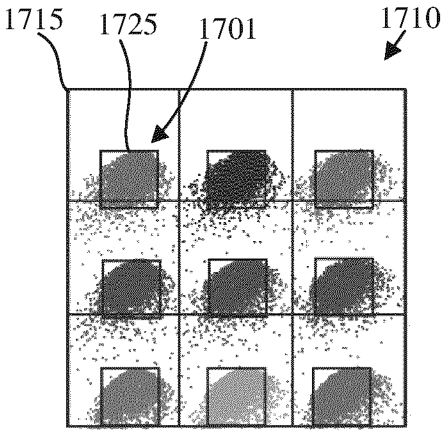
Figure 17D:
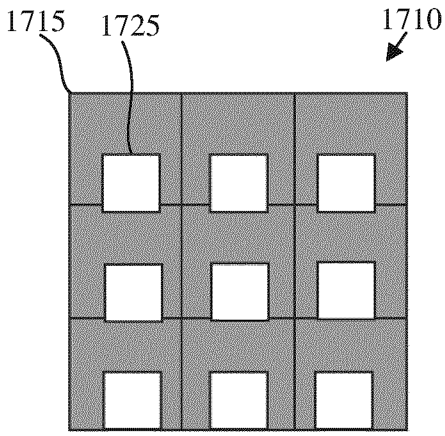

FIG. 17C shows a case where beam spots are shifted due to an effect such as surface charging. An algorithm may be configured to dynamically follow beam spots within detector cells, for example, using thresholding processing or by determining a centroid of a beam spot. For example, as beam spot 1701 moves within detector cell 1715, an algorithm may determine intensity levels of individual pixels in detector cell 1715 and may update parameters of aperture 1725 based on pixel intensities. In some embodiments, aperture 1725 may be configured to remain centered around a pixel of maximum intensity. In some embodiments, aperture 1725 may be configured to remain centered around a beam spot center that is determined based on an average position of pixels associated with the beam spot (e.g., a centroid). In some embodiments, aperture 1725 may be configured to remain centered around a region of pixels having intensity levels above a threshold. Aperture 1725 may automatically move to follow beam spot 1701. FIG. 17D shows virtual apertures corresponding to the beam spot projection pattern shown in FIG. 17C.

In some embodiments, information from neighboring detector elements may be used to create enlarged virtual detector cells. For example, images from neighboring detector cells may be stitched together. A virtual detector cell's size may be larger than that of the original detector cell. A wider range may be enabled for compensating for beam spot shift.

Figure 18:
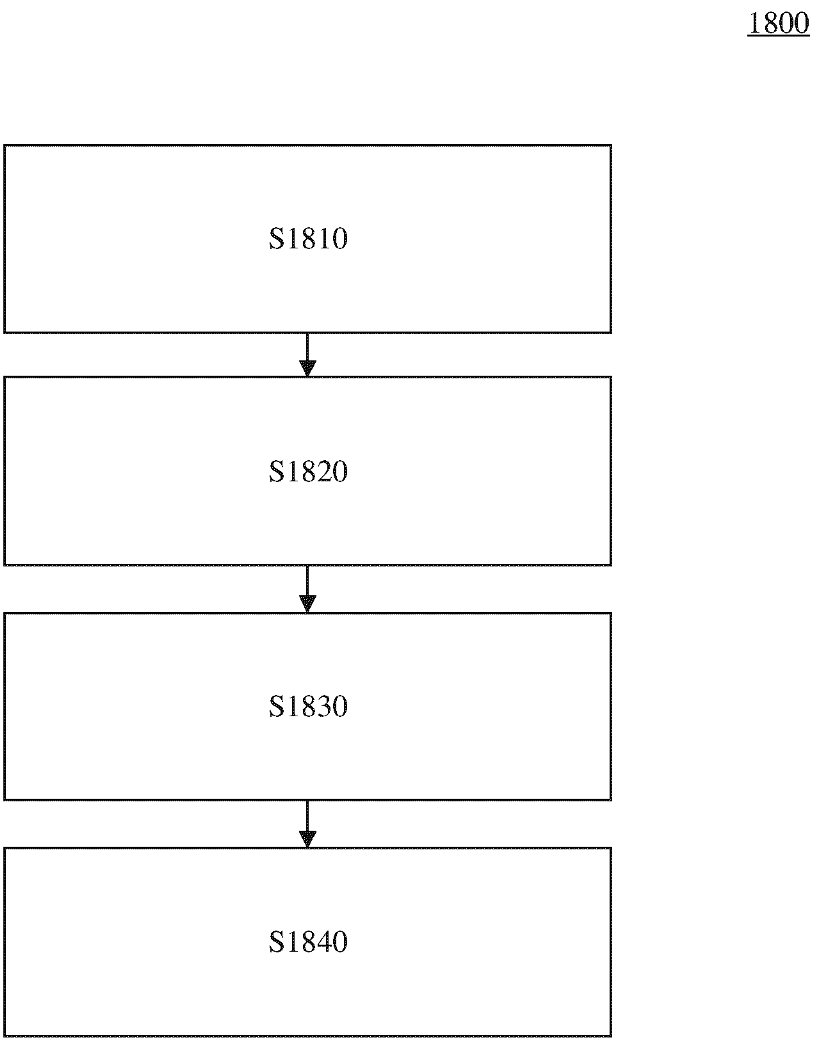
FIG. 18 is a block diagram illustrating a method 1800 for implementing virtual apertures with a predetermined shape, consistent with embodiments of the disclosure.

FIG. 18 is a block diagram illustrating a method 1800 for implementing virtual apertures with a predetermined shape, consistent with embodiments of the disclosure. Method 1800 may be implemented as an algorithm. Method 1800 may include step S1810 that may include acquiring a secondary beam spot projection pattern on a detector. Beam spot images may be acquired by detector cells that are exposed to secondary electron beamlets.

Method 1800 may include step S1820 of determining parameters of beam spots. Step S1820 may include determining a maximum of a beam spot's intensity. Maximum beam spot intensity may be found for each detector cell. Based on maximum beam spot intensity, the position of the beam spot's maximum may be determined for each cell. In some embodiments, the position of the maximum may also be found using several pixels to increase accuracy and filter out single-pixel spikes. Alternately, the beam spot center may be determined as the average position of pixels exposed to the secondary electron beamlet spot, weighted by the detected intensities of the pixels. In some embodiments, the spot center may be found as an average position of a beam spot. Step S1820 may be performed for each detector cell.

Method 1800 may include step S1830 of determining aperture masking. An aperture mask of a predetermined shape representing the virtual aperture may be imposed on each detector cell using the position of the corresponding beam spot's maximum or at the spot center. All pixels of a detector cell corresponding to an area inside the mask hole (e.g., the virtual aperture's hole) may be configured to hold their values. The pixels outside of the mask hole (e.g., the virtual aperture's hole) may be erased. Step S1830 may include performing thresholding processing. Multiple memory arrays may be used so that values of pixels stored in a first array may be used for determining thresholding, while values of pixels stored in a second array may be erased so as not to contribute to beam spot intensity detection signal upon integration.

Method 1800 may include step S1840 of determining detection signal. Step S1840 may include obtaining individual beamlet intensity for each detector cell. Step S1840 may include integrating the signals from all pixels of a detector cell. Using virtual apertures, only the signal of pixels located inside the virtual aperture's contour may contribute to the integrated detector cell's reading. All pixels outside the aperture may have zero contribution to the total signal.

Parameters of virtual apertures (e.g., shape and size) may be dynamically changed following variation of parameters of beam spots (e.g., intensity, size, and shape) on a frame-by-frame basis. For example, a shape of an aperture may change from a square to a circle. Furthermore, an average radius or maximum radius of a virtual aperture may be found on the frame-by-frame time scale. This radius may be used to implement a virtual aperture of a predetermined shape but scaled dynamically to follow the spot size variation on a frame-by-frame basis. A radius may be used for a circular aperture, while a side length may be used for a square aperture. It will be understood that other shapes and other dimensions may be used as well.

Figure 19A:
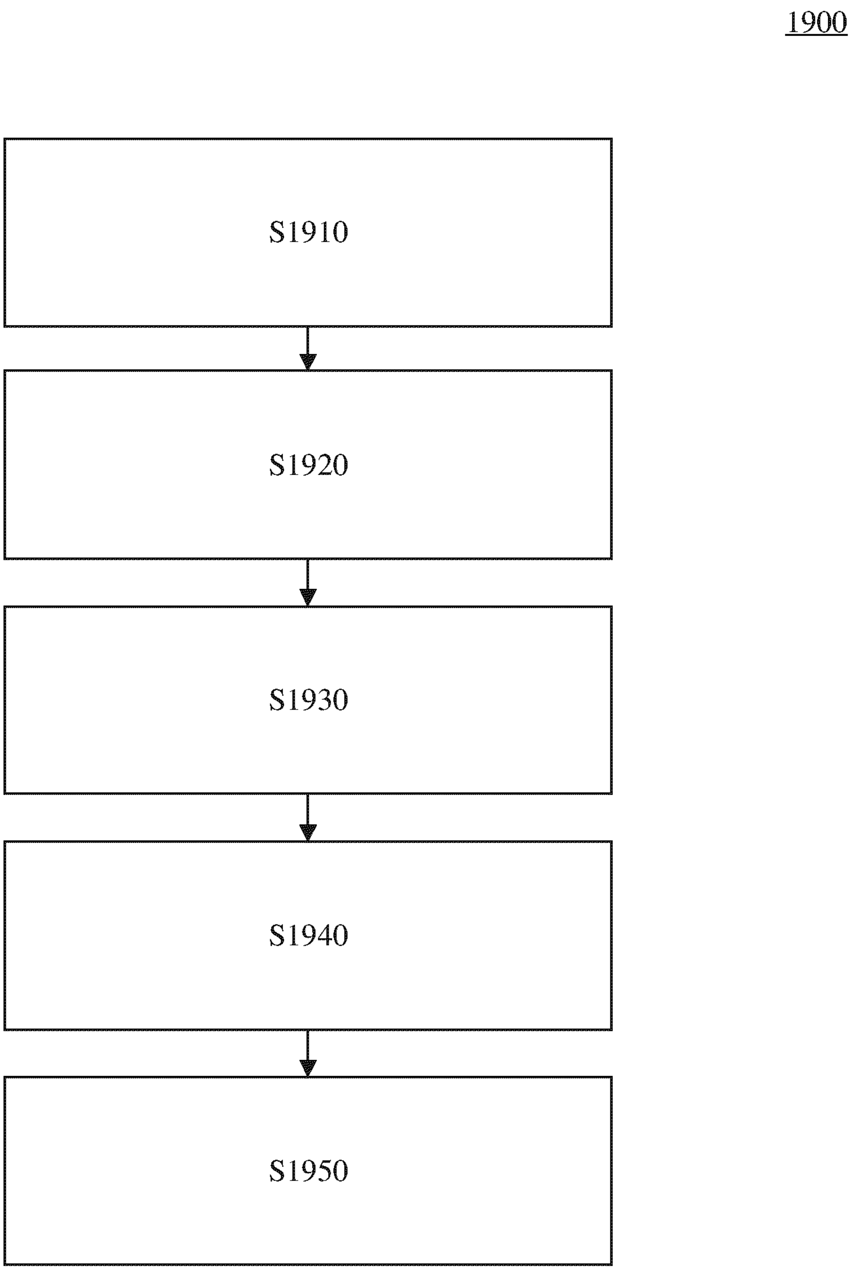
FIG. 19A illustrates a method for implementing dynamic virtual apertures with a predetermined shape at the detector hardware level, consistent with embodiments of the disclosure.
Figure 19B:
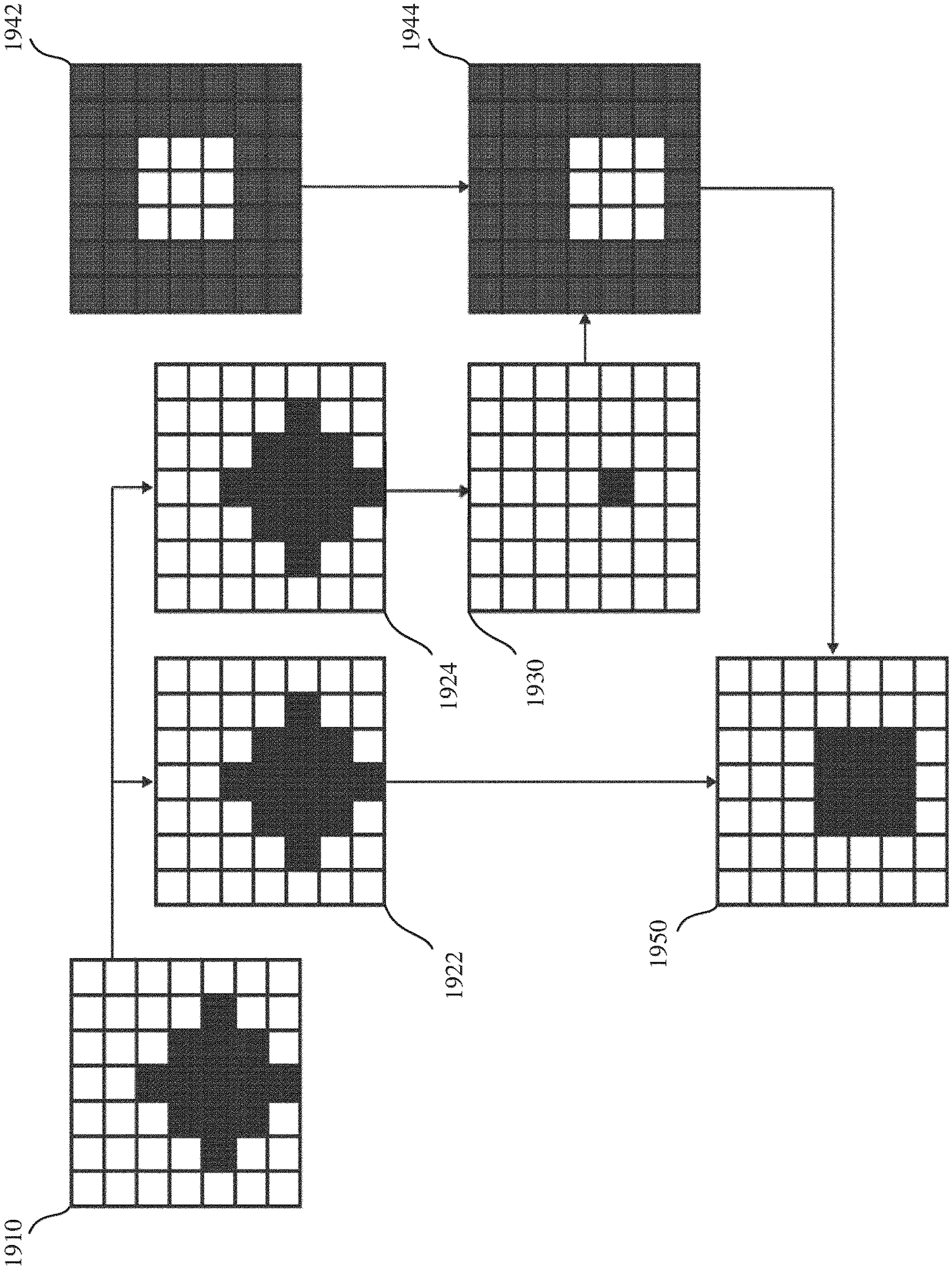
FIG. 19B is a diagrammatic representation of detector cells that may correspond to method 1900, consistent with embodiments of the disclosure.

Reference is now made to FIG. 19A, which illustrates a method 1900 for implementing dynamic virtual apertures with a predetermined shape at the detector hardware level, consistent with embodiments of the disclosure. Method 1900 may correspond to a signal processing scheme. FIG. 19B is a diagrammatic representation of detector cells that may correspond to method 1900, consistent with embodiments of the disclosure.

Method 1900 may include step S1910 of acquiring a secondary beam spot projection pattern. In step S1910, a detector cell may be exposed to a secondary electron beam, and a pixelated image of a beam spot may be obtained. Method 1900 may include step S1920 of acquiring pixel intensity values. Pixel intensity values may be copied from the detector pixel array into memory cell arrays. As shown in FIG. 19B, there may be first stored detector cell information 1922 and second stored detector cell information 1924. First and second stored detector cell information may be derived from an acquired beam spot projection pattern 1910.

As shown in FIG. 19A, method 1900 may include step S1930 of determining a beam spot's maximum intensity. Information from one of the memory arrays may be used to find the beam spot's maximum intensity. For example, as shown in FIG. 19B, second stored detector cell information 1924 may be used to determine a beam spot maximum intensity pixel representation 1930. Furthermore, the position of the spot's maximum may be determined. Alternately, in some embodiments, the beam spot center may be determined as the average position of pixels exposed to the secondary electron beamlet spot, weighted by the detected pixels' intensities.

As shown in FIG. 19A, method 1900 may include a step S1940 of determining aperture masking. An aperture mask of a predetermined shape representing a virtual aperture initially stored in a supplemental memory array may be used to create an aperture mask. The aperture mask may be located at the position of the beam spot's maximum or the beam spot center previously determined. For example, as shown in FIG. 19B, there may be initially stored aperture mask information 1942. Initially stored aperture mask information 1942 may include information of aperture parameters. Adjusted aperture mask information 1944 may be determined based on initially stored aperture mask information 1942 and beam spot maximum intensity pixel representation 1930. Adjusted aperture mask information 1944 may use aperture parameters and may adjust the aperture to the location of the beam spot's maximum or the beam spot center.

As shown in FIG. 19A, method 1900 may include a step S1950 of applying a virtual aperture to a detector cell. Step S1950 may include masking detector cell pixel values outside of the aperture. Intensity values stored in a first memory array's cells may be overlapped with the determined virtual aperture array's cells. For example, as shown in FIG. 19B, masked detector cell 1950 may be obtained based on adjusted aperture mask information 1944 and first stored detector cell information 1922. Within the memory array representing the detector cell, all the memory cells corresponding to the area inside the virtual aperture's boundary may hold their values. The pixels outside of the virtual aperture's boundary may be erased. The detector cell's beamlet intensity may be obtained by integrating the signals from all the memory elements representing the whole detector cell's area. Because pixels outside of the virtual aperture's boundary may be set to zero, the detector cell's beamlet intensity may represent only those pixels inside the virtual aperture's boundary.

In some embodiments, virtual apertures implemented according to the methods described above may be combined and applied simultaneously. Further flexibility may be achieved to optimize and stabilize detection of secondary electron beamlets using parameters of the detector secondary electron spots, such as: beam spot positions, beam spot intensities and electron distributions, beam spot shapes, and beam spot sizes.

In some embodiments, limits for parameters defining virtual apertures may be set before scanning to provide additional protection for an algorithms' stability. For example, if any background is present in the detector signal, it may be taken into account, and the zero detection level may be corrected accordingly.

Figure 20:
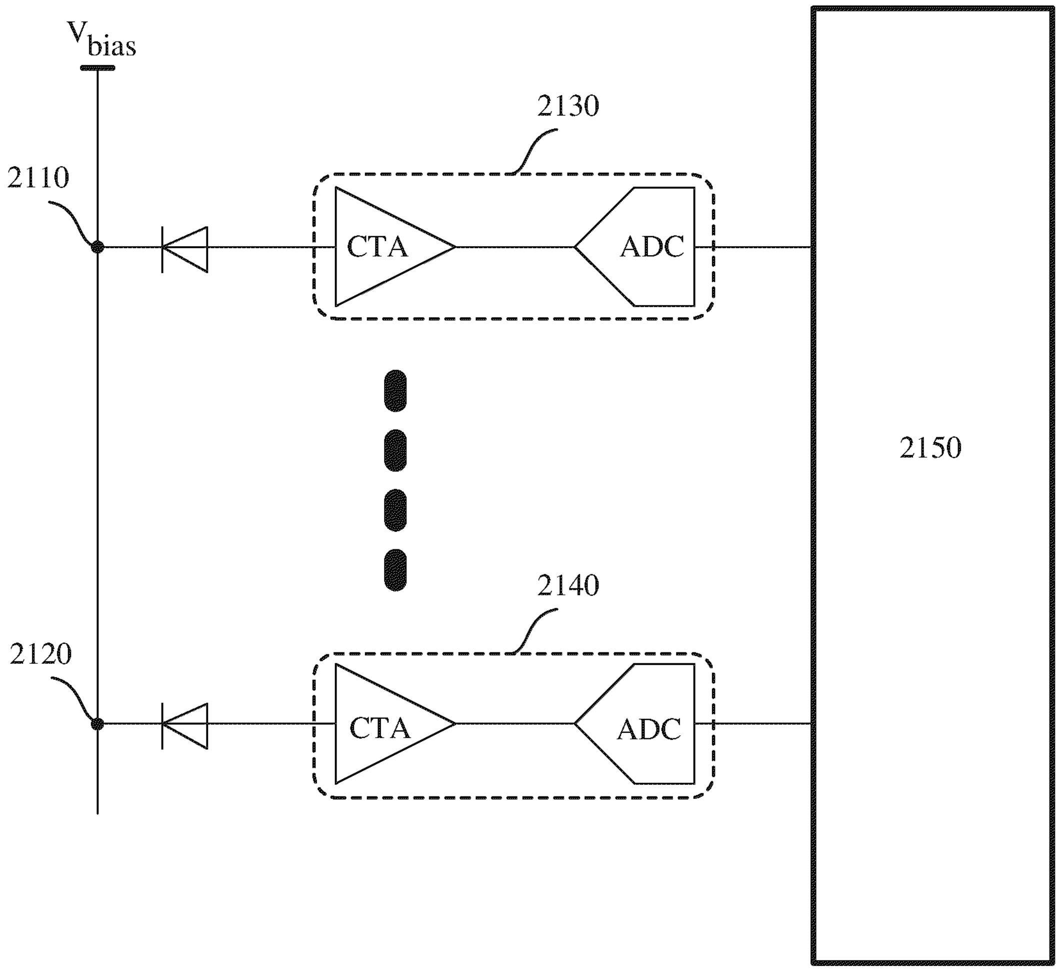
FIG. 20 is a diagrammatic representation of circuitry of a detector, consistent with embodiments of the disclosure.

Implementation of a detector with moving detector cells and virtual apertures at the hardware level may be further understood with reference to FIG. 20, which is a diagrammatic representation of circuitry of a detector, consistent with embodiments of the disclosure. As shown in FIG. 20, there may be a plurality of sensing elements including sensing element 2110 and sensing element 2120 provided in an array. The sensing element array may receive electrons from secondary electron beams. The sensing elements in the sensing element array may share a common connection. As shown in FIG. 20, the sensing elements may have a common cathode. On the other side, each sensing element may have its own individual anode for signal transmission from each sensing element to the input of its corresponding sensing element level circuit. For example, sensing element 2110 is connected to sensing element level circuit 2130, and sensing element 2120 is connected to sensing element level circuit 2140. In each sensing element level circuit, an analog signal path may be configured to receive signals from its corresponding sensing element in the sensing element array and conduct signal conditioning or manipulation such as: amplifying, filtering, integrating, and differentiating, etc. The analog signal path may be formed by an amplifier with specific performance factors such as specific bandwidth with low pass, high pass, or bandpass frequency domain response property. The amplifier may be any kind of amplifier that receives current or charge signals and outputs voltage signals. The amplifier may include a transimpedance amplifier (TIA) or a charge transfer amplifier (CTA), or a dual-mode amplifier like a CTIA that may be configured to switch between TIA mode and CTA mode depending on the requirements about the analog signal processing. As shown in FIG. 20, the amplifier forming the analog signal path may be a CTA. A data converter may follow the analog signal path in each sensing element level circuit and may convert the analog signals from the analog signal path to their corresponding digital form. Each sensing element level circuit may send its output data to a control unit 2150. Control unit 2150 may include high-speed routing circuitry, dual-port high-speed memory, and a digital signal processor.

In some embodiments, a detector may be a high frame rate pixelated detector with a structure partially similar to that of a camera sensor. For example, a detector using a structure such as that shown in FIG. 20 may be a high frame rate pixelated detector. Still, different from a camera sensor, a high frame rate pixelated detector consistent with embodiments of the disclosure may be configured to continuously run at a frame rate significantly higher than that of a camera sensor. For example, for an application scenario with a pixel rate per beam of 100 MP/s, a detector may be configured to run at a frame rate of at least 100 Mf/s (100 million frames per second) continuously. Supposing that a detector has a sensing element array with a sensing element count of 320×320, there may be 102,400 sensing elements, and the data converter in each sensing element level circuit may have a bit resolution of 8 bits. In such a case, the raw data rate from all sensing element level circuits to the controller may be 10.24 TB/s. The detector controller may contain high-speed memory, high-speed data routing circuitry, and high-speed data/signal processor, and may be configured to continuously conduct data pre-processing within the detector. In such case, the data rate at the detector's output may be reduced to a data rate that is at least 2 to 3 orders of magnitude lower than a raw data rate. A reduced load may be achieved for the data path between the detector and downstream function blocks. The data converters mentioned above may have any bit resolution, e.g., in some embodiments, 8 bit resolution down to 1 bit. The data converters each may only contain one voltage comparator, for example. In some embodiments, a detector may be configured to have hardware-based data/signal processing functions in its data/signal processor to achieve tasks such as (i) forming virtual (e.g., electronic) apertures, (ii) data/signal manipulating, which may include but not limited to manipulating the value of the output data from each sensing element level circuit based on a threshold, (iii) detecting a maximum value among a group of outputs from a group of sensing elements covered by a specific beam spot, (iv) producing the sum of the outputs from the group, (v) storing the processed results in high-speed memory, (vi) communicating with downstream function blocks and sending out the processed data, etc. Such processes may be conducted in the digital domain. The high-speed memory discussed here may be a storage cell array capable of storing data in digital form and, in some embodiments, may be accessed from either the sensing element level circuits side or controller side simultaneously. The detector may be configured such that high-speed data routing circuitry in the controller may direct the data from sensing element level circuits to a specific data storage area inside the high-speed memory in real-time without causing any data jam during the data transportations. The detector may also be configured to move data stored in one area of the high speed memory to another area in the high-speed memory without causing any interference to the data transportations from the sensing element level circuits to the high-speed memory or to the bidirectional data transportations between the high-speed memory and the data/signal processor. During the data/signal processing, through the data manipulation mentioned above, the data rate may be reduced from the data rate of the raw data from the sensing element level circuits to a data rate that is at least 2-3 orders of magnitude lower than a raw data rate. In some embodiments, if there are nine beams in an SEM system, and the pixel rate is 100 MP/s for each beam, and only 8 bits grey level may be needed for representing the intensity of each beam in the reconstructed SEM images, and the reduced data rate may be approximately 900 MB/s. The data rate reduction from the raw data rate to the detector's processed data rate may be more than four orders of magnitude.

In some embodiments, a feedback loop may be provided for compensating the overall shift of the secondary electron beamlet array. The feedback loop may be configured to stabilize secondary electron detection. The feedback loop may be configured to align the secondary electron beamlet array with the detector's center, or any other location. The feedback loop may be implemented using a secondary electron column's deflectors, e.g., anti-scanning deflectors.

Secondary-column designs and the secondary electron projection imaging systems are discussed in U.S. Pat. Nos. 9,691,588, 10,141,160, and U.S. Provisional App. No. 63/081,715. An anti-scanning deflecting system may act on all secondary electron beamlets simultaneously. The signals controlling excitation of deflectors for stabilizing beamlets may be generated based on the shift of the beamlet array detected at a previous scanning step.

Figure 21:
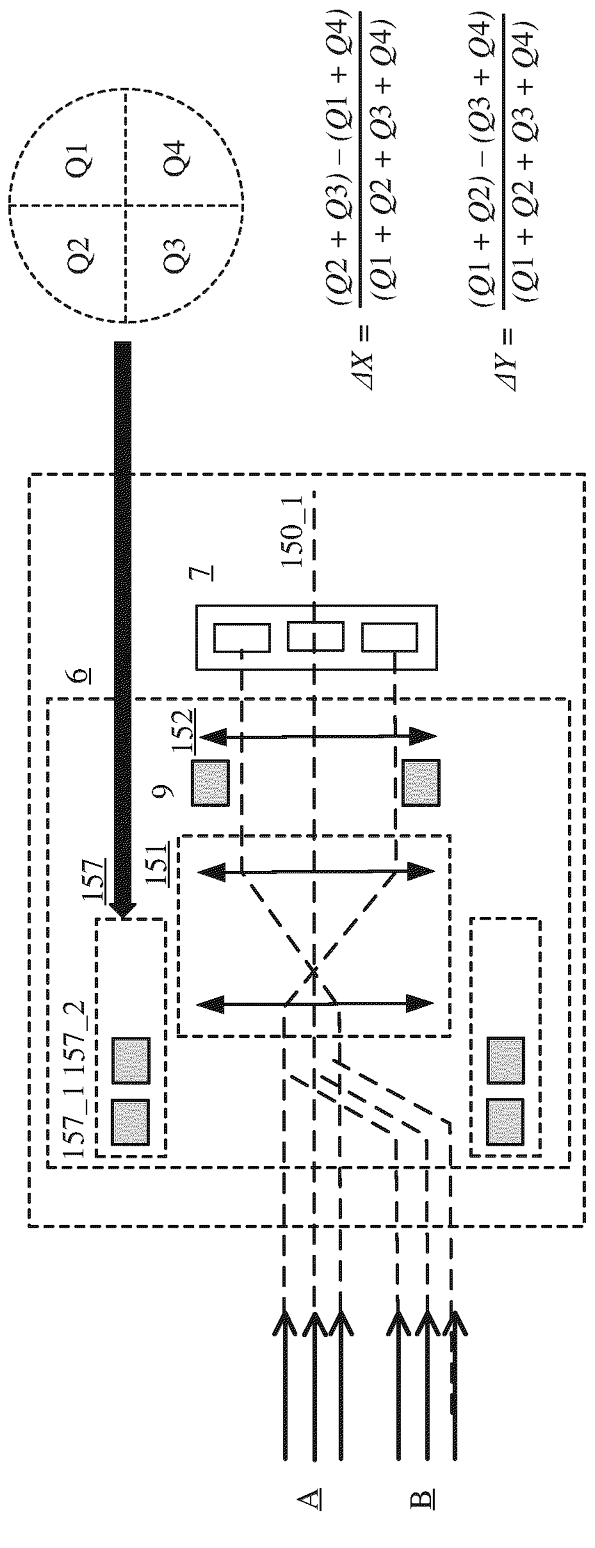
FIG. 21 shows an example of an arrangement of a secondary imaging system 6, consistent with embodiments of the present disclosure.

FIG. 21 shows an example of an arrangement of a secondary imaging system 6, consistent with embodiments of the present disclosure. As shown in FIG. 21, a plurality of deflectors may be provided for an anti-scanning secondary electron deflection unit 157. For example, there may be provided at least two deflectors 157_1 and 157_2. Deflector 157_1 may be configured to deflect beamlets toward secondary optical axis 150_1, and deflector 1572 may be configured to deflect beamlets back so that they have a trajectory parallel to secondary optical axis 150_1. Offset beamlets, e.g., those originating from position B may be deflected back so that they are aligned with secondary optical axis 150_1, similar to beamlets originating from position A. Beamlets may pass through stigmator 9 that may be configured to compensate for astigmatism aberrations of the plurality of secondary electron beams entering secondary imaging system 6 due to a component such as a beam separator. A zoom lens 151 and a projection lens 152 may be configured to form beam spots on detector 7.

As shown in FIG. 21, secondary imaging system 6 may be configured to operate with a feedback loop. The feedback loop may be implemented using active elements and detector 7. For example, the feedback loop may use anti-scanning deflectors included in secondary imaging system 6. For each scanning step, shifts of beam spot determined for individual beamlets may be averaged, and the average deviation from the beam spots' nominal positions may be found. Based on beam spot shifts and average deviation, a feedback signal may be generated and used to provide a signal to deflectors of anti-scanning secondary electron deflection unit 157. The feedback signal may be configured to stabilize average beam spot positions with respect to detector 7. Deviations of beam spots from their nominal positions on detector 7 may be found, e.g., by image processing 2D images formed on detector cells of detector 7. In some embodiments, sub-cells may also be created within the detector cells and used to generate the feedback loop's control signal. The control signal may be generated using a differential signal scheme to measure deviation of beam spot positions from nominal positions. For example, for a four-quadrant detector (e.g., Q1, Q2, Q3, Q4), beam spot shift of $\Delta X$, $\Delta Y$ may be directly obtained by integrating the quadrants' signals and processing them according to a formula. Exemplary formulas are shown in FIG. 21. In some embodiments, a processing scheme for compensating the overall shift of the secondary electron beamlet array may be realized at a hardware level. Processing speed of such a scheme may be enhanced.

Furthermore, in some embodiments, for a multi-beam SEM systems having dispersive elements in the secondary electron column (e.g., such as those discussed in U.S. Pat. Nos. 9,691,588, 10,141,160, and U.S. Provisional App. No. 63/081,715), a method for measuring surface potential induced by surface charging may also be implemented. A method for measuring surface potential may utilize the beam spot shift of secondary electron beamlets observed on the detector of a multi-beam SEM.

For a multi-beam system with a plurality of secondary electron beamlets, any beamlet may be used for spot shift measurements. In some embodiments, an on-axis beamlet may be used. The on-axis beamlet may refer to the beamlet located at the center of the beam spot array (e.g., the center spot shown in the 3×3 array of FIG. 23A). The on-axis beamlet may be aligned with secondary optical axis 150_1 (see FIG. 21). Typically, the on-axis beamlet may have the smallest spot size on the detector since the beamlet in the central position may be least affected by the aberrations of the primary and secondary columns' electron-optical elements. For example, secondary beam spot 236_S shown in FIG. 7B has the smallest spot size.

Figure 22A:
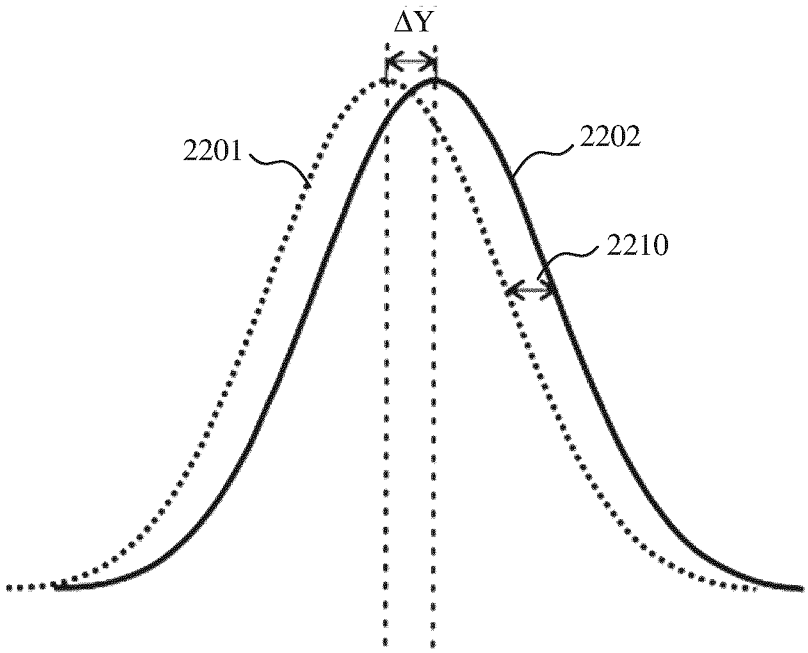
FIGS. 22A and 22B are diagrammatic representations of determining spot shift measurements, consistent with embodiments of the disclosure.
Figure 22B:
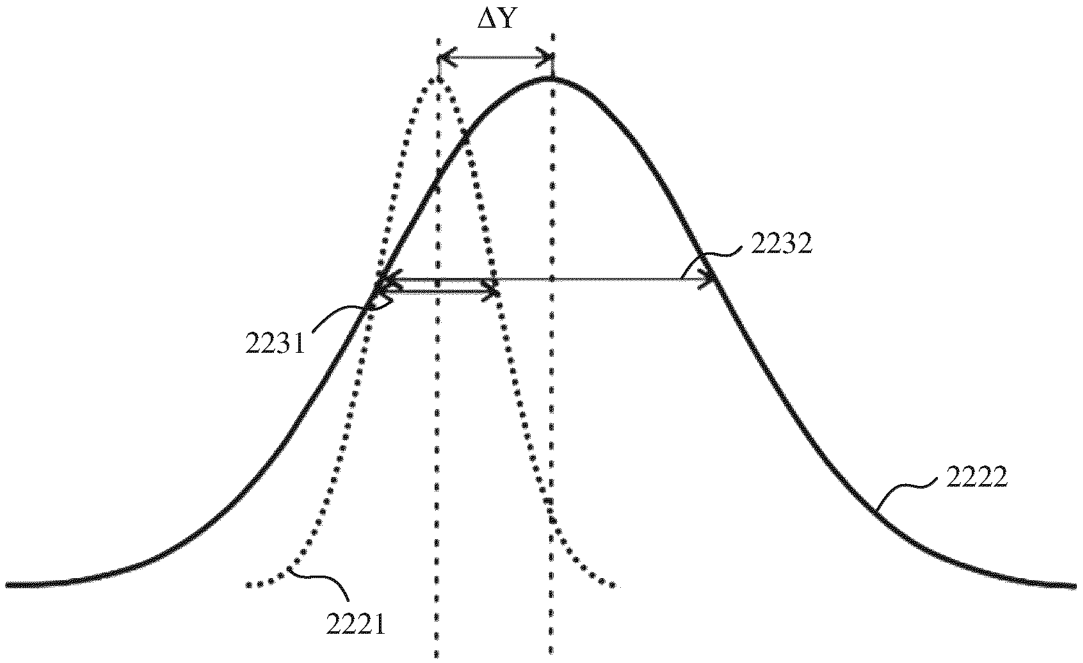

Reference is now made to FIGS. 22A and 22B, which are diagrammatic representations of determining spot shift measurements, consistent with embodiments of the disclosure. FIG. 22A shows a secondary electron beamlet peak's shift on a detector induced by surface charging. A curve 2201, shown with a dotted line, may represent an original peak position. A curve 2202, shown with a solid line, may represent a shifted peak position. Curves may represent intensity distribution of a beam spot over a linear range. For a peak that does not experience a change in width, a value $\Delta Y$ of shift (e.g., when a dispersive element creates dispersion along the Y direction) may be determined by monitoring positions of the peak's maximum or the shifts of the peak's edges. For example, as shown in FIG. 22A, a shifted amount 2210 measured from peak edge to peak edge may be used. In some embodiments, a beamlet peak's shift on a detector may be accompanied by variation of the peak's width and modification of the peak's shape. FIG. 22B shows a curve 2221 and a curve 2222. Curve 2222 may represent a peak that is shifted in position and also experiences variation of peak width. Curve 2221 may have a width 2231 and curve 2222 may have a width 2232. Variations in peak width or peak shape may be caused by changes in kinetic energy of secondary electrons that may be due to charge localized in the sample surface's vicinity. Nevertheless, some embodiments may be configured to determine peak shift by measuring shift of the peak maximum or peak edges. A beamlet spot's shift $\Delta Y$ on a detector may be converted to kinetic energy variation $\Delta E$. A conversion factor may be determined experimentally or by theoretical modeling. In some embodiments, determining the conversion factor experimentally may include using a calibration sample mounted on a SEM's wafer stage. The sample may be biased to different voltages ($\Delta V$) and peak shift observed on the detector may be determined to calibrate $\Delta E$ vs. $\Delta Y$. In some embodiments, the value $\Delta V$ may be directly converted to $\Delta E$. The difference in the energy and angular distributions of secondary electron emission from different materials (and surfaces) may be considered by performing calibration measurements on different samples and making cross-comparisons. Positions of peaks for non-charged surfaces may be found by measuring a peak's positions vs. primary beam current, reducing the primary current towards zero, and extrapolating the resulting peak-position curve to the zero primary current.

In some embodiments, near-surface fields induced by inhomogeneous charging of a sample surface may simultaneously affect the kinetic energy of secondary electron beamlets and may tilt the beamlets away from the sample surface's normal vector. These two effects may be disentangled by performing multi-beam SEM measurements in X- and Y-directions. Variation of the kinetic energy in both cases may lead to determining the beamlet spot's shift along one direction on the detector (e.g., the Y-direction). In contrast, shift due to tilt may depend on the sample's orientation.

In some embodiments, the sensitivity of multi-beam SEMs having a dispersive energy element in the secondary electron column to the charge localized in the surface's vicinity may be utilized to implement a scanning method to map the surface's charge distribution at the wafer (e.g., variation of surface potential due to surface charging). A method may include surface potential variation detection. In some embodiments, a method may include using a spot displacement operation mode.

In some embodiments, a method for measuring surface potential induced by surface charging may be provided, and secondary electron beam spot shift on a detector may be detected and converted to surface potential variation. A method may include monitoring the secondary electron spot shifts vs. positions of the primary-electron beamlets on the sample. Using such a method, a surface region may be mapped, and a map representing surface charge over the scanned area may be reconstructed.

Homogeneous surface charging affecting the secondary electron energies may be disentangled from the secondary electron beamlet's tilt away from the surface's normal induced by inhomogeneity of the surface charging. Some methods may involve performing scans in X- and Y-directions (where the Y-direction may correspond to the dispersive element's energy dispersion direction). Variation of the kinetic energy in both cases may lead to the beamlet's shift along one direction on the detector (e.g., the Y-direction). In contrast, the shift due to the tilt may follow the sample's orientation.

In some embodiments, a scanning method may be implemented using, e.g., differential intensity measurements using a quadrat-detector detection scheme.

Reference is now made to FIGS. 23A-23C, which illustrate a method for mapping surface potential variation using a multi-beam SEM with a dispersive energy element in its secondary column, consistent with embodiments of the disclosure. A quadrat-detector differential intensity detection scheme may be used to measure beam spot shifts.

As shown in FIG. 23A, a 2D pixelated detector 2300 may be provided. There may be provided a plurality of detector cells. For example, detector 2300 may include a 3×3 array of detector cells. Among the detector cells, there may be a detector cell 2310. Within each detector cell, a region may be split into four sub-regions (e.g., quadrants). For example, as shown in FIG. 23A, there may be region 2320 in detector cell 2310. As shown in FIG. 23B, region 2320 may be split into four quadrants Q1, Q2, Q3, and Q4. Before scanning, while secondary electron spots are located at nominal positions, the quadrants may be arranged so that beam spots have nearly equal intensity weight on each of the four corresponding quadrants.

Secondary electron beam spots may shift with respect to initial positions on a detector while scanning a charged surface region. As beam spots shift, the balance of the spot intensities between quadrants may change. A value proportional to beam spot shift on the detector may be extracted from measured quadrant intensities according to a formula. For example, a formula such as that shown in FIG. 23C may be used to determine beam spot shift.

In some embodiments, information obtained using a method for detecting the surface-potential variation (surface charge) may be combined with traditional SEM measurements, providing an additional information channel for detecting voltage-contrast defects. Furthermore, virtual apertures may also be used in a scanning method for stabilizing secondary electron collection efficiency and minimizing the cross-talk.

Figure 24:
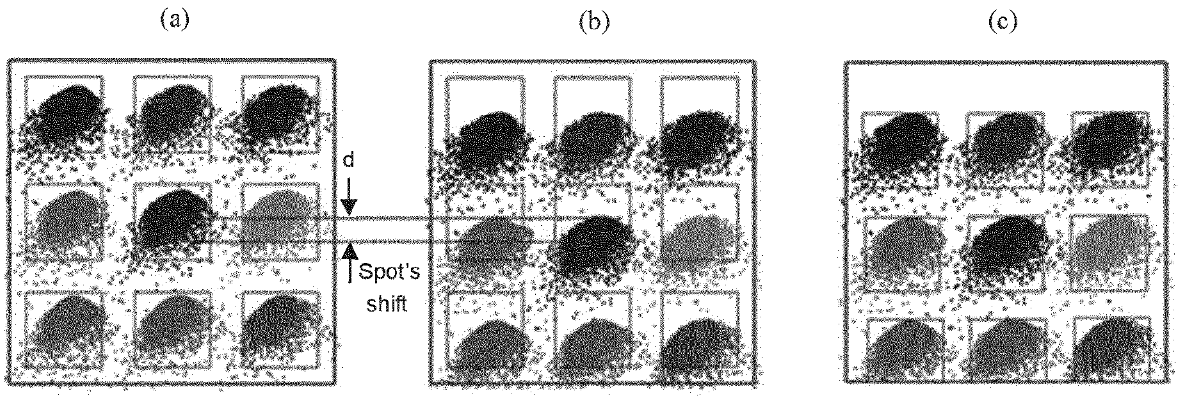
FIG. 24 illustrates beam spot shift, consistent with embodiments of the disclosure.

In some embodiments, simulations may show that surface charging of a certain amount leads to a beam spot shift on a detector by a certain distance from the nominal positions. For example, as shown in FIG. 24, beam spots may shift by a distance D relative to nominal positions between frames (a) and (b). For virtual apertures with fixed positions and fixed squared shape, collection efficiency may be reduced by a certain proportion and cross-talk maximum may increase by a certain proportion due to beam spot shift. Some embodiments of the disclosure may perform beam spot tracking to compensate for beam spot shift. In some comparative embodiments, without beam spot tracking, imaging of charged defects may lead to an inversion of the defects' images (e.g., going from a bright defect to a dark defect), and misclassification of defects may result.

Beam spot tracking may allow stabilizing of secondary electron detection of individual beamlets in a multi-beam SEMs, and may enable higher imaging quality and a higher speed of measurements. For applications of wafer defect inspection systems, higher throughput, higher sensitivity, and higher reliability of defects detection may be achieved.

FIG. 24 illustrates beam spot shift on a detector. Frame (a) of FIG. 24 may represent beam spots on a detector having virtual apertures while scanning over a non-charged surface. Frame (b) of FIG. 24 may represent beam spots corresponding to a case where the surface is charged by a certain amount. As shown in the difference between frames (a) and (b), beam spots may be shifted relative to nominal positions by a distance d. Distance d may be measured with respect to a central beam spot. As shown in frame (b) of FIG. 24, virtual apertures may be located at the old positions, and collection efficiency and cross-talk may worsen because beam spots are not centered around the shifted beam spot positions. Frame (c) of FIG. 24 shows virtual apertures adjusted to follow the beam spots. Beam spot tracking and adjusting of virtual apertures may compensate for beam spot shift.

Figure 25A:
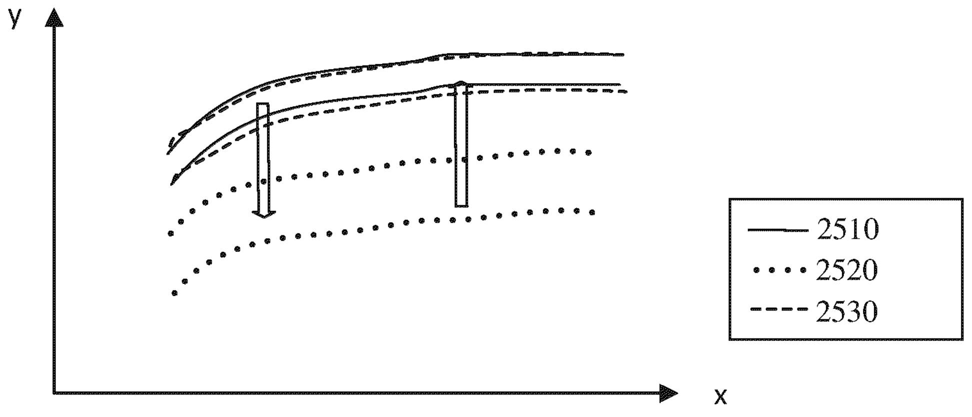
FIGS. 25A and 25B are graphical representations of collection efficiency and the cross-talk for cases considered in FIG. 24, consistent with embodiments of the disclosure.
Figure 25B:
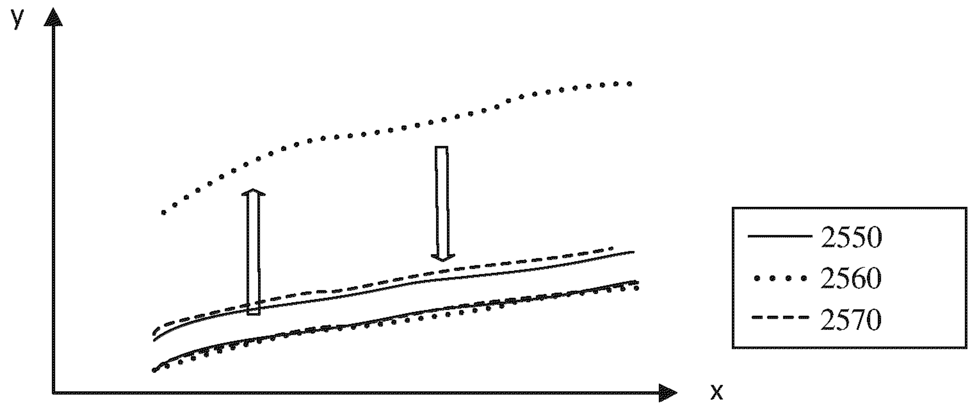

FIGS. 25A and 25B are graphical representations of collection efficiency and the cross-talk for cases considered in FIG. 24. In FIGS. 25A and 25B, the y-axis may represent field of view (FOV) median value, and the x-axis may represent beam limit aperture (BLA) size. FIG. 25A may represent collection efficiency. FIG. 25B may represent cross talk.

In FIGS. 25A and 25B, solid line curves 2510, 2550 may represent high and low limits of collection efficiency and cross talk, respectively, for a case with no surface charging. Short-dash broken line curves 2520, 2560 may represent high and low limits of collection efficiency and cross talk, respectively, for a case where the surface is charged. For example, there may be a potential of a certain number of volts. Also, virtual apertures may be set at old positions (e.g., nominal positions even though beam spots may have shifted). As shown in FIG. 25A, collection efficiency may be reduced by a certain proportion. Furthermore, as shown in FIG. 25B, the cross talk maximum may be higher by a certain proportion. Long-dash broken line curves 2530, 2570 may represent high and low limits of collection efficiency and cross talk, respectively, for a case where the surface is charged and where virtual apertures follow beam spots to compensate for shift. As shown in FIGS. 25A and 25B, collection efficiency and cross talk may be recovered.

In some embodiments, quantification of surface potential induced by the charge localized at the near-surface region may be significant for several reasons. For example, theoretical simulations of system performance may depend on accurate quantification of surface potential used in the system model. Also, quantification of surface potential may be used for the experimental calibration of different system parameters. Furthermore, knowledge of surface potential created by the charge accumulated at the sample surface in different operation modes may be useful to avoid damaging micro-circuit structures formed on a wafer. Additionally, the change of secondary electrons' kinetic energy caused by the charge localized in the surface's vicinity may affect the secondary electron projection-imaging system's focusing, and knowledge of the surface potential may be used for implementing correction of the focusing while scanning charging surfaces.

The information obtained using the method detecting surface-potential variation may be combined with traditional SEM measurements, providing an additional information channel for detecting voltage-contrast defects. This may provide more sensitivity for defect detection and increase the reliability and speed of mapping voltage contrast defects on a wafer.

A non-transitory computer-readable medium may be provided that stores instructions for a processor of a controller (e.g., controller 109 in FIG. 1) for detecting charged particles or performing other functions according to exemplary methods (e.g., FIGS. 9, 10-13, 15, 16, 18, 19), consistent with embodiments of the disclosure. For example, the instructions stored in the non-transitory computer-readable medium may be executed by the circuitry of the controller for performing method 900, method 1000, method 1100, method 1200, method 1300, method 1500, method 1600, method 1800, or method 1900, in part or in entirety. Common forms of non-transitory media include, for example, a floppy disk, a flexible disk, hard disk, solid-state drive, magnetic tape, or any other magnetic data storage medium, a Compact Disc Read-Only Memory (CD-ROM), any other optical data storage medium, any physical medium with patterns of holes, a Random Access Memory (RAM), a Programmable Read-Only Memory (PROM), and Erasable Programmable Read-Only Memory (EPROM), a FLASH-EPROM or any other flash memory, Non-Volatile Random Access Memory (NVRAM), a cache, a register, any other memory chip or cartridge, and networked versions of the same.

The embodiments may further be described using the following clauses:

1. A method of detecting charged particles, the method comprising:

detecting beam intensity as a primary charged particle beam moves along a first direction;

acquiring a secondary beam spot projection pattern as the primary charged particle beam moves along a second direction; and determining a parameter of a secondary beam spot based on the acquired secondary beam spot projection pattern.

2. The method of clause 1, wherein the parameter of the secondary beam spot includes size, shape, or location.

3. The method of clause 1 or clause 2, further comprising:

determining a boundary of the secondary beam spot based on the acquired secondary beam spot projection pattern.

4. The method of any one of clauses 1-3, further comprising:

determining a group of sensing elements associated with the secondary beam spot; and updating the group of sensing elements associated with the secondary beam spot based on the acquired secondary beam spot projection pattern.

5. The method of clause 4, wherein the group of sensing elements associated with the secondary beam spot is used to detect beam intensity as the primary charged particle beam moves along the first direction.

6. The method of clause 4 or clause 5, wherein the group of sensing elements associated with the secondary beam spot is used to acquire the secondary beam spot projection pattern as the primary charged particle beam moves along the second direction.

7. The method of clause 4 or clause 5, wherein a different group of sensing elements is used to acquire the secondary beam spot projection pattern as the primary charged particle beam moves along the second direction.

8. The method of any one of clauses 1-7, wherein the secondary beam spot projection pattern includes a portion of sensing elements included in a detector.

9. The method of any one of clauses 1-8, wherein the secondary beam spot projection pattern includes a region of interest.

10. The method of clause 9, wherein the region of interest includes an outer peripheral region of the secondary beam spot.

11. The method of clause 9 or clause 10, wherein the region of interest includes an inner peripheral region of the secondary beam spot.

12. The method of clause 9, wherein the region of interest includes a row of sensing elements adjacent to an edge of the secondary beam spot.

13. The method of any one of clauses 9-12, further comprising:

adjusting the region of interest based on the acquired secondary beam spot projection pattern.

14. The method of any one of clauses 1-13, wherein detecting beam intensity is based on output of a first group of sensing elements, and determining the parameter of the secondary beam spot is based on output of a second group of sensing elements.

15. The method of clause 14, further comprising:

reading out combined output of the first group of sensing elements.

16. The method of clause 14 or clause 15, further comprising:

reading out output of the second group of sensing elements on a per-sensing element basis.

17. The method of clause 14, wherein the first group of sensing elements and the second group of sensing elements at least partially overlap.

18. The method of clause 14, wherein the first group of sensing elements and the second group of sensing elements are mutually exclusive.

19. The method of any one of clauses 1-18, wherein the second direction is opposite the first direction.

20. The method of any one of clauses 1-19, wherein detecting beam intensity as the primary charged particle beam moves along the first direction occurs during a scanning operation, and acquiring the secondary beam spot projection pattern as the primary charged particle beam moves along the second direction occurs during a retrace operation.

21. The method of clause 20, wherein acquiring the secondary beam spot projection pattern as the primary charged particle beam moves along the second direction occurs during a portion of the retrace operation.

22. The method of any one of clauses 1-21, wherein the primary charged particle beam includes a plurality of charged particle beamlets and the secondary beam spot includes a plurality of beam spots.

23. The method of any one of clauses 1-22, wherein data acquired as the primary charged particle beam moves along the first direction is used to generate a SEM image, and data acquired as the primary charged particle beam moves along the second direction does not contribute to the SEM image.

24. The method of clause 14, wherein the second group includes all of the sensing elements included in a detector, and the first group includes a subset of the sensing elements included in the detector.

25. The method of clause 14, wherein the second group includes a region of sensing elements around the secondary beam spot.

26. The method of clause 25, wherein the region of sensing elements around the secondary beam spot includes a ring around the secondary beam spot.

27. The method of clause 14, or one of clauses 24-26, wherein the second group includes the first group.

28. The method of clause 14, clause 25, or clause 26, wherein the first group and the second group are mutually exclusive.

29. The method of clause 26, wherein the ring is one of a plurality of rings each respectively surrounding one of a plurality of beam spots.

30. A method of beam spot tracking, the method comprising:

determining a first group of sensing elements to detect intensity of a secondary charged particle beam spot on a detector;

for each retrace of a plurality of retraces occurring during a scanning operation:

acquiring a secondary beam spot projection pattern using a second group of sensing elements; and adjusting the first group of sensing elements or the second group of sensing elements based on the secondary beam spot projection pattern.

31. The method of clause 30, wherein the second group includes all of the sensing elements included in the detector, and the first group includes a subset of the sensing elements included in the detector.

32. The method of clause 30, wherein the second group includes a region of sensing elements around the secondary charged particle beam spot.

33. The method of clause 32, wherein the region of sensing elements around the secondary charged particle beam spot includes a ring around the secondary charged particle beam spot.

34. The method of clause 30, clause 32, or clause 33, wherein the second group includes the first group.

35. The method of clause 30, clause 32, or clause 33, wherein the first group and the second group are mutually exclusive.

36. The method of clause 33, wherein the ring is one of a plurality of rings each respectively surrounding one of a plurality of beam spots.

37. The method of clause 30, wherein the first group of sensing elements and the second group of sensing elements at least partially overlap.

38. The method of any one of clauses 30-37, wherein the second group of sensing elements includes a region of interest.

39. The method of any one of clauses 30-38, wherein acquiring the secondary beam spot projection pattern comprises:

generating a full frame of a beam spot projection pattern image on the detector.

40. The method of any one of clauses 30-38, wherein acquiring the secondary beam spot projection pattern comprises:

generating a partial frame of a beam spot projection pattern image on the detector, the partial frame including an area of interest.

41. The method of clause 40, wherein the area of interest includes sensing elements surrounding the secondary charged particle beam spot.

42. The method of any one of clauses 30-38, wherein acquiring the secondary beam spot projection pattern comprises:

determining a boundary of the secondary charged particle beam spot.

43. The method of any one of clauses 30-42, further comprising:

determining a parameter of the secondary beam spot projection pattern.

44. The method of clause 43, where the parameter includes:

(i) a moving direction of the secondary charged particle beam spot, (ii) a moving speed of the secondary charged particle beam spot, (iii) an acceleration direction of the secondary charged particle beam spot, (iv) an acceleration amount of the secondary charged particle, (v) a moving direction of each point on a border of the secondary charged particle, (vi) a moving speed of each point on the border of the secondary charged particle beam spot, (vii) an acceleration direction of each point on the border of the secondary charged particle beam spot, or (viii) an acceleration amount of each point on the border of the secondary charged particle beam spot.

45. The method of clause 43, wherein it is determined to adjust the first group of sensing elements based on the parameter.

46. The method of clause 43, wherein it is determined to adjust the second group of sensing elements based on the parameter.

47. The method of clause 46, wherein adjusting the second group of sensing elements includes adjusting a number of sensing elements included in the second group.

48. The method of clause 40 or clause 41, further comprising:

in response to determining that the secondary charged particle beam spot enters the area of interest, adjusting the first group of sensing elements or the second group of sensing elements.

49. The method of clause 42, further comprising:

in response to determining that the secondary charged particle beam spot crosses the boundary, adjusting the first group of sensing elements or the second group of sensing elements.

50. A non-transitory computer-readable medium storing a set of instructions that are executable by one or more processors of controller of a charged particle beam apparatus to cause the charged particle beam apparatus to perform a method comprising:

detecting beam intensity as a primary charged particle beam moves along a first direction;

acquiring a secondary beam spot projection pattern as the primary charged particle beam moves along a second direction; and determining a parameter of a secondary beam spot based on the acquired secondary beam spot projection pattern.

51. A non-transitory computer-readable medium storing a set of instructions that are executable by one or more processors of controller of a charged particle beam apparatus to cause the charged particle beam apparatus to perform a method comprising:

determining a first group of sensing elements to detect intensity of a secondary charged particle beam spot on a detector;

for each retrace of a plurality of retraces occurring during a scanning operation:

acquiring a secondary beam spot projection pattern using a second group of sensing elements; and adjusting the first group of sensing elements or the second group of sensing elements based on the secondary beam spot projection pattern.

52. A charged particle beam apparatus comprising:

a charged particle beam source configured to generate a primary charged particle beam;

a detector; and a controller having circuitry configured to:

detect beam intensity as the primary charged particle beam moves along a first direction of a sample;

acquire a secondary beam spot projection pattern on the detector as the primary charged particle beam moves along a second direction of the sample; and determine a parameter of a secondary beam spot on the detector based on the acquired secondary beam spot projection pattern.

53. The apparatus of clause 52, wherein the parameter of the secondary beam spot includes size, shape, or location.

54. The apparatus of clause 52 or clause 53, wherein the controller further comprises circuitry configured to:

determine a boundary of the secondary beam spot based on the acquired secondary beam spot projection pattern.

55. The apparatus of any one of clauses 52-54, wherein the controller further comprises circuitry configured to:

determine a group of sensing elements associated with the secondary beam spot; and update the group of sensing elements associated with the secondary beam spot based on the acquired secondary beam spot projection pattern.

56. The apparatus of clause 55, wherein the group of sensing elements associated with the secondary beam spot is used to detect beam intensity as the primary charged particle beam moves along the first direction.

57. The apparatus of clause 55 or clause 56, wherein the group of sensing elements associated with the secondary beam spot is used to acquire the secondary beam spot projection pattern as the primary charged particle beam moves along the second direction.

58. The apparatus of clause 55 or clause 56, wherein a different group of sensing elements is used to acquire the secondary beam spot projection pattern as the primary charged particle beam moves along the second direction.

59. The apparatus of any one of clauses 52-58, wherein the secondary beam spot projection pattern includes a portion of sensing elements included in a detector.

60. The apparatus of any one of clauses 52-59, wherein the secondary beam spot projection pattern includes a region of interest.

61. The apparatus of clause 60, wherein the region of interest includes an outer peripheral region of the secondary beam spot.

62. The apparatus of clause 60 or clause 61, wherein the region of interest includes an inner peripheral region of the secondary beam spot.

63. The apparatus of clause 60, wherein the region of interest includes a row of sensing elements adjacent to an edge of the secondary beam spot 64. The apparatus of any one of clauses 60-63, wherein the controller further comprises circuitry configured to:

adjust the region of interest based on the acquired secondary beam spot projection pattern.

65. The apparatus of any one of clauses 39-51, wherein detecting beam intensity is based on output of a first group of sensing elements, and determining the parameter of the secondary beam spot is based on output of a second group of sensing elements.

66. The apparatus of clause 65, wherein the controller further comprises circuitry configured to:

read out combined output of the first group of sensing elements.

67. The apparatus of clause 65 or clause 66, wherein the controller further comprises circuitry configured to:

read out output of the second group of sensing elements on a per-sensing element basis.

68. The apparatus of clause 65, wherein the first group of sensing elements and the second group of sensing elements at least partially overlap.

69. The apparatus of clause 65, wherein the first group of sensing elements and the second group of sensing elements are mutually exclusive.

70. The apparatus of any one of clauses 52-69, wherein the second direction is opposite the first direction.

71. The apparatus of any one of clauses 52-69, wherein detecting beam intensity as the primary charged particle beam moves along the first direction occurs during a scanning operation, and acquiring the secondary beam spot projection pattern as the primary charged particle beam moves along the second direction occurs during a retrace operation.

72. The method of clause 71, wherein acquiring the secondary beam spot projection pattern as the primary charged particle beam moves along the second direction occurs during a portion of the retrace operation.

73. The apparatus of any one of clauses 52-72, wherein the primary charged particle beam includes a plurality of charged particle beamlets and the secondary beam spot includes a plurality of beam spots.

74. The apparatus of any one of clauses 52-73, wherein data acquired as the primary charged particle beam moves along the first direction is used to generate a SEM image, and data acquired as the primary charged particle beam moves along the second direction does not contribute to the SEM image.

75. The apparatus of clause 65, wherein the second group includes all of the sensing elements included in a detector, and the first group includes a subset of the sensing elements included in the detector.

76. The apparatus of clause 65, wherein the second group includes a region of sensing elements around the secondary beam spot.

77. The apparatus of clause 76, wherein the region of sensing elements around the secondary beam spot includes a ring around the secondary beam spot.

78. The apparatus of clause 65, or one of clauses 75-77, wherein the second group includes the first group.

79. The apparatus of clause 65, clause 76, or clause 77, wherein the first group and the second group are mutually exclusive.

80. The apparatus of clause 77, wherein the ring is one of a plurality of rings each respectively surrounding one of a plurality of beam spots.

81. A charged particle beam apparatus comprising:

a charged particle beam source configured to generate a primary charged particle beam;

a detector; and a controller having circuitry configured to:

determine a first group of sensing elements to detect intensity of a secondary charged particle beam spot on the detector;

for each retrace of a plurality of retraces occurring during a scanning operation:

acquire a secondary beam spot projection pattern using a second group of sensing elements; and adjust the first group of sensing elements or the second group of sensing elements based on the secondary beam spot projection pattern.

82. The apparatus of clause 81, wherein the second group includes all of the sensing elements included in the detector, and the first group includes a subset of the sensing elements included in the detector 83. The apparatus of clause 81 or clause 82, wherein the second group includes a region of sensing elements around the secondary charged particle beam spot.

84. The apparatus of clause 83, wherein the region of sensing elements around the secondary charged particle beam spot includes a ring around the secondary charged particle beam spot.

85. The apparatus of clause 81, clause 83, or clause 84, wherein the second group includes the first group.

86. The apparatus of clause 81, clause 83, or clause 84, wherein the first group and the second group are mutually exclusive.

87. The apparatus of clause 84, wherein the ring is one of a plurality of rings each respectively surrounding one of a plurality of beam spots.

88. The apparatus of clause 81, wherein the first group of sensing elements and the second group of sensing elements at least partially overlap.

89. The apparatus of any one of clauses 81-88, wherein the second group of sensing elements includes a region of interest.

90. The apparatus of any one of clauses 81-89, wherein acquiring the secondary beam spot projection pattern comprises:

generating a full frame of a beam spot projection pattern image on the detector.

91. The apparatus of any one of clauses 81-89, wherein acquiring the secondary beam spot projection pattern comprises:

generating a partial frame of a beam spot projection pattern image on the detector, the partial frame including an area of interest.

92. The apparatus of clause 91, wherein the area of interest includes sensing elements surrounding the secondary charged particle beam spot.

93. The apparatus of any one of clauses 81-89, wherein acquiring the secondary beam spot projection pattern comprises:

determining a boundary of the secondary charged particle beam spot.

94. The apparatus of any one of clauses 81-93, wherein the controller further comprises circuitry configured to:

determine a parameter of the secondary beam spot projection pattern.

95. The apparatus of clause 94, where the parameter includes:

(i) a moving direction of the secondary charged particle beam spot, (ii) a moving speed of the secondary charged particle beam spot, (iii) an acceleration direction of the secondary charged particle beam spot, (iv) an acceleration amount of the secondary charged particle, (v) a moving direction of each point on a border of the secondary charged particle, (vi) a moving speed of each point on the border of the secondary charged particle beam spot, (vii) an acceleration direction of each point on the border of the secondary charged particle beam spot, or (viii) an acceleration amount of each point on the border of the secondary charged particle beam spot.

96. The apparatus of clause 94, wherein it is determined to adjust the first group of sensing elements based on the parameter.

97. The apparatus of clause 94, wherein it is determined to adjust the second group of sensing elements based on the parameter.

98. The apparatus of clause 97, wherein adjusting the second group of sensing elements includes adjusting a number of sensing elements included in the second group 99. The apparatus of clause 91 or clause 92, wherein the controller further comprises circuitry configured to:

in response to determining that the secondary charged particle beam spot enters the area of interest, adjust the first group of sensing elements or the second group of sensing elements.

100. The apparatus of clause 99, wherein the controller further comprises circuitry configured to:

in response to determining that the secondary charged particle beam spot crosses the boundary, adjust the first group of sensing elements or the second group of sensing elements.

101. A method of detecting charged particles, the method comprising:

detecting beam intensity as a primary charged particle beam moves along a first direction using a first group of sensing elements;

acquiring a secondary beam spot projection pattern as the primary charged particle beam moves along a second direction using a second group of sensing elements different from the first group; and determining a parameter of a secondary beam spot based on the acquired secondary beam spot projection pattern.

102. The method of clause 101, wherein detecting beam intensity as the primary charged particle beam moves along the first direction using the first group of sensing elements includes detecting charge or current from the first group of sensing elements.

103. The method of clause 101 or clause 102, wherein acquiring the secondary beam spot projection pattern as the primary charged particle beam moves along the second direction using the second group of sensing elements includes determining whether drift has occurred.

104. The method of any one of clauses 101-103, further comprising adjusting the first group of sensing elements to compensate for drift.

105. The method of any one of clauses 101-104, further comprising generating a SEM image using only data acquired as the primary charged particle beam moves along the first direction using a first group of sensing elements.

106. The method of clause 101, wherein the parameter of the secondary beam spot includes size, shape, or location.

107. The method of clause 101 or clause 102, further comprising:

determining a boundary of the secondary beam spot based on the acquired secondary beam spot projection pattern.

108. The method of clause 101, further comprising:

adjusting the first group based on the acquired secondary beam spot projection pattern.

109. The method of any one of clauses 101-108, wherein the secondary beam spot projection pattern includes a portion of sensing elements included in a detector.

110. The method of any one of clauses 101-109, wherein the secondary beam spot projection pattern includes a region of interest.

111. The method of clause 110, wherein the region of interest includes an outer peripheral region of the secondary beam spot.

112. The method of clause 110 or clause 111, wherein the region of interest includes an inner peripheral region of the secondary beam spot.

113. The method of clause 110, wherein the region of interest includes a row of sensing elements adjacent to an edge of the secondary beam spot.

114. The method of any one of clauses 110-113, further comprising:

adjusting the region of interest based on the acquired secondary beam spot projection pattern.

115. The method of any one of clauses 101-114, further comprising:

reading out combined output of the first group of sensing elements.

116. The method of any one of clauses 101-115, further comprising:

reading out output of the second group of sensing elements on a per-sensing element basis.

117. The method of any one of clauses 101-116, wherein the first group of sensing elements and the second group of sensing elements at least partially overlap.

118. The method of any one of clauses 101-116, wherein the first group of sensing elements and the second group of sensing elements are mutually exclusive.

119. The method of any one of clauses 101-118, wherein the second direction is opposite the first direction.

120. The method of any one of clauses 101-119, wherein detecting beam intensity as the primary charged particle beam moves along the first direction occurs during a scanning operation, and acquiring the secondary beam spot projection pattern as the primary charged particle beam moves along the second direction occurs during a retrace operation.

121. The method of clause 120, wherein acquiring the secondary beam spot projection pattern as the primary charged particle beam moves along the second direction occurs during a portion of the retrace operation.

122. The method of any one of clauses 101-121, wherein the primary charged particle beam includes a plurality of charged particle beamlets and the secondary beam spot includes a plurality of beam spots.

123. The method of any one of clauses 101-122, wherein data acquired as the primary charged particle beam moves along the first direction is used to generate a SEM image, and data acquired as the primary charged particle beam moves along the second direction does not contribute to the SEM image.

124. The method of clause 101, wherein the second group includes all of the sensing elements included in a detector, and the first group includes a subset of the sensing elements included in the detector 125. The method of clause 101, wherein the second group includes a region of sensing elements around the secondary beam spot.

126. The method of clause 125, wherein the region of sensing elements around the secondary beam spot includes a ring around the secondary beam spot.

127. The method of clause 101, wherein the second group includes the first group.

128. The method of clause 101, wherein the first group and the second group are mutually exclusive.

129. The method of clause 126, wherein the ring is one of a plurality of rings each respectively surrounding one of a plurality of beam spots.

130. The method of clause 3, wherein detecting beam intensity is based on output of a first group of sensing elements, determining the parameter of the secondary beam spot is based on output of a second group of sensing elements, the second group includes a region of sensing elements around the secondary beam spot, and the region of sensing elements is exterior to a boundary of the secondary beam spot.

131. The method of clause 130, wherein the first group includes sensing elements interior to the boundary.

132. A method of compensating for beam spot changes on a detector, the method comprising:

acquiring a beam spot projection pattern on the detector;

determining a change of the beam spot projection pattern;

adjusting a parameter of a detector cell of the detector based on the change.

133. The method of clause 132, wherein adjusting the parameter of the detector cell includes repositioning the detector cell to follow a beam spot of the beam spot projection pattern.

134. The method of clause 132 or clause 133, wherein the detector cell includes a plurality of sensing elements of the detector.

135. The method of any one of clauses 132-134, wherein the change includes at least one of a shift of a beam spot, a size change of a beam spot, shape change of a beam spot, or an orientation change of a beam spot.

136. The method of any one of clauses 132-135, wherein acquiring the beam spot projection pattern includes determining a full frame image of the detector.

137. The method of any one of clauses 132-135, wherein acquiring the beam spot projection pattern includes determining a partial frame image of the detector 138. The method of clause 137, wherein the partial frame image of the detector includes a plurality of sub-frames, wherein each of the plurality of sub-frames includes a region of the detector larger than and encompassing a detector cell.

139. The method of clause 138, further comprising adjusting a parameter of a sub-frame of the plurality of sub-frames 140. The method of clause 137, wherein the partial frame image is determined for a corresponding one of a plurality of detector elements, each of the detector elements being formed using a plurality of sub-frames, wherein each of the detector elements includes a region of the detector larger than and encompassing a detector cell.

141. The method of clause 140, wherein each of the plurality of detector elements includes four sub-frames.

142. The method of any one of clauses 132-141, wherein adjusting the parameter of the detector cell includes adjusting a virtual aperture formed with respect to the detector cell.

143. The method of any one of clauses 132-142, further comprising:

controlling a secondary optical system to adjust a plurality of secondary charged particle beamlets projected onto the detector to form the beam spot projection pattern based on the change.

144. A method of forming virtual apertures with respect to detector cells of a detector, the method comprising:

acquiring a beam spot projection pattern on the detector;

determining a parameter of a beam spot of the beam spot projection pattern;

determining a parameter of an aperture associated with a detector cell based on the parameter of the beam spot;

determining a change of the beam spot projection pattern;

adjusting the aperture based on the change; and determining a detection signal associated with the beam spot based on output of sensing elements within the aperture.

145. The method of clause 144, further comprising:

determining a border of the aperture based on a threshold, wherein values of sensing element output of sensing elements outside the border are less than the threshold 146. The method of clause 145, further comprising:

adjusting values of sensing element output of sensing elements outside the border.

147. The method of clause 146, wherein adjusting values of sensing element output of sensing elements outside the border includes zeroing the values.

148. The method of any one of clauses 144-147, wherein the parameter of the beam spot includes maximum intensity value.

149. The method of any one of clauses 144-148, wherein determining the change of the beam spot projection pattern is performed on a frame-by-frame basis.

150. The method of any one of clauses 144-149, further comprising:

controlling a secondary optical system to adjust a plurality of secondary charged particle beamlets projected onto the detector to form the beam spot projection pattern based on the change.

151. A non-transitory computer-readable medium storing a set of instructions that are executable by one or more processors of a charged particle beam apparatus to cause the charged particle beam apparatus to perform a method comprising:

acquiring a beam spot projection pattern on the detector;

determining a change of the beam spot projection pattern;

adjusting a parameter of a detector cell of the detector based on the change.

152. A non-transitory computer-readable medium storing a set of instructions that are executable by one or more processors of a charged particle beam apparatus to cause the charged particle beam apparatus to perform a method comprising:

acquiring a beam spot projection pattern on the detector;

determining a parameter of a beam spot of the beam spot projection pattern;

determining a parameter of an aperture associated with a detector cell based on the parameter of the beam spot;

determining a change of the beam spot projection pattern;

adjusting the aperture based on the change; and determining a detection signal associated with the beam spot based on output of sensing elements within the aperture.

Block diagrams in the figures may illustrate the architecture, functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes can be made without departing from the scope thereof. For example, a charged particle inspection system may be but one example of a charged particle beam system consistent with embodiments of the present disclosure.

The invention claimed is:

1. A charged particle beam apparatus comprising:

a charged particle beam source configured to generate a primary charged particle beam;

a detector; and a controller having circuitry configured to:

detect beam intensity as the primary charged particle beam moves along a first direction of a sample;

acquire a secondary beam spot projection pattern on the detector as the primary charged particle beam moves along a second direction of the sample;

determine a parameter of a secondary beam spot on the detector based on the acquired secondary beam spot projection pattern;

determine a group of sensing elements associated with the secondary beam spot; and update the group of sensing elements associated with the secondary beam spot based on the acquired secondary beam spot projection pattern.

2. The apparatus of claim 1, wherein the parameter of the secondary beam spot includes size, shape, or location.

3. The apparatus of claim 1, wherein the controller further comprises circuitry configured to:

determine a boundary of the secondary beam spot based on the acquired secondary beam spot projection pattern.

4. The apparatus of claim 1, wherein the group of sensing elements associated with the secondary beam spot is used to detect beam intensity as the primary charged particle beam moves along the first direction.

5. The apparatus of claim 1, wherein the group of sensing elements associated with the secondary beam spot is used to acquire the secondary beam spot projection pattern as the primary charged particle beam moves along the second direction.

6. The apparatus of claim 1, wherein a different group of sensing elements is used to acquire the secondary beam spot projection pattern as the primary charged particle beam moves along the second direction.

7. The apparatus of claim 1, wherein the secondary beam spot projection pattern includes a portion of sensing elements included in a detector.

8. The apparatus of claim 1, wherein the secondary beam spot projection pattern includes a region of interest.

9. The apparatus of claim 8, wherein the region of interest includes an outer peripheral region of the secondary beam spot.

10. The apparatus of claim 8, wherein the region of interest includes an inner peripheral region of the secondary beam spot.

11. The apparatus of claim 8, wherein the region of interest includes a row of sensing elements adjacent to an edge of the secondary beam spot.

12. The apparatus of claim 1, wherein the controller further comprises circuitry configured to:

adjust a region of interest based on the acquired secondary beam spot projection pattern.

13. A method of detecting charged particles, the method comprising:

detecting beam intensity as a primary charged particle beam moves along a first direction using a first group of sensing elements;

acquiring a secondary beam spot projection pattern as the primary charged particle beam moves along a second direction using a second group of sensing elements different from the first group; and determining a parameter of a secondary beam spot based on the acquired secondary beam spot projection pattern.

14. The method of claim 13, wherein detecting beam intensity as the primary charged particle beam moves along the first direction using the first group of sensing elements includes detecting charge or current from the first group of sensing elements.

15. The method of claim 13, wherein acquiring the secondary beam spot projection pattern as the primary charged particle beam moves along the second direction using the second group of sensing elements includes determining whether drift has occurred.

16. The method of claim 13, further comprising adjusting the first group of sensing elements to compensate for drift.

17. The method of claim 13, further comprising generating a SEM image using only data acquired as the primary charged particle beam moves along the first direction using a first group of sensing elements.

* * * * *